United States Patent
Xu et al.

(10) Patent No.: US 12,034,534 B2
(45) Date of Patent: Jul. 9, 2024

(54) DYNAMIC FROZEN BITS AND ERROR DETECTION FOR POLAR CODES

(71) Applicant: QUALCOMM Incorporated, San Diego, CA (US)

(72) Inventors: Changlong Xu, Beijing (CN); Jian Li, Shanghai (CN); Chao Wei, Beijing (CN); Jing Jiang, San Diego, CA (US); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/187,255

(22) Filed: Mar. 21, 2023

(65) Prior Publication Data
US 2023/0224077 A1    Jul. 13, 2023

Related U.S. Application Data

(63) Continuation of application No. 16/493,364, filed as application No. PCT/CN2018/083487 on Apr. 18, 2018, now Pat. No. 11,632,193.

(30) Foreign Application Priority Data

Apr. 20, 2017 (WO) ................ PCT/CN2017/081228
Jun. 19, 2017 (WO) ................ PCT/CN2017/088983

(51) Int. Cl.
*H04L 1/00* (2006.01)
*G06F 9/30* (2018.01)
(Continued)

(52) U.S. Cl.
CPC ........ *H04L 1/0058* (2013.01); *G06F 9/30029* (2013.01); *H03M 13/098* (2013.01);
(Continued)

(58) Field of Classification Search
None
See application file for complete search history.

(56) References Cited

U.S. PATENT DOCUMENTS

| 10,135,460 B2 | 11/2018 | Ionita et al. |
| 2009/0110033 A1 | 4/2009 | Shattil |

(Continued)

FOREIGN PATENT DOCUMENTS

| CN | 102084596 A | 6/2011 |
| CN | 102122966 A | 7/2011 |

(Continued)

OTHER PUBLICATIONS

Huawei, et al., "Details of the Polar Code Design", 3GPP TSG RAN WG1 Meeting #87, R1-1611254, Reno, USA, 3rd Generation, Partnership Project, Mobile Competence Centre, 650, Route Des Lucioles, F-06921 Sophia-Antipolis Cedex, France, vol. RAN WG1, No. Reno, USA, Nov. 10, 2016-Nov. 14, 2016, 15 Pages, Nov. 13, 2016, XP051175235, Nov. 3, 2016.
(Continued)

*Primary Examiner* — Mujtaba M Chaudry
(74) *Attorney, Agent, or Firm* — QUALCOMM Incorporated

(57) ABSTRACT

Methods, systems, and devices for wireless communication are described for dynamic frozen bits of polar codes for early termination and performance improvement. A wireless device may receive a signal comprising a codeword encoded using a polar code. The wireless device may perform decoding of the codeword including at least: parity check of a first subset of decoding paths for making a decision on early termination of decoding of the codeword based on dynamic frozen bits, and generating path metrics for a second subset of the decoding paths that each pass the parity check based on the dynamic frozen bits, and performing error detection on a bit sequence corresponding to one of the second subset
(Continued)

of the decoding paths based at part on error detection bits and the generated path metrics. The wireless device may process the information bits based on a result of the decoding.

32 Claims, 26 Drawing Sheets

(51) Int. Cl.
*H03M 13/09* (2006.01)
*H03M 13/13* (2006.01)
*H04B 7/26* (2006.01)
*H04W 40/02* (2009.01)

(52) U.S. Cl.
CPC .......... *H03M 13/13* (2013.01); *H04B 7/2668* (2013.01); *H04L 1/0046* (2013.01); *H04L 1/0052* (2013.01); *H04L 1/0061* (2013.01); *H04L 1/0063* (2013.01); *H04W 40/02* (2013.01)

(56) References Cited

U.S. PATENT DOCUMENTS

| | | | |
|---|---|---|---|
| 2013/0117344 A1 | 5/2013 | Gross et al. | |
| 2013/0176924 A1 | 7/2013 | Kishiyama et al. | |
| 2014/0169388 A1 | 6/2014 | Jeong et al. | |
| 2014/0365842 A1 | 12/2014 | Li et al. | |
| 2015/0026543 A1 | 1/2015 | Li et al. | |
| 2015/0092886 A1 | 4/2015 | Ionita et al. | |
| 2015/0293716 A1 | 10/2015 | Jiang et al. | |
| 2015/0295593 A1 | 10/2015 | Trifonov et al. | |
| 2015/0358113 A1 | 12/2015 | Callard et al. | |
| 2016/0164629 A1 | 6/2016 | Ahn et al. | |
| 2016/0294418 A1 | 10/2016 | Huang et al. | |
| 2017/0077954 A1 | 3/2017 | Shen et al. | |
| 2017/0126354 A1 | 5/2017 | Marsland et al. | |
| 2017/0149531 A1 | 5/2017 | Raza et al. | |
| 2017/0187491 A1* | 6/2017 | Jang | H03M 13/116 |
| 2017/0230059 A1 | 8/2017 | Giard et al. | |
| 2017/0264316 A1* | 9/2017 | Lee | H03M 13/1128 |
| 2017/0366199 A1 | 12/2017 | Ge et al. | |
| 2017/0366204 A1 | 12/2017 | Shi et al. | |
| 2018/0076922 A1 | 3/2018 | Zhang et al. | |
| 2018/0076929 A1* | 3/2018 | Zhang | H03M 13/616 |
| 2018/0097580 A1* | 4/2018 | Zhang | H04L 1/0041 |
| 2018/0145702 A1 | 5/2018 | Feygin et al. | |
| 2018/0183465 A1* | 6/2018 | Vivier | H03M 13/353 |
| 2018/0191459 A1* | 7/2018 | Ge | H04L 1/0068 |
| 2020/0036477 A1 | 1/2020 | Xu et al. | |

FOREIGN PATENT DOCUMENTS

| | | |
|---|---|---|
| CN | 103220001 A | 7/2013 |
| CN | 105933010 A | 9/2016 |

OTHER PUBLICATIONS

Huawei, et al., "Parity-Check Polar and CRC-Aided Polar Evaluation", 3GPP Draft, 3GPP TSG RAN WG1 Meeting #88, R1-1701701, vol. RAN WG1, No. Athens, Greece; Feb. 13, 2017-Feb. 17, 2017, Feb. 12, 2017, XP051208867, 10 pages, Retrieved from the Internet: URL: http://www.3gpp.org/ftp/Meetings_3GPP_SYNC/RAN1/Docs/.

Huawei, et al., "Polar Coding Design for Control Channel", 3GPP Draft, 3GPP TSG RAN WG1 Meeting #88bis, R1-1704247, vol. RAN WG1, No. Spokane, USA; Apr. 3, 2017-Apr. 7, 2017, 14 Pages, Apr. 2, 2017 (Apr. 2, 2017), XP051242399, Mar. 25, 2017, Retrieved from the Internet: URL: http://www.3gpp.org/ftp/Meetings_3GPP_SYNC/RAN1/Docs/.

Huawei, et al., "Polar Coding Design for Control Channel", 3GPP Draft, 3GPP TSG RAN WG1 Meeting #88bis, R1-1706193, Polar Coding Design for Control Channel, vol. RAN WG1, No. Spokane, USA, Apr. 3, 2017-Apr. 7, 2017, Apr. 9, 2017 (Apr. 9, 2017), XP051252505, 21 pages, Retrieved from the Internet: URL: http://www.3gpp.org/ftp/tsg_ran/WG1_RL1/TSGR1_88b/Docs/.

International Preliminary Report on Patentability—PCT/CN2017/081228, The International Bureau of WIPO—Geneva, Switzerland, Oct. 31, 2019.

International Preliminary Report on Patentability—PCT/CN2018/083487, The International Bureau of WIPO—Geneva, Switzerland, Oct. 31, 2019.

International Search Report and Written Opinion—PCT/CN2017/081228—ISA/EPO—Jan. 19, 2018.

International Search Report and Written Opinion—PCT/CN2018/083487—ISA/EPO—Jun. 28, 2018.

NTT Docomo: "Distributed Simple Parity Check Polar Codes", 3GPP TSG RAN WG1 Meeting #88bis, R1-1705757, 3rd Generation Partnership Project, Mobile Competence Centre, 650, Route Des Lucioles, F-06921 Sophia Antipolis Cedex, France vol. RAN WG1, No. Spokane, USA, Apr. 3, 2017-Apr. 7, 2017, Apr. 2, 2017, XP051243872, Mar. 25, 2017, 6 Pages, section 1, 2.

Qualcomm Incorporated: "Comparison of Polar Codes between CA and PC for Control Channel", 3GPP TSG RAN WG1 #88b, R1-1706167, Spokane, USA, Apr. 3, 2017-Apr. 7, 2017, pp. 1-10, Apr. 3, 2017, Internet URL: http://www.3gpp.org/ftp/tsg_ran/WG1_RL1/TSGR1_88b/Docs/R1-1706167.zip.

Supplementary European Search Report—EP18788590—Search Authority—Munich—Dec. 2, 2020.

Trifonov P., et al., "Polar Codes with Dynamic Frozen Symbols and Their Decoding by Directed Search", Information Theory Workshop (ITW), 2013, IEEE, Sep. 13, 2013, pp. 1-11.

ZTE, et al., "Performance Evaluation of PC Polar Codes and CA Polar Codes for eMBB", 3GPP TSG RAN WG1 #88-Bis, R1-1704383, Spokane, USA, Apr. 3, 2017-Apr. 7, 2017, pp. 1-9, Mar. 25, 2017, Internet URL: http://www.3gpp.org/ftp/tsg_ran/WG1_RL1/TSGR1_88b/Docs/R1-1704383.zip.

* cited by examiner

DYNAMIC FROZEN BITS AND ERROR DETECTION FOR POLAR CODES

CROSS REFERENCES

The present application is a continuation of U.S. patent application Ser. No. 16/493,364 to Xu et al., titled "DYNAMIC FROZEN BITS AND ERROR DETECTION FOR POLAR CODES", filed Sep. 12, 2019, which is a 371 national phase filing of International Patent Application No. PCT/CN2018/083487 to Xu et al., titled "DYNAMIC FROZEN BITS AND ERROR DETECTION FOR POLAR CODES", filed Apr. 18, 2018, and to International Patent Application No. PCT/CN2017/088983 to Xu et al., titled "DYNAMIC FROZEN BITS AND ERROR DETECTION FOR POLAR CODES", filed Jun. 19, 2017, and to International Patent Application No. PCT/CN2017/081228 to Xu et al., titled "DYNAMIC FROZEN BITS AND ERROR DETECTION FOR POLAR CODES", filed Apr. 20, 2017, each of which is assigned to the assignee hereof and each of which is hereby incorporated by reference in its entirety.

BACKGROUND

The following relates generally to wireless communication, and more specifically to dynamic frozen bits of polar codes for early termination and performance improvement.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, LTE-Advanced (LTE-A) system, or a New Radio (NR) system). A wireless multiple-access communications system may include a number of base stations or access network nodes, each simultaneously supporting communication for multiple communication devices, which may be otherwise known as user equipment (UE).

Data transmission, however, often involves sending data over a noisy communication channel. To combat noise, a transmitter may encode code blocks using error correcting codes to introduce redundancy in the code block so that transmission errors may be detected and corrected. Some examples of encoding algorithms with error correcting codes include convolutional codes (CCs), low-density parity-check (LDPC) codes, and polar codes. A polar code is an example of a linear block error correcting code and is the first coding technique to provably achieve channel capacity as the code length approaches infinity. For decoding a polar code, a receiving device may make a candidate hypothesis of the code length and number of information bits, generate a representation of the information bits using a successive cancellation (SC) or successive cancellation list (SCL) decoding process on a codeword according to the candidate hypothesis, and perform an error checking operation on the representation of the information bits to determine if decoding was successful. Even when using error correcting codes, detection rates and false alarms remain issues when transmitting over a noisy communication channel. A false alarm may occur when the result of decoding a received signal indicates that a particular bit sequence was successfully decoded, when a different bit sequence or no bit sequence was actually sent. Existing implementations do not adequately address detection rates and false alarm rates.

In some cases, the decoding operation may fail because the codeword has experienced excessive corruption (e.g., the channel has very low signal-to-noise ratio (SNR)), there is no transmitted codeword for the candidate hypothesis (e.g., the codeword represents random noise), the transmitted codeword is intended for a different device, or the candidate hypothesis may be incorrect (e.g., incorrect codeword size, incorrect information bit size, incorrect aggregation level). In some or all of these circumstances, early termination of decoding for a candidate hypothesis (e.g., prior to completion of all decoding processes) may limit power consumption in situations for which the decoding will be unsuccessful. However, differentiating circumstances in which early termination is appropriate (e.g., without early termination of decoding for processes that could have been successful) is challenging for existing implementations. Existing techniques for facilitating early termination may increase decoding complexity, thus decreasing the benefits provided by early termination.

SUMMARY

The described techniques relate to improved methods, systems, devices, or apparatuses that support dynamic frozen bits of polar codes for early termination and performance improvement. The examples described herein may enable a decoder to use dynamic frozen bits to simultaneously perform detection and CA-SCL decoding of a codeword encoded using a polar code. During encoding, a number of error detection bits may be increased to improve detection and a false alarm rate, and dynamic frozen bits may be employed to enable early termination and improve performance. Performance may be improved by enabling a decoder to use CA-SCL decoding and early pruning of candidate paths. The proposed algorithm also improves decoder power efficiency by enabling early termination.

In another example, during encoding, a number of parity bits may be introduced in a polar code to enable early termination. The value of each parity bit may be determined based on applying a Boolean operation to a set of information preceding the parity bit in a decoding order. When a decoder receives the codeword (or a candidate codeword), the decoder may determine a parity check value for each of the parity bits along a candidate decoding path by applying the same Boolean operation to a set of information bits along the decoding path preceding the parity bit. The decoder may then compare these parity check values to the parity bit values, and, based on the comparison, the decoder may determine whether to terminate decoding early for the candidate decoding path.

A method of wireless communication is described. The method may include identifying a dynamic frozen bit within a code tree during decoding of a codeword encoded using a polar code, extending a set of candidate paths through the code tree for the identified dynamic frozen bit to obtain a first extended set of candidate paths, selecting a first subset of the first extended set of candidate paths according to a first path selection criterion, determining that at least one candidate path in the first subset passes a parity check based on the dynamic frozen bit, and determining respective path metrics for each candidate path in a second subset of the first extended set of candidate paths, the second subset of the extended set of candidate paths selected according to a second path selection criterion.

An apparatus for wireless communication is described. The apparatus may include means for identifying a dynamic frozen bit within a code tree during decoding of a codeword encoded using a polar code, means for extending a set of candidate paths through the code tree for the identified dynamic frozen bit to obtain a first extended set of candidate paths, means for selecting a first subset of the first extended set of candidate paths according to a first path selection criterion, means for determining that at least one candidate path in the first subset passes a parity check based on the dynamic frozen bit, and means for determining respective path metrics for each candidate path in a second subset of the first extended set of candidate paths, the second subset of the extended set of candidate paths selected according to a second path selection criterion.

Another apparatus for wireless communication is described. The apparatus may include a processor, memory in electronic communication with the processor, and instructions stored in the memory. The instructions may be operable to cause the processor to identify a dynamic frozen bit within a code tree during decoding of a codeword encoded using a polar code, extend a set of candidate paths through the code tree for the identified dynamic frozen bit to obtain a first extended set of candidate paths, select a first subset of the first extended set of candidate paths according to a first path selection criterion, determine that at least one candidate path in the first subset passes a parity check based on the dynamic frozen bit, and determine respective path metrics for each candidate path in a second subset of the first extended set of candidate paths, the second subset of the extended set of candidate paths selected according to a second path selection criterion.

A non-transitory computer readable medium for wireless communication is described. The non-transitory computer-readable medium may include instructions operable to cause a processor to identify a dynamic frozen bit within a code tree during decoding of a codeword encoded using a polar code, extend a set of candidate paths through the code tree for the identified dynamic frozen bit to obtain a first extended set of candidate paths, select a first subset of the first extended set of candidate paths according to a first path selection criterion, determine that at least one candidate path in the first subset passes a parity check based on the dynamic frozen bit, and determine respective path metrics for each candidate path in a second subset of the first extended set of candidate paths, the second subset of the extended set of candidate paths selected according to a second path selection criterion.

Some examples of the method, apparatus, and non-transitory computer-readable medium described above may further include processes, features, means, or instructions for identifying a second dynamic frozen bit within the code tree. Some examples of the method, apparatus, and non-transitory computer-readable medium described above may further include processes, features, means, or instructions for extending a second set of candidate paths through the code tree for the identified second dynamic frozen bit to obtain a second extended set of candidate paths. Some examples of the method, apparatus, and non-transitory computer-readable medium described above may further include processes, features, means, or instructions for selecting a first subset of the second extended set of candidate paths according to the first path selection criterion.

Some examples of the method, apparatus, and non-transitory computer-readable medium described above may further include processes, features, means, or instructions for determining that all candidate paths in the first subset of the second extended set of candidate paths fail a parity check. Some examples of the method, apparatus, and non-transitory computer-readable medium described above may further include processes, features, means, or instructions for terminating decoding of the codeword.

Some examples of the method, apparatus, and non-transitory computer-readable medium described above may further include processes, features, means, or instructions for determining that at least one candidate path in the first subset of the second extended set of candidate paths passes a parity check. Some examples of the method, apparatus, and non-transitory computer-readable medium described above may further include processes, features, means, or instructions for determining a second path metric for each candidate path in a second subset of the second extended set of candidate paths, wherein the determined second path metrics may be a function of the determined path metrics.

In some examples of the method, apparatus, and non-transitory computer-readable medium described above, the first path selection criterion may be based on path metrics of the candidate paths of the first extended set of candidate paths, and the second path selection criterion may be based on candidate paths of the first extended set of candidate paths passing the parity check based on the dynamic frozen bit.

Some examples of the method, apparatus, and non-transitory computer-readable medium described above may further include processes, features, means, or instructions for identifying a bit sequence corresponding to a candidate path in the second subset of the extended set of candidate paths. Some examples of the method, apparatus, and non-transitory computer-readable medium described above may further include processes, features, means, or instructions for calculating a first error detection code based at least in part on the bit sequence. Some examples of the method, apparatus, and non-transitory computer-readable medium described above may further include processes, features, means, or instructions for identifying a second error detection code based at least in part on the bit sequence. Some examples of the method, apparatus, and non-transitory computer-readable medium described above may further include processes, features, means, or instructions for comparing the first error detection code to the second error detection code.

Some examples of the method, apparatus, and non-transitory computer-readable medium described above may further include processes, features, means, or instructions for determining that the bit sequence passes error detection based at least in part on the comparison. Some examples of the method, apparatus, and non-transitory computer-readable medium described above may further include processes, features, means, or instructions for outputting the bit sequence.

Some examples of the method, apparatus, and non-transitory computer-readable medium described above may further include processes, features, means, or instructions for determining that the bit sequence may have failed error detection based at least in part on the comparison. Some examples of the method, apparatus, and non-transitory computer-readable medium described above may further include processes, features, means, or instructions for outputting an error based at least in part on the failure.

In some examples of the method, apparatus, and non-transitory computer-readable medium described above, determining that the at least one candidate path in the first subset passes a parity check comprises: calculating a parity check value based at least in part on a plurality of bits of the at least one candidate path occurring prior to the dynamic frozen bit along the at least one candidate path. Some examples of the method, apparatus, and non-transitory computer-readable medium described above may further include processes, features, means, or instructions for comparing the parity check value to a value of the dynamic frozen bit.

Some examples of the method, apparatus, and non-transitory computer-readable medium described above may further include processes, features, means, or instructions for determining that the at least one candidate path passes the parity check based at least in part on the comparison.

In some examples of the method, apparatus, and non-transitory computer-readable medium described above, determining respective path metrics for the each candidate path in the second subset comprises: adding a path metric penalty to a candidate path in the second subset based at least in part on determining that a calculated value of the dynamic frozen bit differs from a determined decision value of the dynamic frozen bit.

A method of wireless communication is described. The method may include allocating sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and wherein a number of the plurality of dynamic frozen bits is based at least in part on a target detection rate during parity-directed successive cancellation list (SCL) decoding, generating the plurality of dynamic frozen bits based at least in part on a decoding order of the sub-channels, generating a codeword encoded using the polar code based at least in part on loading the plurality of information bits, the plurality of error detection bits, and the plurality of dynamic frozen bits into the allocated sub-channels, and transmitting the codeword.

An apparatus for wireless communication is described. The apparatus may include means for allocating sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and wherein a number of the plurality of dynamic frozen bits is based at least in part on a target detection rate during parity-directed successive cancellation list (SCL) decoding, means for generating the plurality of dynamic frozen bits based at least in part on a decoding order of the sub-channels, means for generating a codeword encoded using the polar code based at least in part on loading the plurality of information bits, the plurality of error detection bits, and the plurality of dynamic frozen bits into the allocated sub-channels, and means for transmitting the codeword.

Another apparatus for wireless communication is described. The apparatus may include a processor, memory in electronic communication with the processor, and instructions stored in the memory. The instructions may be operable to cause the processor to allocate sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and wherein a number of the plurality of dynamic frozen bits is based at least in part on a target detection rate during parity-directed successive cancellation list (SCL) decoding, generate the plurality of dynamic frozen bits based at least in part on a decoding order of the sub-channels, generate a codeword encoded using the polar code based at least in part on loading the plurality of information bits, the plurality of error detection bits, and the plurality of dynamic frozen bits into the allocated sub-channels, and transmit the codeword.

A non-transitory computer readable medium for wireless communication is described. The non-transitory computer-readable medium may include instructions operable to cause a processor to allocate sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and wherein a number of the plurality of dynamic frozen bits is based at least in part on a target detection rate during parity-directed successive cancellation list (SCL) decoding, generate the plurality of dynamic frozen bits based at least in part on a decoding order of the sub-channels, generate a codeword encoded using the polar code based at least in part on loading the plurality of information bits, the plurality of error detection bits, and the plurality of dynamic frozen bits into the allocated sub-channels, and transmit the codeword.

In some examples of the method, apparatus, and non-transitory computer-readable medium described above, the number of the plurality of dynamic frozen bits may be based at least in part on enabling early termination during the parity-directed successive cancellation list (SCL) decoding.

In some examples of the method, apparatus, and non-transitory computer-readable medium described above, the number of the plurality of error detection bits may be based at least in part on a defined detection rate.

In some examples of the method, apparatus, and non-transitory computer-readable medium described above, allocating the sub-channels of the polar code further comprises: identifying a subset of the sub-channels for frozen bits. Some examples of the method, apparatus, and non-transitory computer-readable medium described above may further include processes, features, means, or instructions for allocating a first subset of sub-channels of the sub-channel subset of the polar code to the dynamic frozen bits having a higher reliability than a second subset of sub-channels of the sub-channel subset.

In some examples of the method, apparatus, and non-transitory computer-readable medium described above, the plurality of information bits and the plurality of error detection bits may be allocated to sub-channels having higher reliability than sub-channels allocated to the dynamic frozen bits.

Some examples of the method, apparatus, and non-transitory computer-readable medium described above may further include processes, features, means, or instructions for applying an error detecting algorithm to the plurality of information bits to generate the plurality of error detection bits.

In some examples of the method, apparatus, and non-transitory computer-readable medium described above, the error detecting algorithm may be a cyclic redundancy check (CRC) algorithm.

In some examples of the method, apparatus, and non-transitory computer-readable medium described above, generating the plurality of dynamic frozen bits comprises: applying a Boolean operation to subsets of the plurality of information bits to respectively generate values for the plurality of dynamic frozen bits.

A method of wireless communication is described. The method may include receiving a signal comprising a codeword encoded using a polar code, the codeword generated based at least in part on a plurality of dynamic frozen bits, a plurality of information bits, and a plurality of error detection bits for joint detection and decoding of the codeword, performing decoding of the codeword including at least: a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and processing the information bits based at least in part on a result of the decoding.

An apparatus for wireless communication is described. The apparatus may include means for receiving a signal comprising a codeword encoded using a polar code, the codeword generated based at least in part on a plurality of dynamic frozen bits, a plurality of information bits, and a plurality of error detection bits for joint detection and decoding of the codeword, means for performing decoding of the codeword including at least: a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and means for processing the information bits based at least in part on a result of the decoding.

Another apparatus for wireless communication is described. The apparatus may include a processor, memory in electronic communication with the processor, and instructions stored in the memory. The instructions may be operable to cause the processor to receive a signal comprising a codeword encoded using a polar code, the codeword generated based at least in part on a plurality of dynamic frozen bits, a plurality of information bits, and a plurality of error detection bits for joint detection and decoding of the codeword, perform decoding of the codeword including at least: a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and process the information bits based at least in part on a result of the decoding.

A non-transitory computer readable medium for wireless communication is described. The non-transitory computer-readable medium may include instructions operable to cause a processor to receive a signal comprising a codeword encoded using a polar code, the codeword generated based at least in part on a plurality of dynamic frozen bits, a plurality of information bits, and a plurality of error detection bits for joint detection and decoding of the codeword, perform decoding of the codeword including at least: a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and process the information bits based at least in part on a result of the decoding.

A method of wireless communication is described. The method may include receiving a signal comprising a codeword encoded using a polar code, the codeword generated based at least in part on a plurality of dynamic frozen bits, a plurality of information bits, and a plurality of error detection bits for joint detection and decoding of the codeword, performing decoding of the codeword including at least: parity checking a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and processing the information bits based at least in part on a result of the decoding.

An apparatus for wireless communication is described. The apparatus may include means for receiving a signal comprising a codeword encoded using a polar code, the codeword generated based at least in part on a plurality of dynamic frozen bits, a plurality of information bits, and a plurality of error detection bits for joint detection and decoding of the codeword, means for performing decoding of the codeword including at least: parity checking a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and means for processing the information bits based at least in part on a result of the decoding.

Another apparatus for wireless communication is described. The apparatus may include a processor, memory in electronic communication with the processor, and instructions stored in the memory. The instructions may be operable to cause the processor to receive a signal comprising a codeword encoded using a polar code, the codeword generated based at least in part on a plurality of dynamic frozen bits, a plurality of information bits, and a plurality of error detection bits for joint detection and decoding of the codeword, perform decoding of the codeword including at least: parity checking a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and process the information bits based at least in part on a result of the decoding.

A non-transitory computer readable medium for wireless communication is described. The non-transitory computer-readable medium may include instructions operable to cause a processor to receive a signal comprising a codeword encoded using a polar code, the codeword generated based at least in part on a plurality of dynamic frozen bits, a plurality of information bits, and a plurality of error detection bits for joint detection and decoding of the codeword, perform decoding of the codeword including at least: parity checking a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics, and process the information bits based at least in part on a result of the decoding.

Some examples of the method, apparatus, and non-transitory computer-readable medium described above may further include processes, features, means, or instructions for extending the decoding paths to obtain extended decoding paths, and selecting a subset of the extended decoding paths according to a path selection criterion. In some examples of the method, apparatus, and non-transitory computer-readable medium described above, the path selection criterion may be based at least in part on path metrics of the extended decoding paths.

Some examples of the method, apparatus, and non-transitory computer-readable medium described above may further include processes, features, means, or instructions for determining that all decoding paths in the subset of the extended decoding paths fail the parity check, and terminating decoding of the codeword. Some examples of the method, apparatus, and non-transitory computer-readable medium described above may further include processes, features, means, or instructions for determining that at least one decoding path in the subset of the extended decoding paths passes the parity check, and generating path metrics for the subset of the extended decoding paths.

Some examples of the method, apparatus, and non-transitory computer-readable medium described above may further include processes, features, means, or instructions for calculating a first error detection code based at least in part on the bit sequence, identifying a second error detection code based at least in part on the bit sequence, and comparing the first error detection code to the second error detection code.

Some examples of the method, apparatus, and non-transitory computer-readable medium described above may further include processes, features, means, or instructions for determining that the bit sequence passes error detection based at least in part on the comparison, and outputting the bit sequence. Some examples of the method, apparatus, and non-transitory computer-readable medium described above may further include processes, features, means, or instructions for determining that the bit sequence has failed error detection based at least in part on the comparison, and outputting an error based at least in part on the failure.

In some examples of the method, apparatus, and non-transitory computer-readable medium described above, performing decoding of the codeword including at least the parity check of the first subset of decoding paths comprises calculating a parity check value based at least in part on a plurality of bits of a first decoding path of the first subset of decoding paths occurring prior to a first dynamic frozen bit of the plurality of dynamic frozen bits along the first decoding path, and comparing the parity check value to a value of the first dynamic frozen bit.

Some examples of the method, apparatus, and non-transitory computer-readable medium described above may further include processes, features, means, or instructions for determining that the first decoding path passes the parity check based at least in part on the comparison. In some examples of the method, apparatus, and non-transitory computer-readable medium described above, performing decoding of the codeword including at least generating path metrics for the second subset of the decoding paths comprises adding a path metric penalty to a first decoding path in the second subset of the decoding paths based at least in part on determining that a calculated value of a first dynamic frozen bit of the plurality of dynamic frozen bits differs from a determined decision value of the dynamic frozen bit.

A method of wireless communication is described. The method may include allocating sub-channels of a polar code to a plurality of information bits and a plurality of parity bits based on a reliability of each of the sub-channels, generating each parity bit of the plurality of parity bits by applying a Boolean operation to one or more subsets of the plurality of information bits, the one or more subsets of the plurality of information bits determined according to a decoding order of the sub-channels, generating a codeword encoded using the polar code based on loading the plurality of information bits and the plurality of parity bits into the allocated sub-channels, and transmitting the codeword.

An apparatus for wireless communication is described. The apparatus may include means for allocating sub-channels of a polar code to a plurality of information bits and a plurality of parity bits based on a reliability of each of the sub-channels, means for generating each parity bit of the plurality of parity bits by applying a Boolean operation to one or more subsets of the plurality of information bits, the one or more subsets of the plurality of information bits determined according to a decoding order of the sub-channels, means for generating a codeword encoded using the polar code based on loading the plurality of information bits and the plurality of parity bits into the allocated sub-channels, and means for transmitting the codeword.

Another apparatus for wireless communication is described. The apparatus may include a processor, memory in electronic communication with the processor, and instructions stored in the memory. The instructions may be operable to cause the processor to allocate sub-channels of a polar code to a plurality of information bits and a plurality of parity bits based on a reliability of each of the sub-channels, generate each parity bit of the plurality of parity bits by applying a Boolean operation to one or more subsets of the plurality of information bits, the one or more subsets of the plurality of information bits determined according to a decoding order of the sub-channels, generate a codeword encoded using the polar code based on loading the plurality of information bits and the plurality of parity bits into the allocated sub-channels, and transmit the codeword.

A non-transitory computer readable medium for wireless communication is described. The non-transitory computer-readable medium may include instructions operable to cause a processor to allocate sub-channels of a polar code to a plurality of information bits and a plurality of parity bits based on a reliability of each of the sub-channels, generate each parity bit of the plurality of parity bits by applying a Boolean operation to one or more subsets of the plurality of information bits, the one or more subsets of the plurality of information bits determined according to a decoding order of the sub-channels, generate a codeword encoded using the polar code based on loading the plurality of information bits and the plurality of parity bits into the allocated sub-channels, and transmit the codeword.

In some examples of the method, apparatus, and non-transitory computer-readable medium described above, applying the Boolean operation to the one or more subsets of the plurality of information bits includes, for the each parity bit, applying the Boolean operation to each subset of the plurality of information bits prior to a sub-channel corresponding to the each parity bit according to the decoding order.

In some examples of the method, apparatus, and non-transitory computer-readable medium described above, applying the Boolean operation to the one or more subsets of the plurality of information bits includes, for the each parity bit, applying the Boolean operation to a subset of the plurality of information bits prior to a first sub-channel corresponding to the each parity bit and subsequent to a second sub-channel corresponding to a previous parity bit according to the decoding order.

In some examples of the method, apparatus, and non-transitory computer-readable medium described above, a number of the plurality of parity bits may be based on enabling early termination during parity-directed successive cancellation list (SCL) decoding. In some examples of the method, apparatus, and non-transitory computer-readable medium described above, a number of the plurality of parity bits may be three (3).

In some examples of the method, apparatus, and non-transitory computer-readable medium described above, allocating the sub-channels of the polar code further includes identifying a first subset of the sub-channels for the plurality of information bits and a second subset of the sub-channels for the plurality of parity bits, where the plurality of information bits may be allocated to sub-channels having higher reliabilities than sub-channels allocated to the plurality of parity bits.

Some examples of the method, apparatus, and non-transitory computer-readable medium described above may further include processes, features, means, or instructions for allocating sub-channels of the polar code to a plurality of frozen bits, where the plurality of information bits and the plurality of parity bits may be allocated to sub-channels having higher reliabilities than sub-channels allocated to a subset of the plurality of frozen bits subsequent to a first information bit in the decoding order.

A method of wireless communication is described. The method may include monitoring a signal for a codeword candidate corresponding to a codeword encoded using a polar code, the codeword generated based on a plurality of information bits and a plurality of parity bits, where the plurality of information bits and the plurality of parity bits are allocated to sub-channels of the polar code based on a reliability of each of the sub-channels, performing decoding of the codeword candidate including at least calculating a parity check value for a parity bit of the plurality of parity bits for each of a plurality of decoding paths by applying a Boolean operation to one or more subsets of the plurality of information bits for the each of the plurality of decoding paths, the one or more subsets of the plurality of information bits determined according to a decoding order of the sub-channels, parity checking the plurality of decoding paths for determining whether to terminate decoding of the codeword candidate based on the parity check values and the plurality of parity bits, and processing the information bits based on a result of the decoding.

An apparatus for wireless communication is described. The apparatus may include means for monitoring a signal for a codeword candidate corresponding to a codeword encoded using a polar code, the codeword generated based on a plurality of information bits and a plurality of parity bits, where the plurality of information bits and the plurality of parity bits are allocated to sub-channels of the polar code based on a reliability of each of the sub-channels, means for performing decoding of the codeword candidate including at least calculating a parity check value for a parity bit of the plurality of parity bits for each of a plurality of decoding paths by applying a Boolean operation to one or more subsets of the plurality of information bits for the each of the plurality of decoding paths, the one or more subsets of the plurality of information bits determined according to a decoding order of the sub-channels, means for parity checking the plurality of decoding paths for determining whether to terminate decoding of the codeword candidate based on the parity check values and the plurality of parity bits, and means for processing the information bits based on a result of the decoding.

Another apparatus for wireless communication is described. The apparatus may include a processor, memory in electronic communication with the processor, and instructions stored in the memory. The instructions may be operable to cause the processor to monitor a signal for a codeword candidate corresponding to a codeword encoded using a polar code, the codeword generated based on a plurality of information bits and a plurality of parity bits, where the plurality of information bits and the plurality of parity bits are allocated to sub-channels of the polar code based on a reliability of each of the sub-channels, perform decoding of the codeword candidate including at least calculating a parity check value for a parity bit of the plurality of parity bits for each of a plurality of decoding paths by applying a Boolean operation to one or more subsets of the plurality of information bits for the each of the plurality of decoding paths, the one or more subsets of the plurality of information bits determined according to a decoding order of the sub-channels, parity checking the plurality of decoding paths for determining whether to terminate decoding of the codeword candidate based on the parity check values and the plurality of parity bits, and process the information bits based on a result of the decoding.

A non-transitory computer readable medium for wireless communication is described. The non-transitory computer-readable medium may include instructions operable to cause a processor to monitor a signal for a codeword candidate corresponding to a codeword encoded using a polar code, the codeword generated based on a plurality of information bits and a plurality of parity bits, where the plurality of information bits and the plurality of parity bits are allocated to sub-channels of the polar code based on a reliability of each of the sub-channels, perform decoding of the codeword candidate including at least calculating a parity check value for a parity bit of the plurality of parity bits for each of a plurality of decoding paths by applying a Boolean operation to one or more subsets of the plurality of information bits for the each of the plurality of decoding paths, the one or more subsets of the plurality of information bits determined according to a decoding order of the sub-channels, parity checking the plurality of decoding paths for determining whether to terminate decoding of the codeword candidate based on the parity check values and the plurality of parity bits, and process the information bits based on a result of the decoding.

In some examples of the method, apparatus, and non-transitory computer-readable medium described above, calculating the parity check value for the parity bit for each of the plurality of decoding paths includes calculating the parity check value based on applying the Boolean operation to each subset of the plurality of information bits of the each of the plurality of decoding paths prior to a sub-channel corresponding to the parity bit according to the decoding order. Some examples of the method, apparatus, and non-transitory computer-readable medium described above may further include processes, features, means, or instructions for comparing the parity check value to a value of the respective parity bit.

In some examples of the method, apparatus, and non-transitory computer-readable medium described above, calculating the parity check value for the parity bit for each of the plurality of decoding paths includes calculating the parity check value based on applying the Boolean operation to a subset of the plurality of information bits of the each of the plurality of decoding paths prior to a first sub-channel corresponding to the parity bit and subsequent to a second sub-channel corresponding to a previous parity bit according to the decoding order. Some examples of the method, apparatus, and non-transitory computer-readable medium described above may further include processes, features, means, or instructions for comparing the parity check value to the parity bit.

Some examples of the method, apparatus, and non-transitory computer-readable medium described above may further include processes, features, means, or instructions for extending the decoding paths for a sub-channel corresponding to the parity bit to obtain extended decoding paths. Some examples of the method, apparatus, and non-transitory computer-readable medium described above may further include processes, features, means, or instructions for selecting a subset of the extended decoding paths according to a path selection criteria.

Some examples of the method, apparatus, and non-transitory computer-readable medium described above may further include processes, features, means, or instructions for determining that all decoding paths in the subset of the extended decoding paths fail the comparing. Some examples of the method, apparatus, and non-transitory computer-readable medium described above may further include processes, features, means, or instructions for terminating decoding of the codeword candidate.

Some examples of the method, apparatus, and non-transitory computer-readable medium described above may further include processes, features, means, or instructions for determining that at least one decoding path in the subset of the extended decoding paths passes the parity check. Some examples of the method, apparatus, and non-transitory computer-readable medium described above may further include processes, features, means, or instructions for continuing decoding of the codeword candidate.

In some examples of the method, apparatus, and non-transitory computer-readable medium described above, a number of the plurality of parity bits may be based on enabling early termination during parity-directed SCL decoding. In some examples of the method, apparatus, and non-transitory computer-readable medium described above, a number of the plurality of parity bits may be three (3).

DETAILED DESCRIPTION

Figure 1:
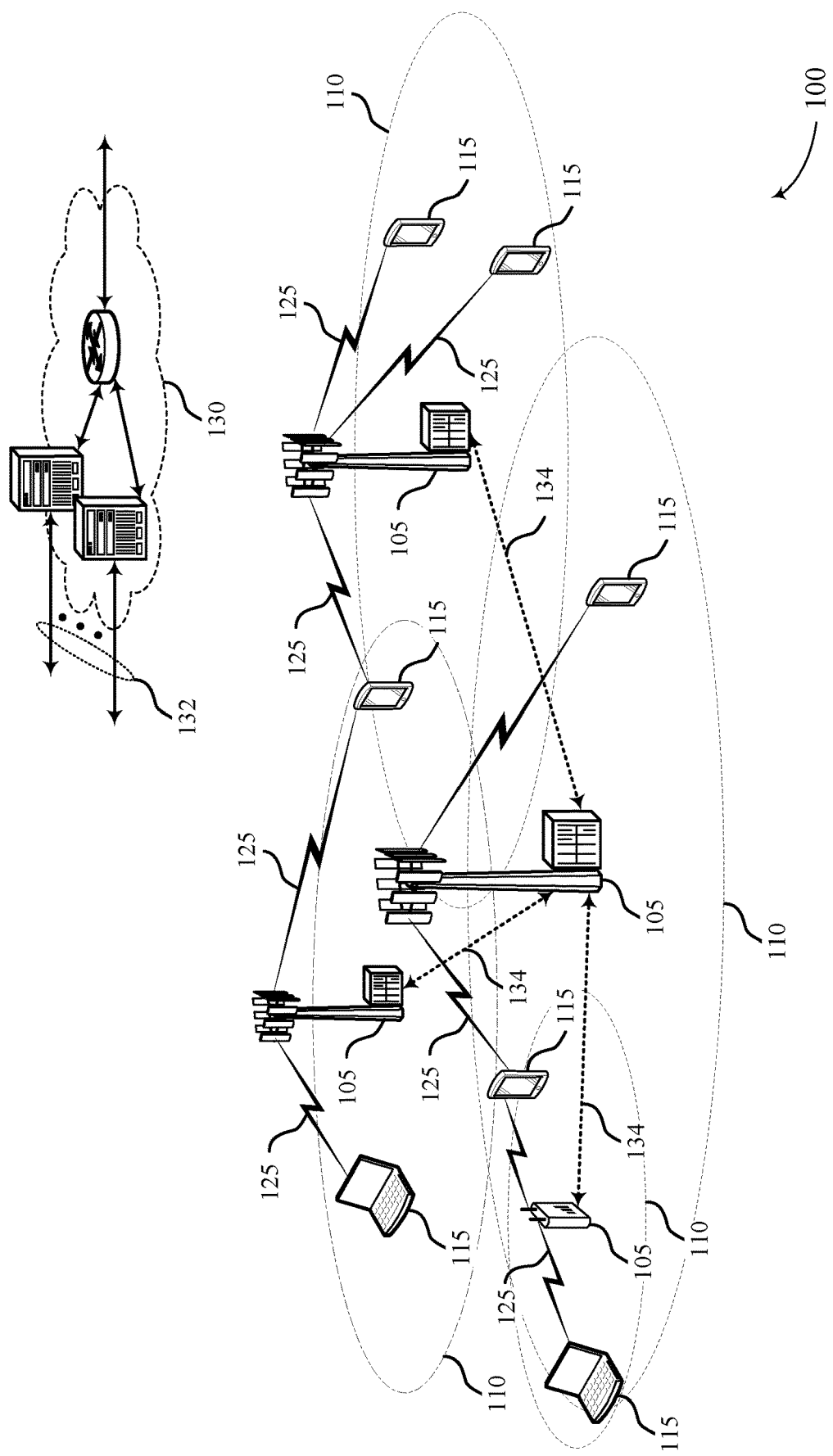
FIG. 1 illustrates an example of a system for wireless communication that supports dynamic frozen bits of polar codes for early termination and performance improvement in accordance with aspects of the present disclosure.

The described techniques relate to improved methods, systems, devices, or apparatuses that support dynamic frozen bits of polar codes and generating and analyzing parity bits of a polar code for early termination and improved performance. Herein, a dynamic frozen bit may also include a parity bit, and dynamic frozen bits and parity bits may be referred to interchangeably. A polar code is an example of a linear block error correcting code and is the first coding technique to provably achieve increased channel capacity. The number of sub-channels for polar codes follows a power function (e.g., $2^X$), where a number of information bits are mapped to different polarized sub-channels (e.g., polar channel indices). The capacity of a given polar channel index may be a function of a reliability metric of the polar channel index.

An encoder may receive an information vector including information bits for encoding, encode the information bits using a polar code to generate a codeword, and transmit the codeword via a wireless communication channel. Also, an encoder may receive a set of information bits (e.g., source bits, error detection code (EDC) bits) for encoding and load the set of information bits on a set of polar channel indices, with the remaining polar channel indices loaded with frozen bits. The encoder may encode the information bits and frozen bits using the polar code to generate a codeword, and transmit the codeword via a wireless communication channel. A decoder may receive the codeword and use a decoding technique attempting to retrieve the information bits from the codeword.

In some wireless systems, the decoder may be an example of a successive cancellation (SC) decoder. An SC decoder may determine input logarithmic-likelihood ratios (LLRs) for the bit channels of the received codeword. During decoding, the SC decoder may determine decoded LLRs (e.g., soft bits) based on these input LLRs, where the decoded LLRs correspond to each bit channel of the polar code. These decoded LLRs may be referred to as bit metrics. In some cases, if the LLR is zero or a positive value, the SC decoder may determine the corresponding bit is a 0 bit, and a negative LLR may correspond to a 1 bit. The SC decoder may use the bit metrics to determine the decoded bit values.

In some cases, Successive Cancellation List (SCL) decoding may be used for decoding the codeword. An SCL decoder may employ multiple concurrent SC decoding processes to decode a codeword candidate (e.g., a hypothesis for a given combination of 'N' and 'k'). Due to the combination of multiple SC decoding processes, the SCL decoder may calculate multiple candidate paths. For example, an SCL decoder of list size 'L' (e.g., the SCL decoder has L SC decoding processes) may calculate L candidate paths, and a corresponding reliability metric (e.g., a path metric) for each candidate path. The path metric may represent a reliability of a decoding path candidate. In SCL decoding, a decoder may determine candidate paths through a code tree and, to limit computational complexity, keep only a list size L number of paths through the code tree at each decoding level. A candidate path may also be referred to herein as a decoding path. In an example, during decoding, a candidate path may be extended at each sub-channel of a code tree through hard decision values of '0' or '1.' Extending L candidate paths by one additional bit results in 2L possible paths. In SCL decoding, a decoder may calculate a path metric for each candidate path and select L paths of the 2L possible paths having the best path metrics. A path metric may be a sum of costs for transitioning from bit value to bit value along a candidate path. Adding a bit having a particular value to a candidate path may be associated with a cost representing a probability of the bit value being correct.

For example, adding a bit having a particular value to a candidate path may be associated with a cost representing a probability of the bit value being correct for that candidate path. The path metric may be based on the determined bit metrics and the bit values selected at each bit channel. The SCL decoder may have a number of levels equal to the number of bit channels in the received codeword. At each level, each candidate path may select either a 0 bit or a 1 bit (e.g., hard bits) based on a path metric of the 0 bit and the 1 bit. The SCL decoder may select candidate paths at each information bit location based on the path metrics. For example, the SCL decoder may select the L candidate paths with the highest path metrics.

In some cases, cyclic redundancy check (CRC) aided SCL (CA-SCL) decoding may be used to improve a detection rate at the expense of increasing a false alarm rate (FAR) (e.g., the FAR may increase as the list size L increases). In CA-SCL, the decoder may obtain a bit sequence corresponding to a candidate path, and extract information bits and CRC bits from the bit sequence. The decoder may apply the same CRC algorithm as applied by an encoder to the information bits to generate calculated CRC bits. The decoder may compare the calculated CRC bits with the extracted CRC bits looking for a match. If a match is found, the decoder determines that the codeword has been properly decoded and outputs the information bits from the bit sequence. If a match is not found, the decoder may check the bit sequence of a next candidate path. If all candidate paths fail CRC, the decoder may output a decoding error.

A polar code may be composed of multiple sub-channels having different levels of reliability. Sub-channel reliability may represent a capacity of the sub-channel to carry information as part of the encoded codeword. Sub-channels of a polar code having higher reliabilities are used to encode information bits and the remaining sub-channels are used to encode frozen bits. For N sub-channels, K information bits may be loaded into the K most reliable sub-channels and N-K frozen bits may be loaded into the N-K least reliable sub-channels, where K<N. A frozen bit is a bit having a known value to a decoder and is generally set as '0'. The value of a frozen bit, however, may be any value as long as the decoder knows or can calculate a value of the frozen bit value from information bits previously received (e.g., bits decoded earlier based on a decoding order of the codeword). A frozen bit having a value that is a function of previously received information bits may be referred to as a "dynamic frozen bit." In some examples, the dynamic frozen bit may be a parity check bit that has a value determined as a function of a defined number of bits preceding the dynamic frozen bit in a decoding order.

Dynamic frozen bits may improve performance by improving path metric weight distribution. When extending a candidate path through a code tree to include an additional bit that corresponds to the location of a dynamic frozen bit within the code tree, an SCL decoder may use a calculated dynamic frozen bit value to select L paths of 2L possible paths that pass a parity check. For example, the SCL decoder may calculate, for each of the 2L possible paths, a parity value as a function of information bits along a candidate path for comparing with the dynamic frozen bit value, and may select the L paths of the 2L possible paths where the calculated parity value matches the dynamic frozen bit value. The SCL decoder may then calculate a path metric for each of the selected L paths and may assign a penalty to a path metric if, for example, a calculated parity value of a bit differs from a hard decision for that bit. Path metric weight distribution may thus be improved by adding the penalty when a calculated parity value of a bit differs from a hard decision for that bit.

Dynamic frozen bits may be used for early termination of SCL decoding. When extending a candidate path through a code tree to include an additional bit that corresponds to the location of a dynamic frozen bit within the code tree, an SCL decoder may use path metrics to select L paths (e.g., the best L paths) of the 2L possible paths. Then, the SCL decoder may calculate a parity value as a function of information bits along one of the selected L candidate paths for comparing with the dynamic frozen bit value. If the calculated value does not match the dynamic frozen bit value, the SCL decoder may determine that the candidate path has failed a parity check. If all of the selected L candidate paths fail the parity check, the SCL decoder may declare a decoding error and terminate decoding. Early termination of decoding may save power.

In addition to information bits and frozen bits, some bits called "parity bits" may be determined as a function of the information bits. Parity bits may improve performance by improving path metric weight distribution. For SC or SCL decoding, parity bits may be treated as information bits for path selection (e.g., path selection for each candidate path may be based on path metrics).

Parity bits may also be used for early termination of SCL decoding. When extending a candidate path through a code tree to include an additional bit that corresponds to the location of a parity bit within the code tree, an SCL decoder may use path metrics to select L paths (e.g., the best L paths) of the 2L possible paths. Then, the SCL decoder may calculate a parity check value as a function of information bits along one of the selected L candidate paths for comparing with the parity bit value. If the calculated parity check value does not match the parity bit value, the SCL decoder may determine that the candidate path has failed a parity check. If all of the selected L candidate paths fail the parity check, the SCL decoder may declare a decoding error and terminate decoding. Early termination of decoding may save power.

Conventionally, the techniques used to generate the parity bits may include using a cyclic shift register to calculate the values of the parity bit. However, such techniques may involve several operations performed by a cyclic shift register. Further, the cyclic shift register for each candidate path may be saved for each candidate path and discarded or cloned when a corresponding candidate path is discarded or cloned. Thus, conventional techniques for generating parity bits for a polar-encoded codeword may be complex. As described herein, a transmitting device may support efficient techniques for generating parity bits for a polar-encoded codeword. Specifically, an encoder at the transmitting device may generate parity bits based on applying a Boolean operation (e.g., exclusive-OR (XOR), negative exclusive-or (XNOR), etc.) to information bits preceding the parity bits in a decoding order. Accordingly, a decoder may perform similar techniques to identify parity check values that may be compared to parity bit values to determine a path metric weight distribution or to determine whether to perform early termination.

Conventionally, the benefits provided by detection performance improvement and early termination are not achieved simultaneously. To improve performance, parity checking of dynamic frozen bits are used to select paths that always pass the parity check and therefore bypass early termination. In contrast, early termination selects paths based on path metrics and uses the parity check for an early determination that none of the best candidate paths will be a correctly decoded sequence. In addition, using parity checking to select the candidate paths increases the probability of finding a correct codeword at the expense of increasing the false alarm rate.

To address these and other issues, the examples described herein may enable a decoder to simultaneously perform detection and CA-SCL decoding of a codeword encoded using a polar code. During encoding, a number of error detection bits may be increased to improve a false alarm rate, and dynamic frozen bits may be employed to simultaneously enable early termination and performance improvement. Performance may be improved by enabling a decoder to use CA-SCL decoding and early pruning of candidate paths. The proposed algorithm also improves decoder power efficiency by enabling early termination.

Aspects of the disclosure are initially described in the context of a wireless communications system. The wireless communications system may implement a parity-aided list decoding algorithm to that supports early termination and improved performance. Aspects of the disclosure are further illustrated by and described with reference to apparatus diagrams, system diagrams, and flowcharts that relate to dynamic frozen bits of polar codes for early termination and performance improvement.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

Transmitters, such as base stations 105 and UEs 115, may apply an error detection algorithm to information bits to generate bits of an error detection code, may generate dynamic frozen bits based on a decoding order, and may generate a payload that includes the bits of the error detection code, the information bits, and the dynamic frozen bits. A transmitter may perform a polar encoding algorithm on the payload to generate a polar-encoded codeword that is transmitted via a communication channel. Receivers, such as base stations 105 and UEs 115, may receive a signal that includes the polar-encoded codeword, and perform a parity-aided list decoding algorithm that supports early termination and improved performance.

In some instances, the base station 105 may be the transmitter and the UE 115 may be the receiver. In other instances, the UE 115 may be the transmitter and the base station 105 may be the receiver. In further instances, a first base station 105 may be the transmitter and a second base station 105 may be the receiver. In additional instances, a first UE 115 may be the transmitter and a second UE 115 may be the receiver. Devices other than a base station and a receiver may also be one or both of the transmitter and receiver.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) region using frequency bands from 300 MHz to 3 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. Wireless communications system 100 may also operate in a super high frequency (SHF) region using frequency bands from 3 GHz to 30 GHz, otherwise known as the centimeter band. In some cases, wireless communication system 100 may also utilize extremely high frequency (EHF) portions of the spectrum (e.g., from 30 GHz to 300 GHz), also known as the millimeter band. Systems that use this region may be referred to as millimeter wave (mmW) systems. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions. Techniques disclosed herein may be employed across transmissions that use one or more different frequency regions.

Wireless communications system 100 may support millimeter wave (mmW) communications between UEs 115 and base stations 105. Devices operating in mmW, SHF, or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals. Multiple-input multiple-output (MIMO) wireless systems use a transmission scheme between a transmitter (e.g., a base station 105) and a receiver (e.g., a UE 115), where both transmitter and receiver are equipped with multiple antennas.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may use multiple antennas or antenna arrays to conduct beamforming operations for directional communications with a UE 115.

In some cases, wireless communications system 100 may be a packet-based network that operates according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARD) to provide retransmission at the MAC layer to improve link efficiency. In the control plane, the Radio Resource Control (RRC) protocol layer may provide establishment, configuration, and maintenance of an RRC connection between a UE 115 and a network device, network device, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30,720,000$ seconds). Time resources may be organized according to radio frames of length of 10 ms ($T_f=307200\ T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both frequency division duplexed (FDD) and time division duplexed (TDD) component carriers.

In some cases, wireless communications system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE U) radio access technology or NR technology in an unlicensed band such as the 5 GHz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

The wireless communications system 100 may implement a parity-aided list decoding algorithm to that supports early termination and improved performance. Dynamic frozen bits may be generated, and a length of EDC bits may be selected, to achieve a desired false alarm rate, a desired detection rate, and parity-based early termination of a decoding process.

In some examples of the techniques described herein, a transmitter (e.g., a base station 105 or a UE 115), may identify information bits to transmit to a receiver (e.g., a base station 105 or a UE 115). In order to enable early termination at the receiver, the transmitter may generate parity bits based on the information bits and a decoding order of the bits to be transmitted to a receiver. As described herein, each parity bit may be generated based on applying a Boolean operation (e.g., XOR) to one or more preceding subsets of information bits in the decoding order. The transmitter may then encode a codeword that includes the information bits and the parity bits using the polar code, and the transmitter may transmit the polar-encoded codeword via a communication channel to the receiver. The receiver may receive a signal that includes the polar-encoded codeword, and perform a parity-aided list decoding algorithm that supports early termination and improved performance.

In some instances, a base station 105 may be the transmitter and a UE 115 may be the receiver. In other instances, a UE 115 may be the transmitter and a base station 105 may be the receiver. In further instances, a first base station 105 may be the transmitter and a second base station 105 may be the receiver. In additional instances, a first UE 115 may be the transmitter and a second UE 115 may be the receiver. Devices other than a base station 105 and a UE 115 may also be one or both of the transmitter and receiver.

Figure 2:
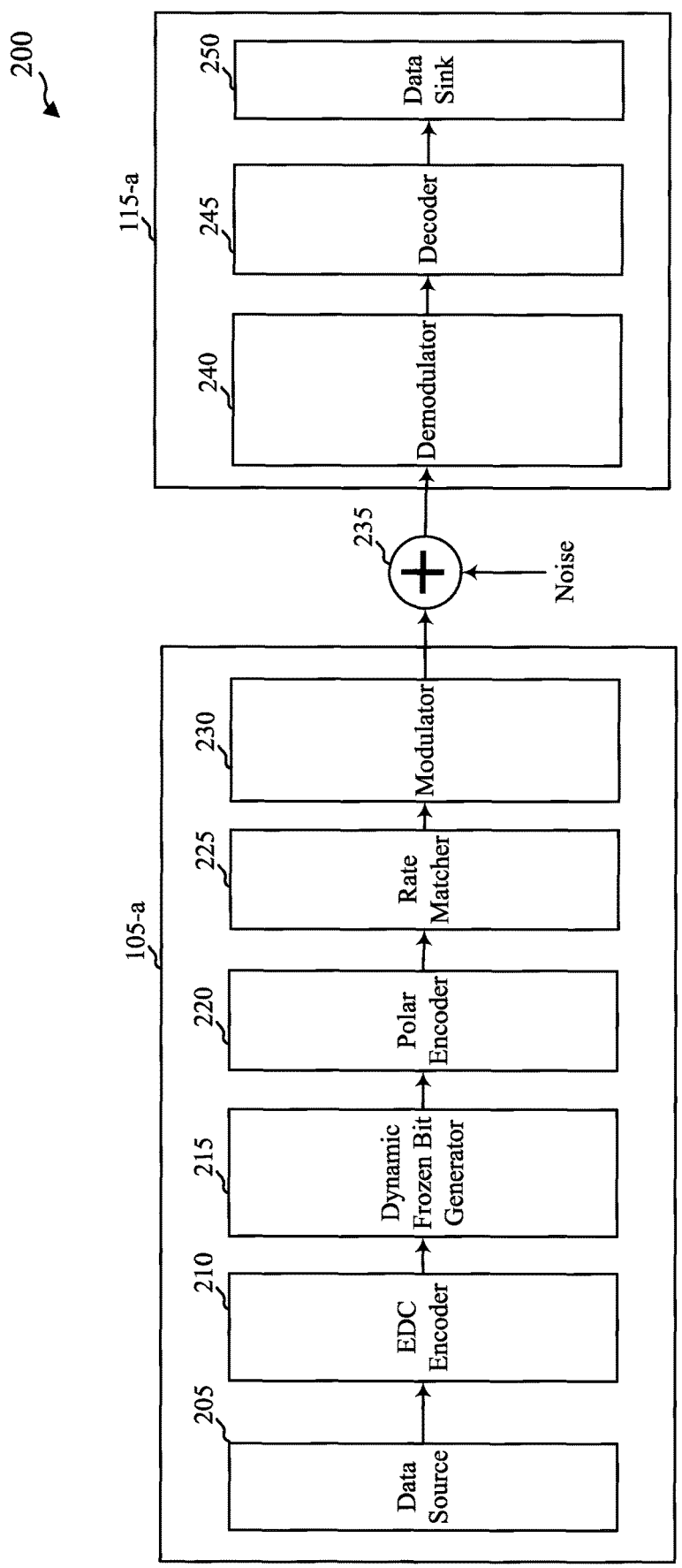
FIG. 2 illustrates an example of a wireless communication system that supports dynamic frozen bits of polar codes for early termination and performance improvement in accordance with aspects of the present disclosure.

FIG. 2 illustrates an example of a wireless communications system 200 that supports dynamic frozen bits of polar codes for early termination and performance improvement in accordance with various aspects of the present disclosure. In some examples, wireless communications system 200 may implement aspects of wireless communications system 100. Wireless communications system 200 may include a base station 105-a and a UE 115-a. Base station 105-a is an example of base station 105 of FIG. 1, and UE 115-a is an example of UE 115 of FIG. 1.

Base station 105-a may use polar encoding to encode information bits for transmission to UE 115-a via a communication channel 235. In other examples, UE 115-a may encode data for transmission to base station 105-a or another UE using these same techniques. In further examples, base station 105-a may encode data for transmission to another base station 105-a using these same techniques. Moreover, devices other than base station 105-a and UE 115-a may use the techniques described herein.

In the depicted example, base station 105-a may include a data source 205, an EDC encoder 210, a dynamic frozen bit generator 215, a polar encoder 220, a rate matcher 225, and a modulator 230. The data source 205 may provide an information vector of k information bits to be encoded and transmitted to the UE 115-a. The data source 205 may be coupled to a network, a storage device, or the like. The data source 205 may output the information vector to the EDC encoder 210.

The EDC encoder 210 may apply an error detecting algorithm to the information vector to generate an EDC value. The EDC value may be a sequence to enable the UE 115-a to detect an error in the information vector due to, for example, corruption caused by noise in a transmission channel 235. In an example, the EDC algorithm may be a cyclic redundancy check (CRC) algorithm (e.g., linear feedback shift register (LFSR), recursive polynomial division) and the EDC value may be a CRC. The length of the EDC value in bits may be selected to enable the UE 115-a to identify errors in a received message that includes the information vector and to suppress a false alarm rate. In some examples, the selected number of bits of the EDC value may be based at least in part on a defined false alarm rate, a defined detection rate, or both. Increasing the length of the EDC value in bits improves the ability to identify errors and reduces the false alarm rate. In an example, the EDC value may have a length of m+c bits, where m is the number of bits in the EDC value for error detection and c is the number of bits in the EDC for false alarm suppression. In some instances, the length m may be a fixed number (e.g., 16 bits) and the length c may be a function of a false alarm rate. In some instances, each of the base station 105-a and the UE 115-a may be aware of length m, and may derive length c from the number of bits in the EDC value and length m. Having a length of m+c bits may serve dual purposes of maintaining an acceptable rate of signal detection and for suppressing the false alarm rate. The EDC encoder 210 may append the EDC value to the information vector to generate a payload having k+m+c bits. The EDC encoder 210 may output the payload to the dynamic frozen bit generator 215.

Figure 3:
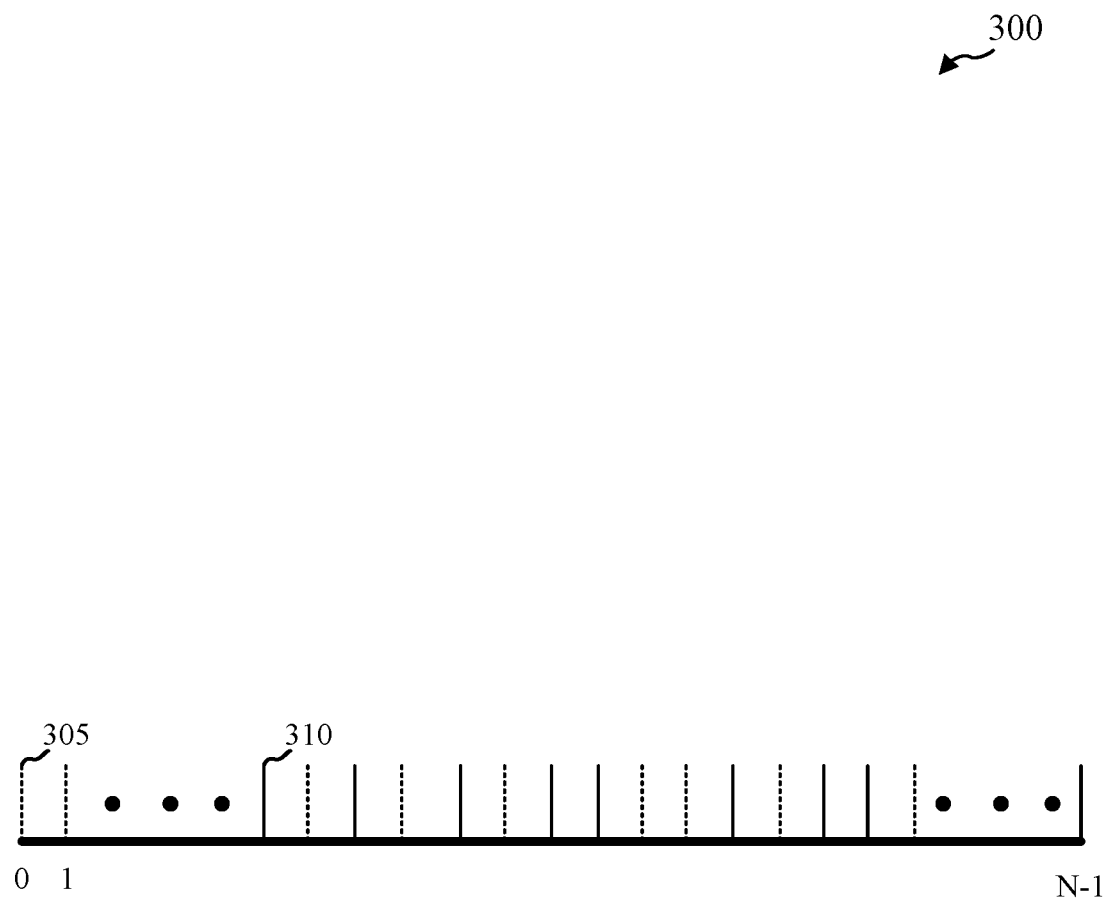
FIG. 3 illustrates an example representation of sub-channels of a polar code in a decoding order that supports dynamic frozen bits of polar codes for early termination and performance improvement in accordance with aspects of the present disclosure.

The dynamic frozen bit generator 215 may generate values for dynamic frozen bits and/or each parity bit as a function of information bits, EDC bits, CRC bits, or some combination thereof, that precede each the location of each dynamic frozen bit in a decoding order of the codeword. FIG. 3 illustrates an example of a diagram 300 of sub-channels of a polar code in a decoding order that supports dynamic frozen bits of polar codes for early termination and performance improvement in accordance with various aspects of the present disclosure. The dynamic frozen bit generator 215 may identify sub-channels of a polar code in a decoding order. The decoding order may be the order in which the decoder 245 decodes sub-channels of a polar code. The dynamic frozen bit generator 215 may determine the decoding order or otherwise be aware of the decoding order (e.g., access a table in memory that includes the decoding order). The decoding order may indicate which sub-channels include information bits, EDC bits, CRC bits, parity bits, dynamic frozen bits, and frozen bits.

Sub-channels of a polar code having higher reliabilities are used to encode information bits and the remaining sub-channels are used to encode frozen bits. For N sub-channels, K information bits may be loaded into the K most reliable sub-channels and N-K frozen bits may be loaded into the N-K sub-channels the least reliable sub-channels, where K<N. Diagram 300 depicts N sub-channels in a decoding order with sub-channel 0 on the left, followed by sub-channel 1, and proceeding sequentially to sub-channel N−1. Sub-channels 305 corresponding to frozen bits are depicted using dashed lines, and sub-channels 310 corresponding to information bits or EDC bits are depicted using solid lines. The depicted location of the sub-channels within the decoding order is an example and the location of any particular sub-channel may depend on its reliability relative to other sub-channels of the polar code.

Figure 4:
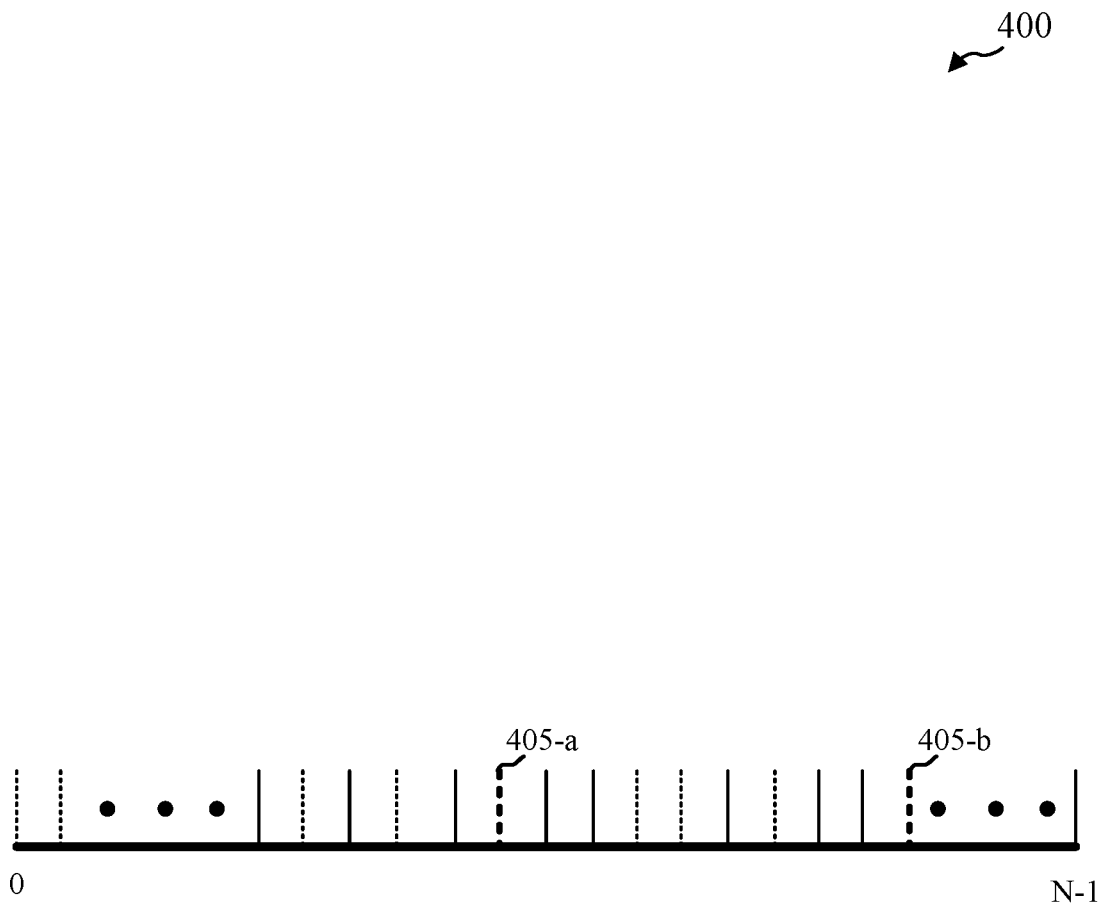
FIG. 4 illustrates an example of sub-channels of a polar code in a decoding order that supports dynamic frozen bits of polar codes for early termination and performance improvement in accordance with aspects of the present disclosure.

The dynamic frozen bit generator 215 may select a defined number of the best frozen bit sub-channels associated with the highest reliability to be dynamic frozen bit sub-channels and/or to allocate to the parity bits. FIG. 4 illustrates an example of diagram 400 of sub-channels of a polar code in a decoding order that supports dynamic frozen bits of polar codes for early termination and performance improvement in accordance with various aspects of the present disclosure. In an example, the dynamic frozen bit generator 215 may determine or otherwise be aware of the reliability of the frozen bit sub-channels (e.g., access a table stored in memory indicating a reliability order of the sub-channels). The number of the dynamic frozen bits and/or parity bits may be based at least in part on a target detection rate during parity-directed SCL decoding, on enabling early termination during the parity-directed SCL decoding, or both.

In an example, if there are 24 frozen bit sub-channels, the dynamic frozen bit generator 215 may select the j most reliable of the 24 dynamic frozen bit sub-channels as the dynamic frozen bit sub-channels (e.g., j=8) and/or parity bit sub-channels. In some examples, the number of parity bits and parity bit sub-channels, j, of a polar code may be equal to three (3). The remaining frozen bit sub-channels may be loaded with a defined value (e.g., '0'). In FIG. 4, frozen bit sub-channels 405-$a$ and 405-$b$ are selected as the dynamic frozen bit sub-channels. In some examples, so that the dynamic frozen bit sub-channels are at least somewhat uniformly dispersed throughout the decoding order, the dynamic frozen bit generator 215 may avoid selecting consecutive frozen bit sub-channels, or sub-channels within a defined number of sub-channels, as dynamic frozen bit sub-channels. When two consecutive (or within a defined number of) frozen bit sub-channels would be selected based on reliability, the dynamic frozen bit generator 215 may only select one of the two and select a next most less reliable sub-channel that is not consecutive (or not within a defined number of frozen bit sub-channels) to be the next dynamic frozen bit sub-channel.

In another example illustrated by FIG. 4, frozen bit sub-channels 405-$a$ and 405-$b$ are selected as the parity bit sub-channels. The parity bit at frozen bit sub-channel 405-$a$ may be defined as $p_1$ and the parity bit at frozen bit sub-channel 405-$b$ may be defined as $p_2$. In some examples, so that the parity bit sub-channels are at least somewhat uniformly dispersed throughout the decoding order, the dynamic frozen bit generator 215 may avoid selecting consecutive frozen bit sub-channels, or sub-channels within a defined number of sub-channels, as parity bit sub-channels. When two consecutive (or within a defined number of) frozen bit sub-channels would be selected based on reliability, the dynamic frozen bit generator 215 may only select one of the two and select a next most less reliable sub-channel that is not consecutive (or not within a defined number of frozen bit sub-channels) to be the next parity bit sub-channel.

Figure 5:
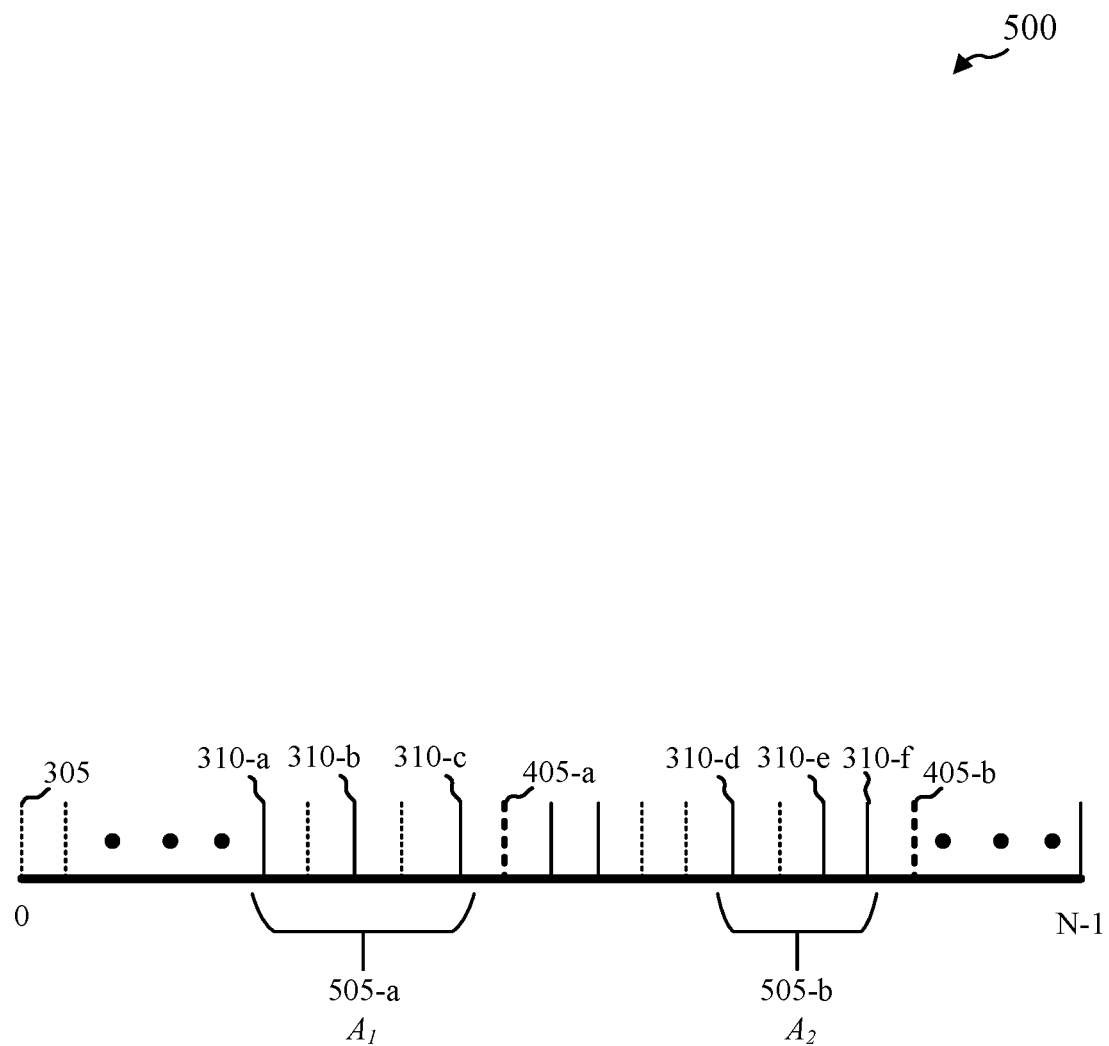
FIG. 5 illustrates an example of sub-channels of a polar code in a decoding order that supports dynamic frozen bits of polar codes for early termination and performance improvement in accordance with aspects of the present disclosure.

The dynamic frozen bit generator 215 may then calculate values of the dynamic frozen bits and/or the parity bits. FIG. 5 illustrates an example of diagram 500 of sub-channels of a polar code in a decoding order that supports dynamic frozen bits of polar codes for early termination and improved detection performance. In some examples, the value of a dynamic frozen bit and/or parity bit may be a function of a defined number of information bits, EDC bits (e.g., CRC bits), or both, that precede a dynamic frozen bit or parity bit sub-channel in the decoding order. In the depicted example, the value of dynamic frozen bit and/or parity bit at sub-channel 405-$a$ may be a function of the bit values of a subset of bits 505-$a$ including information bit sub-channel 310-$a$, EDC bit sub-channel 310-$b$, and information bit sub-channel 310-$c$, and the value of dynamic frozen bit and/or parity bit at sub-channel 405-$b$ may be a function of a subset of bits 505-$b$ including the bit values at EDC bit sub-channel 310-$d$, EDC bit sub-channel 310-$e$, and information bit sub-channel 310-$f$. In some examples, the value of the parity bit at sub-channel 405-$b$ may be a function of the bit values of two subsets of information bits, illustrated as 505-$b$, preceding sub-channel 405-$b$ in the decoding order and subsequent to sub-channel 405-$a$ of a previous parity bit in the decoding order.

For example, the dynamic frozen bit generator 215 may perform a Boolean operation (e.g., exclusive-or (XOR)) on the bit values at sub-channels 310-$a$, 310-$b$, and 310-$c$ to calculate the value of the dynamic frozen bit and/or parity bit at sub-channel 405-$a$, and may perform the Boolean operation (e.g., XOR) on the bit values at sub-channels 310-$d$, 310-$e$, and 310-$f$ to calculate the value of the dynamic frozen bit and/or parity bit at sub-channel 405-$b$. In some cases, one or more frozen bit sub-channels may be in a preceding interval 505-$a$ that includes the sub-channels 310-$a$, 310-$b$, and 310-$c$ and the bit values of those frozen bit sub-channels 305 may be ignored (e.g., not counted for the defined number of bits used for determination of the dynamic frozen bit). Likewise, one or more frozen bit sub-channels may be in a preceding interval 505-$b$ that includes the sub-channels 310-$d$, 310-$e$, and 310-$f$ and the bit values of those frozen bit sub-channels may be ignored. In some examples, the dynamic frozen bit generator 215 may perform the Boolean operation using bit values from two or more preceding sub-channels in the decoding order (e.g., immediately preceding non-frozen bit channels). In some cases, the number of dynamic frozen bit and/or parity bit may be a function of the total number of information and EDC bits (e.g., a function of k+m+c) that precede the parity check bit sub-channel in the decoding order. For example, the number of dynamic frozen bits may be determined as $j \approx (k+m+c)/g$, where g is the number of information bits or EDC bits used for computation of each dynamic frozen bit.

In some examples, the calculated value of each dynamic frozen bit at each sub-channel 405 may be used as a parity check during decoding. Because locations of the dynamic frozen bit sub-channels are at least somewhat dispersed throughout the decoding order, the parity check may provide information in decoding related to the probability of candidate paths resulting in correct decoding (e.g., passing the EDC).

Additionally or alternatively, the value of a parity bit may be a function of all information bits, CRC bits, or both, that precede the parity check bit sub-channel in the decoding order. In the depicted example, the value of the parity bit at sub-channel 405-$a$ may be a function of all information bits preceding sub-channel 405-$a$ in the decoding order (i.e., the subset of information bits 505-$a$). Similarly, the value of the parity bit at sub-channel 405-$b$ may be a function of all information bits preceding sub-channel 405-$b$ in the decoding order (i.e., the subset of information bits 505-$a$ and the subset of information bits 505-$b$ and 505-$c$). Thus, the value of a generic parity bit may be defined as a function of all subsets of information bits preceding the generic parity bit in the decoding order including 505-$a$, 505-$b$, and so on.

As discussed above, the dynamic frozen bit generator 215 may determine the values of the parity bits at sub-channels 405 based on applying a Boolean operation (e.g., XOR, XNOR, etc.) to one or more subsets of information bits 505. For example, the dynamic frozen bit generator 215 may apply the Boolean operation to information bits in the subset of information bits 505-$a$ to generate the parity bit at sub-channel 405-$a$. Further, the dynamic frozen bit generator 215 may apply the Boolean operation to information bits in the subset of information bits 505-$a$ and the subset of information bits 505-$b$ to generate the parity bit at sub-channel 405-$b$. In some cases, the bit values of those frozen bit sub-channels 305 between the subset of information bits 505-$b$ may be ignored (e.g., not counted in the bits used to determine the parity bit). Thus, the value of a generic parity check bit may be defined based on applying the Boolean operation (e.g., XOR, XNOR, etc.) to all subsets of information bits preceding the generic parity bit in the decoding order including 505-$a$, 505-$b$, and so on.

Although the examples described above discuss determining the value of a parity bit based on information bits preceding the parity bit in the decoding order, it is to be understood that, in some cases, there may be no information bits preceding the parity bit in the decoding order or there may be no information bits between a parity bit and a previous parity bit (i.e., $|A_i|$=0). In such cases, the value of the parity bit (p) may be zero (0) (i.e., $p_i$=0). Further, although the examples described above are directed to performing an XOR/XNOR operation on different subsets of information bits, it is to be understood that the techniques described herein may apply to performing additional or alternative Boolean operations on the different subsets of information bits. For example, the dynamic frozen bit generator 215 may generate parity bits based on performing OR and/or AND operations on groups of two information bits in a subset of information bits and then performing an XOR/XNOR operation on the bits resulting from these Boolean operations. Thus, the parity bits may be generated based on nesting multiple Boolean operations (e.g., OR, AND, XOR, XNOR, and the like) or based on an individual Boolean operation.

Figure 6:
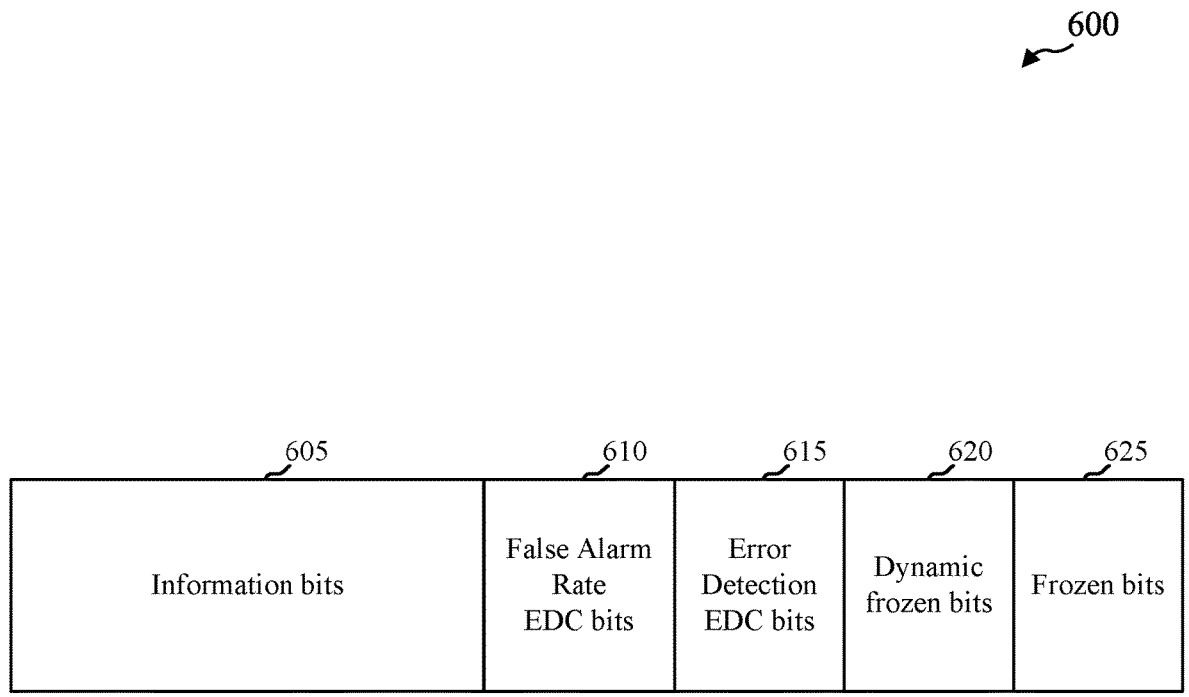
FIG. 6 illustrates an example of a payload that supports dynamic frozen bits of polar codes for early termination and performance improvement in accordance with aspects of the present disclosure.

Referring again to FIG. 2, the dynamic frozen bit generator 215 may generate the values of the dynamic frozen bit and/or parity bit sub-channels and output a payload to the polar encoder 220 for polar encoding. FIG. 6 illustrates an example of a payload 600 that supports dynamic frozen bits and/or parity bits of polar codes for early termination and performance improvement in accordance with various aspects of the present disclosure. The payload 600 may include information bits 605, false alarm rate (FAR) EDC bits 610, error detection EDC bits 615, dynamic frozen bits 620 (e.g., parity bits), and frozen bits 625. The frozen bits 625 may be assigned a defined bit value (e.g., zero). In some examples, the FAR EDC bits 610 and error detection EDC bits 615 may be included in a joint EDC value (e.g., determined by a single EDC function). The number of FAR EDC bits 610 may be determined based on normalization of FAR for a list decoder. For example, the number of FAR EDC bits 610 may constrain a number of the candidate paths generated by the list decoder that are to be checked using the EDC in order to not exceed a predetermined FAR. A list decoder may flexibly apply decoding techniques (e.g., list size, candidate path selection, etc.), so long as the predetermined FAR using the number of FAR EDC bits 610 is not exceeded.

Referring again to FIG. 2, the polar encoder 220 may perform polar encoding on the payload 600 to generate a polar-encoded codeword (e.g., of N bits). The polar encoder 220 may allocate sub-channels of a polar code to information bits, EDC bits, dynamic frozen bits, parity bits, and frozen bits based at least in part on a reliability of each of the sub-channels. The polar encoder 220 may allocate the sub-channels based on reliability, with the most reliable sub-channels allocated to information bits, EDC bits, or both, a next most reliable subset of the sub-channels allocated to the dynamic frozen bits and/or parity bits, and a remaining subset of the sub-channels allocated to the frozen bits. In some examples, the polar encoder 220 may generate a codeword by multiplying a generator matrix with a constructed bit sequence of the payload 600. The rate matcher 225 may receive the codeword from the polar encoder 220 and perform rate matching. Rate matching may involve selecting some of the coded bits of the codeword for transmission in a particular TTI. The modulator 230 may modulate the polar-encoded codeword for transmission via wireless communication channel 235 which may distort the signal carrying the polar-encoded codeword with noise.

The UE 115-$a$ may receive a signal that includes the polar-encoded codeword. In an example, the UE 115-$a$ may include a demodulator 240, a decoder 245, and a data sink 250. The demodulator 240 may receive the signal including the polar-encoded codeword and input the demodulated signal into decoder 245 for decoding of the polar-encoded codeword. The demodulated signal may be, for example, a sequence of LLR values representing a probability value of a received bit being a '0' or a '1'. The decoder 245 may perform a list decoding algorithm on the LLR values (e.g., CA-SCL decoding, SCL decoding,) and may provide an output. If successfully able to decode the polar-encoded codeword, the decoder 245 may output a bit sequence of the information vector (e.g., the k information bits input to the EDC encoder 210) to a data sink 250 for use, storage, communication to another device (e.g., transmission via a wired or wireless communication channel), communication via a network, or the like. Otherwise, the decoder 245 may indicate that decoding was unsuccessful. As noted above, while the example of FIG. 2 describes the base station 105-$a$ performing the encoding and UE 115-$a$ performing the decoding, the roles may be reversed. Moreover, devices other than the base station 105-$a$ and the UE 115-$a$ may perform the encoding and decoding.

According to various aspects, the decoder 245 may perform a decoding technique that simultaneously improves performance and supports early termination, as described below. Performing decoding of the codeword may include at least a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to at least one of the second subset of the decoding paths based at least in part on a representation of the plurality of error detection bits and the generated path metrics.

Figure 7:
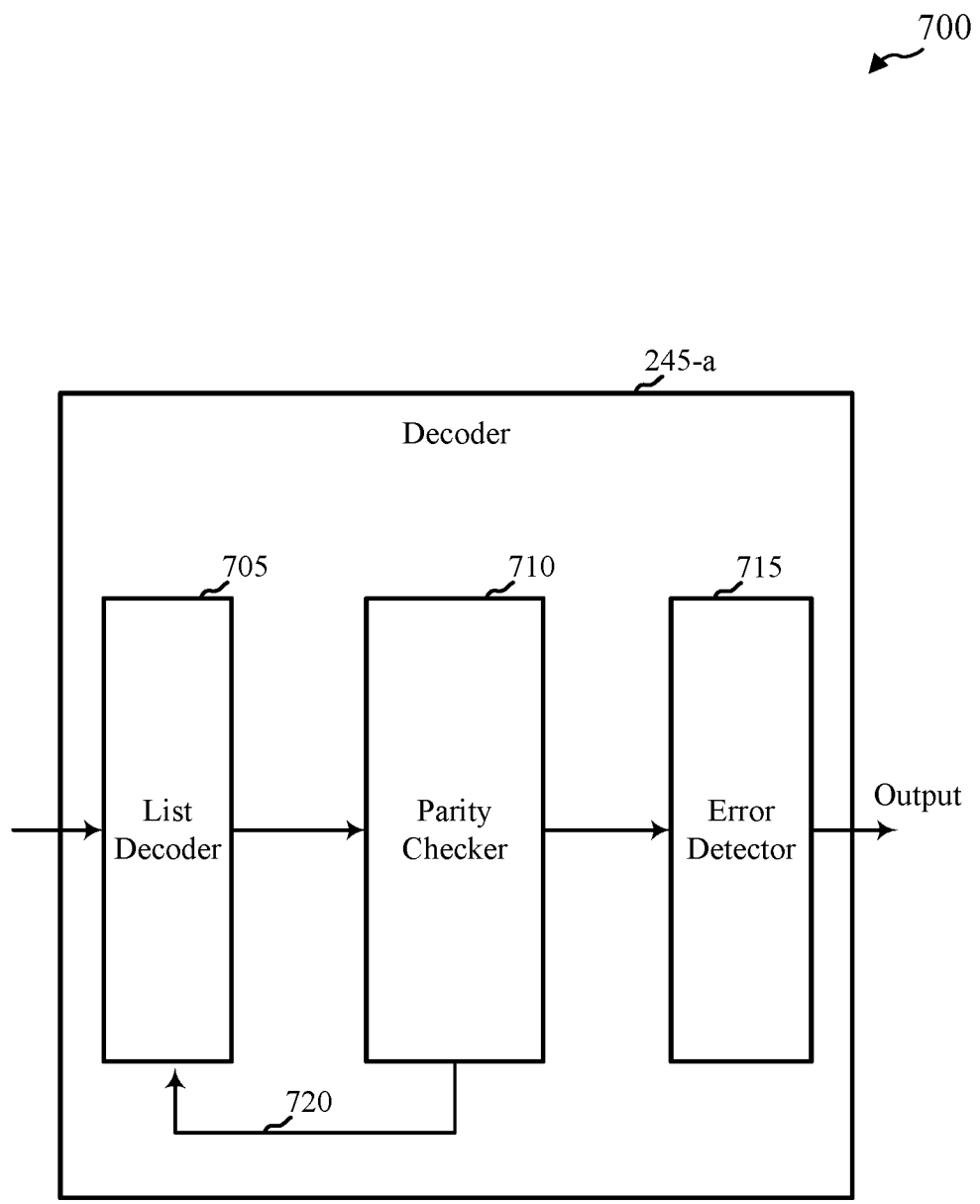
FIG. 7 illustrates an example diagram of a decoder that supports dynamic frozen bits of polar codes for early termination and performance improvement in accordance with aspects of the present disclosure.

FIG. 7 illustrates an example diagram 700 of a decoder that supports dynamic frozen bits of polar codes for early termination and performance improvement in accordance with various aspects of the present disclosure. In some examples, decoder 245-a may implement aspects of decoder 245.

The decoder 245-a may include a list decoder 705, a parity checker 710, and an error detector 715. The list decoder 705 may perform a path search algorithm to search a code tree for decoding a received polar-encoded codeword. As explained below in further detail, the list decoder 705 may identify candidate paths through the code tree. The parity checker 710 may perform parity checking for determining whether to terminate a list decoding process early and may include a feedback path 720 for instructing the list decoder 705 when to terminate decoding. The parity checker 710 may also determine path metrics for candidate paths through the code tree that satisfy a parity check based on the dynamic frozen bits. If the decoding process does not terminate early, the list decoder 705 may determine a list size L of candidate paths and output bit sequences corresponding to the L candidate paths to the error detector 715 for error detection. In some examples, L may be greater than the number of EDC bits c used for false alarm rate suppression. In this case, $2^c$ paths of the L paths (e.g., the $2^c$ paths having the highest path metrics) may be checked by error detector 715, while the other paths may be discarded. The error detector 715 may iteratively perform an error detection algorithm on the bit sequences in an order based on the path metrics. The error detector 715 may stop as soon as one of the bit sequences passes the error detection algorithm, or all of the bit sequences have been checked and none passed the error detection algorithm.

Figure 8:
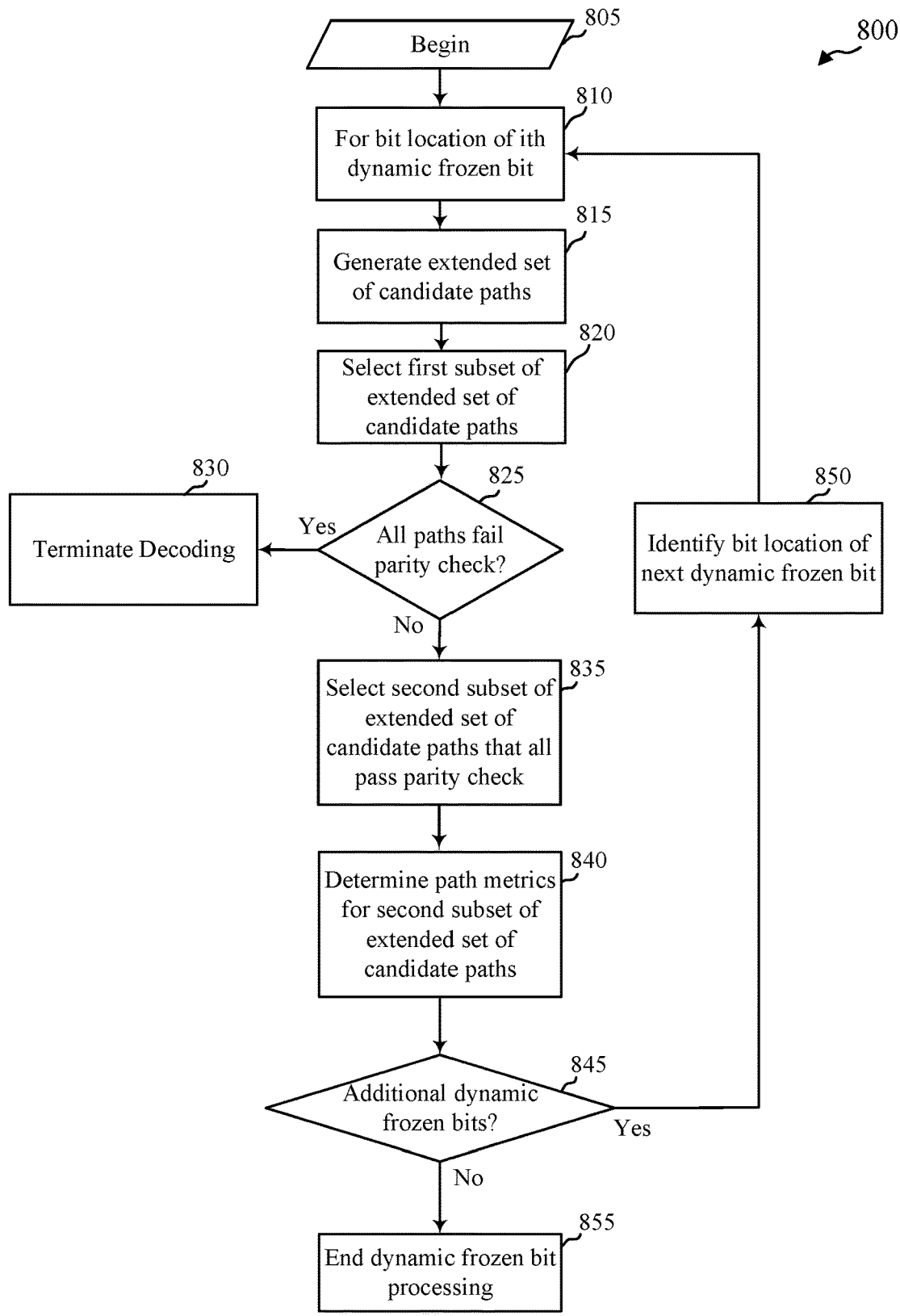
FIG. 8 illustrates an example of a flow diagram that supports dynamic frozen bits of polar codes for early termination and performance improvement in accordance with aspects of the present disclosure.

FIG. 8 illustrates an example of a flow diagram 800 that supports dynamic frozen bits of polar codes for early termination and performance improvement in accordance with various aspects of the present disclosure. Blocks 810 to 830 describe operations for determining whether to terminate the decoding process early, and blocks 835-850 describe techniques for performance improvement. The flow diagram 800 may begin at 805 and proceed to block 810.

At 810, the list decoder 705 of decoder 245-a may perform a list decoding algorithm on a received codeword encoded using a polar code, identify L candidate paths at a particular level in a code tree, and determine that a bit location at a next level of the code tree corresponds to a dynamic frozen bit. The list decoder 705 may be, for example, an SCL decoder, a CA-SCL decoder, or the like.

Figure 9:
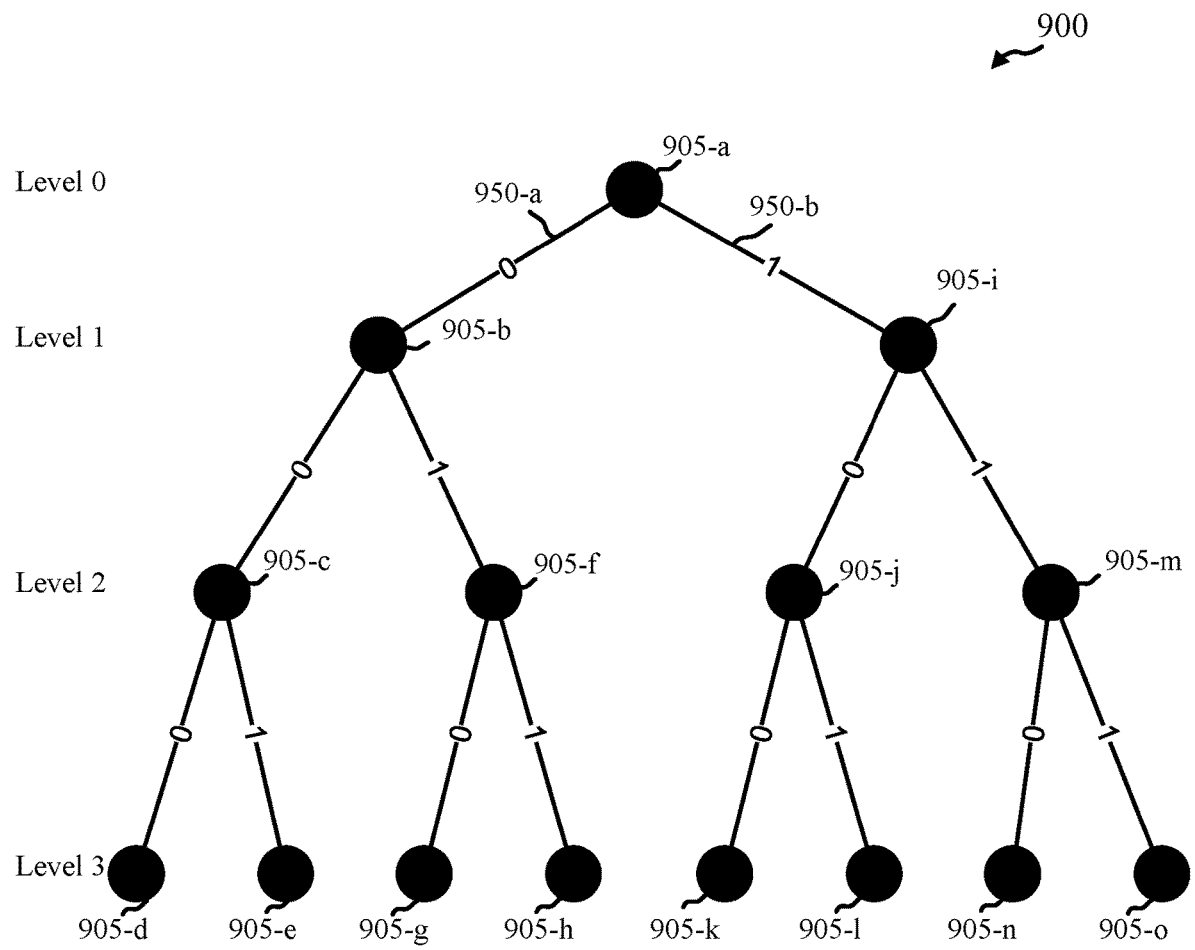
FIG. 9 illustrates an example of a code tree that supports dynamic frozen bits of polar codes for early termination and performance improvement in accordance with aspects of the present disclosure.

At 815, the list decoder 705 generate an extended set of candidate paths through a code tree by extending L candidate paths to include an additional bit. FIG. 9 illustrates an example of a code tree 900 that supports dynamic frozen bits of polar codes for early termination and performance improvement in accordance with various aspects of the present disclosure. Code tree 900 is a graphical representation of how list decoder 705 performs the list decoding process. The code tree 900 includes multiple nodes 905 and a line between pairs of nodes is referred to herein as a branch 950 (e.g., branch 950-a connects node 905-a to node 905-b, and branch 950-b connects node 905-a to node 905-i). Each branch 950 is associated with a possible value for a bit, which may be a '1' or a '0'. Branch 950-a is associated with a bit being a '0', and branch 950-b is associated with the bit being a '1'. Each branch 950 is also associated with a value for a metric. The metric value may represent a cost for proceeding from one node to the next. The metric may be, for example, a distance metric (e.g., LLR converted to a distance) or a probability metric (e.g., LLR, etc.). The metric may represent a likelihood of moving from one node to the next based on whether the next bit in the sequence is a 1 or a 0. In some instances, the metric may represent a distance value between nodes.

The list decoder 705 may process demapped symbols output by the demodulator 240 and determine the probability (e.g., LLR value) of whether bits corresponding to the demapped symbols are '0s' or '1s'. The determination of the probability of whether a particular bit value is a '0' or a '1' may also be a function of prior decoding decisions. This process is reflected in the code tree 900.

The list decoder 705 may initially begin at node 905-a and process the LLR values to determine along which branch to proceed. At node 905-a, the list decoder 705 may determine the likelihood of whether a LLR value is a '0' or a '1', and hence may proceed to either node 905-b or node 905-i. Node 905-b may be associated with the first bit being a '0', and node 905-i may be associated with the first bit being a '1'. Each branch 950-a, 950-b is associated with a value for a metric (e.g., branch metrics) and the list decoder 705 accumulates the branch metric values as it traverses branches 950 in the code tree 900 to generate a path metric. Accumulation to form the path metric may be performed at each node 905 (e.g., for each bit-channel of the polar code having an information bit or dynamic frozen bit, etc.) and may involve, for example, adding the metric value of each branch along a path. A path may refer to a particular route between nodes 905 through the code tree 900. The list decoder 705 selects which of the paths is the best using the accumulated path metrics.

In some instances, the list decoder 705 may maintain a respective path metric for every possible path through code tree 900. Retaining path metrics for all possible paths may be computationally expensive and, in other instances, the list decoder 705 may use the path metrics to prune selected paths. For example, the list decoder 705 may have a list size L that limits the number of paths that are maintained at each level of the code tree. To do so, the list decoder 705 may maintain up to L candidate paths at each level, and discard the remaining candidate paths. In an example, FIG. 9 depicts level 0 to level 3. If L=4, the list decoder 705 may maintain up to 4 paths at each level, and may discard any additional paths. At level 1, there are two possible paths (e.g., node 905-a to node 905-b, and node 905-a to node 905-i), and hence the list decoder 705 may maintain both paths. At level 2, there are four possible paths (e.g., node 905-a to node 905-b to node 905-c, node 905-a to node 905-b to node 905-f, node 905-a to node 905-i to node 905-j, and node 905-a to node 905-i to node 905-m), and hence the list decoder 705 may maintain all 4 paths. At level three, there are 8 possible paths, and hence the list decoder 705 may maintain 4 of the 8 paths. At each subsequent level the number of possible paths doubles (e.g., level four has 16 possible paths, level five has 32 possible paths, and so forth), and the list decoder 705 may maintain 4 of the paths.

Figure 10:
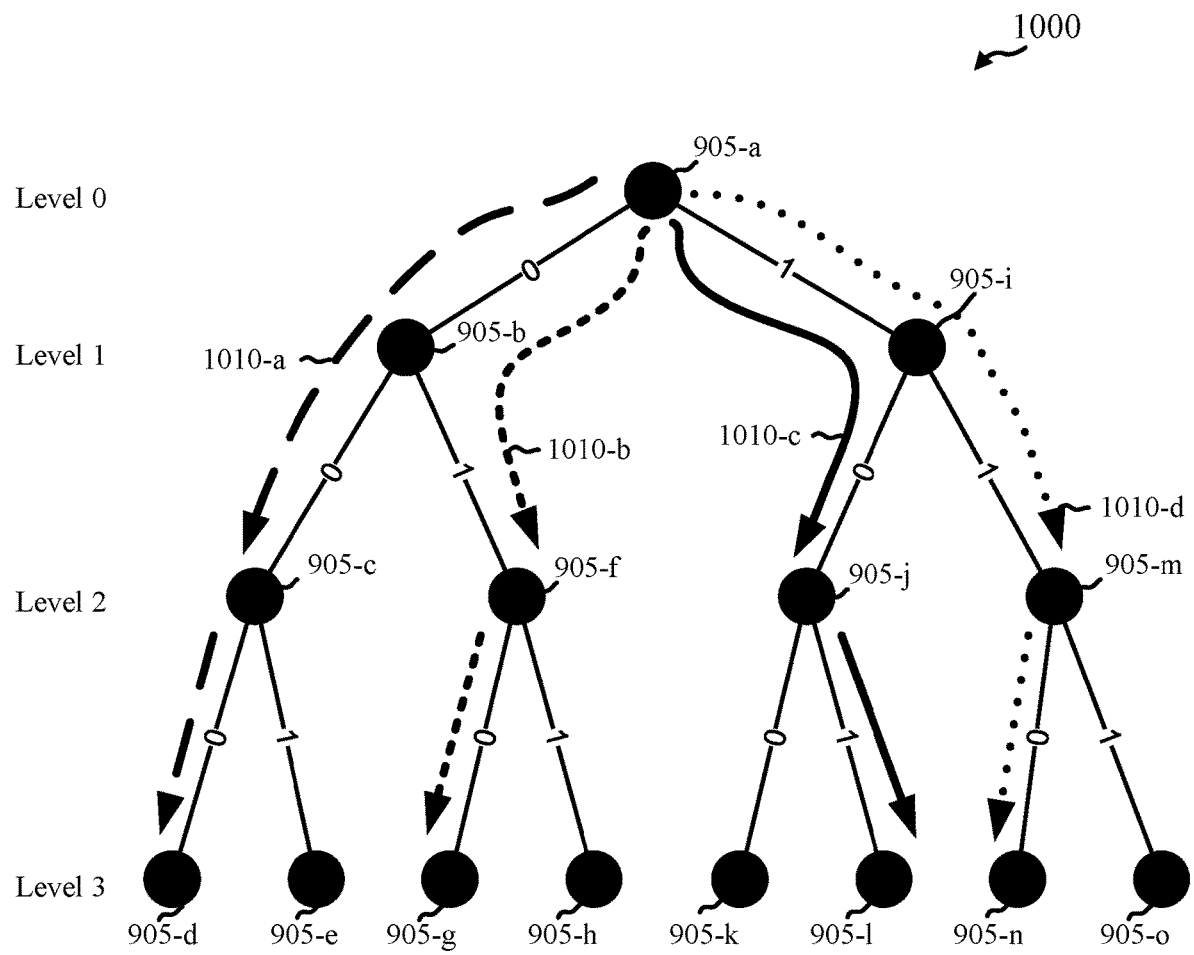
FIG. 10 illustrates an example of a code tree that supports dynamic frozen bits of polar codes for early termination and performance improvement in accordance with aspects of the present disclosure.

To generate an extended set of candidate paths through a code tree, the list decoder 705 may extend L candidate paths from one level to the next to identify 2L possible candidate paths. FIG. 10 illustrates an example of a code tree 1000 that supports dynamic frozen bits of polar codes for early termination and performance improvement in accordance with various aspects of the present disclosure. As shown, the list decoder 705 is extending the paths 1010 from the nodes at level 2 to the nodes at level 3. As depicted, path 1010-a includes node 905-a, 905-b, and 905-c, and may be extended to either node 905-d or 905-e. Path 1010-b includes node 905-a, 905-b, and 905-f, and may be extended to either node 905-g or 905-h. Path 1010-c includes node 905-a, 905-i, and 905-j, and may be extended to either node 905-k or 905-1. Path 1010-d includes node 905-a, 905-i, and 905-m, and may be extended to either node 905-n or 905-o.

Referring again to FIG. 8, at block 820, the list decoder 705 may select a first subset of the extended set of candidate paths according to a first path selection criterion. In an example, the path selection criterion may be a path metric, and the list decoder 705 may retain L paths of the 2L possible paths having the best path metrics. The list decoder 705 may use the path metrics, which are accumulated metric values, for determining which paths to keep (e.g., minimum accumulated distance, highest accumulated probability, etc.). For example, with reference to FIG. 10, the list decoder 705 may add a metric value for the branch proceeding from node 905-c to node 905-d to an accumulated value for path 1010-a to determine a path metric to extend path 1010-a to node 905-d. The list decoder 705 may make a similar determination for extending all of the paths 1010 to any of the nodes in level 3. In this example, the list decoder 705 may have 8 possible paths to the nodes in level 3 and determine a path metric for each of the 8 possible paths. Because L=4, the list decoder 705 may select 4 of the 8 paths that have the best path metric (e.g., minimum accumulated distance, highest accumulated probability, etc.). For example, the list decoder 705 may determine, based on the path metrics, that the 4 best of the extended candidate paths are extending candidate path 1010-a to node 905-d, extending candidate path 1010-b to node 905-g, extending candidate path 1010-c to node 905-1, and extending candidate path 1010-d to node 905-n, and may select a first subset of the extended set of candidate paths accordingly.

Referring again to FIG. 8, at block 825, the parity checker 710 may determine whether all paths in the first subset of the extended set of candidate paths fail a parity check. In an example, the parity checker 710 may perform a parity check of a first subset of decoding paths for making a decision on early termination of decoding of the codeword based at least in part on the dynamic frozen bits used to generate the codeword. In a further example, with reference to FIG. 10, level 3 of the code tree may correspond to a location of a dynamic frozen bit and the parity checker 710 may use the value of the dynamic frozen bit as a parity check on the first subset of the extended set of candidate paths. The parity checker 710 may calculate a parity value of preceding information bits, EDC bits, or both, along a candidate path for comparison with the dynamic frozen bit value along the candidate path. For example, the parity checker 710 may perform a Boolean operation (e.g., XOR) on values of a defined number of information bits, EDC bits, or both, along extended candidate path 1010-a to node 905-d, to calculate a parity value, and compare the calculated value with the value represented by the branch between nodes 905-c and 905-d. With reference to FIG. 5, the parity checker 710 may also ignore bits along an extended candidate path in the decoding order corresponding to frozen bits when calculating the parity value.

In example, in code tree 1000, candidate path 1010-a corresponds to a bit sequence of [0, 0, 0], and let the first bit be an information bit, the second bit be an EDC bit, and the third bit be a dynamic frozen bit. In this example, the value of the dynamic frozen bit may be determined as the exclusive-or of the first and second bits. The parity checker 710 may compare the calculated parity value to a value of the dynamic frozen bit value along the candidate path. In this example, the parity checker 710 may calculate the XOR of the first two bits which results in a value of '0' (e.g., 0 XOR 0=0). Here, the parity checker 710 determines that the calculated value matches the value of the dynamic frozen bit (e.g., value represented by the branch between nodes 905-c and 905-d), and hence candidate path 1010-a passes the parity check. If, however, the calculated parity value does not match the dynamic frozen bit value, the parity checker 710 may determine that the candidate path has failed a parity check. If all of the L candidate paths 1010 of the first subset of the extended candidate paths fail the parity check, the parity checker 710 may declare a decoding error, and, with reference to FIG. 8, proceed to block 830 and terminate decoding. Early termination of decoding may save power. If the calculated parity value matches the dynamic frozen bit value for at least one of the extended candidate paths, the flow diagram 800 may proceed to block 835.

At block 835, the parity checker 710 may select a second subset of the extended candidate paths according to a second path selection criterion. For example, the parity checker 710 may generate path metrics for a second subset of the decoding paths that each pass the parity check based at least in part on the dynamic frozen bits. In some examples, the second path selection criterion may be to select, from the possible 2L extended candidate paths, the L candidate paths that each pass a parity check based on the dynamic frozen bit.

Figure 11:
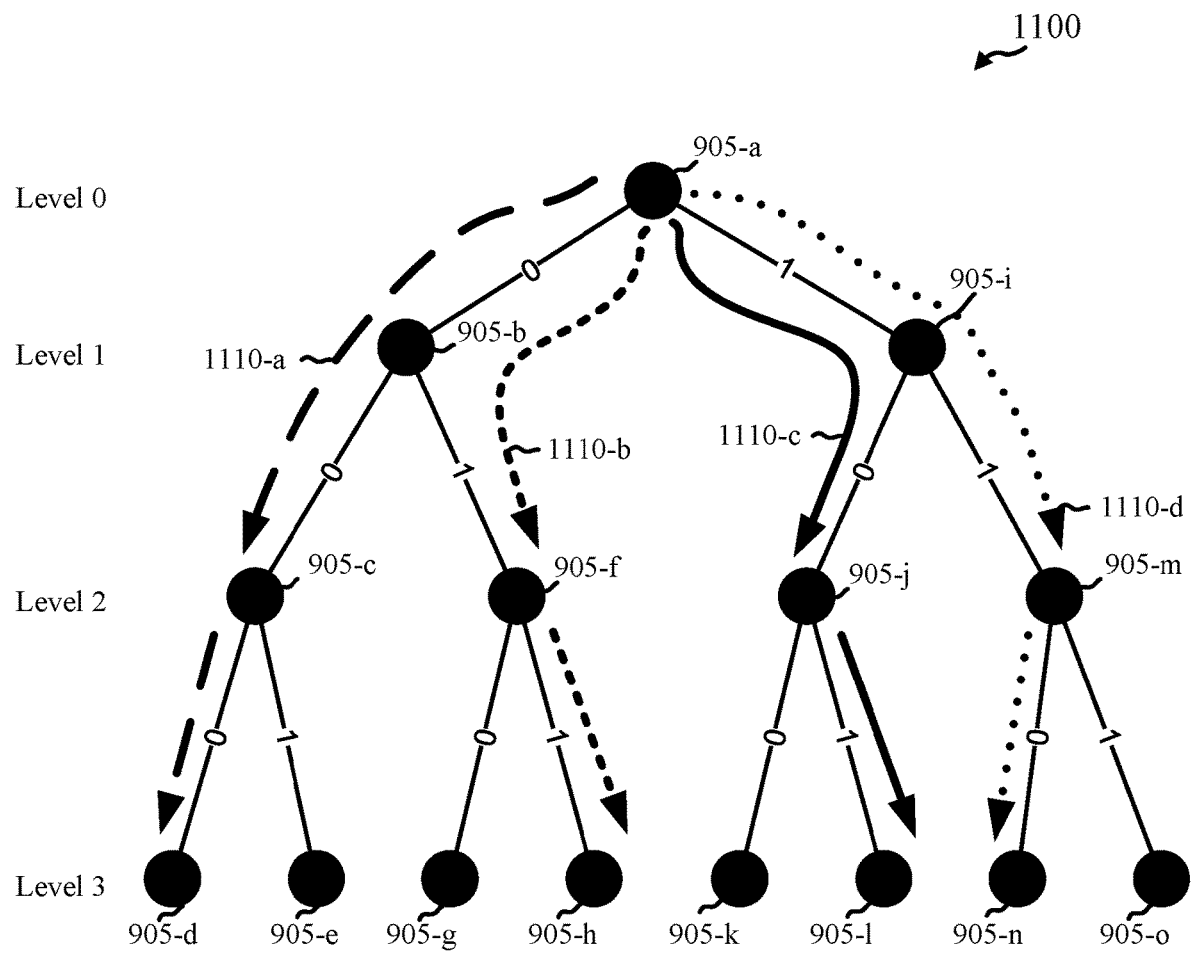
FIG. 11 illustrates an example of a code tree that supports dynamic frozen bits of polar codes for early termination and performance improvement in accordance with aspects of the present disclosure.

FIG. 11 illustrates an example of a code tree 1100 depicting candidate paths that pass a parity check that supports dynamic frozen bits of polar codes for early termination and performance improvement in accordance with various aspects of the present disclosure. Continuing the example of FIG. 10, the value of the dynamic frozen bit may be determined as the exclusive-or of the first and second bits. As depicted, the parity checker 710 selects candidate paths 1110-a, 1110-b, 1110-c, and 1110-d as the second subset of the extended candidate paths because the value of the third bit of each candidate path the same as the value of the exclusive-or of the two preceding bits. It is noted that the candidate paths 1110 in the second subset of the extended candidate paths of may be different for some nodes of the code tree than the candidate paths 1010 in the first subset of the extended candidate paths as is shown in FIGS. 10 and 11. For other nodes of the code tree, the candidate paths 1110 in the second subset of the extended candidate paths may be the same as the candidate paths 1010 in the first subset of the extended candidate paths (e.g., the L best paths may all pass the parity check at a given node of the code tree).

Referring again to FIG. 8, at block 840, the list decoder 705 may determine a path metric for each extended candidate path in the second subset of the extended set of the candidate paths. For example, the parity checker 710 may instruct the list decoder 705 to determine a path metric for each of candidate paths 1110-a, 1110-b, 1110-c, and 1110-d in the second subset of extended candidate paths similar to the description provided above in FIG. 9. The list decoder 705 may ignore other possible paths through the code tree 1100 and continue the list decoding process. Additionally or alternatively, the list decoder 705 may add a penalty to a path metric for any of the candidate paths where a calculated value of the dynamic frozen bit differs from a determined decision value (e.g., hard decision value) of the dynamic frozen bit.

At block 845, the list decoder 705 may determine whether there are any additional dynamic frozen bits expected in the decoding order. In an example with reference to FIG. 5, the list decoder 705 may be aware of which bits are placed in which sub-channels, may currently be at the location of the dynamic frozen bit sub-channel 405-a within the decoding order, and may determine that at least one additional dynamic frozen bit sub-channel (e.g., 405-b) occurs later in the decoding order. If yes, the flow diagram 800 may proceed to block 850 and the list decoder 705 may determine when the next dynamic frozen bit is reached in the decoding order. When reached, the flow diagram 800 may return to block 810 and perform the subsequent blocks as described above. In some cases, in the second and subsequent passes through block 815, the list decoder 705 may generate the extended set of candidate paths by extending the candidate paths of the second subset of the prior set of extended candidate paths selected at the prior instance of block 835. If there are no additional dynamic frozen bits in the decoding order, the flow diagram 800 may proceed to block 855 and may end dynamic frozen bit processing.

Reaching block 855 in the flow diagram may indicate that the list decoding algorithm was not terminated early, and that up to a list size L of candidate paths are available for performing error detection on corresponding bit sequences. With reference to FIG. 7, once the end of the decoding order has been reached, the list decoder 705 may determine a list size L of candidate paths. The list decoder 705 may extract a bit sequence of k+m+c bits from each of the candidate paths (e.g., k information bits, m error detection EDC bits, c FAR EDC bits). The list decoder 705 may be aware of the locations of the dynamic frozen bits and the frozen bits within each of the candidate paths and may not include the values of the dynamic frozen bits and the frozen bits in the extracted bit sequences. The list decoder 705 may output each bit sequence to the error detector 715 (directly or via parity checker 710). The list decoder 705 also may output an order in which to check the bit sequences based on a path metric of corresponding candidate paths, such that a bit sequence corresponding to the best path metric is checked first, followed by a bit sequence corresponding to the next best path metric is checked second, and so forth until a bit sequence corresponding to the worst path metric of the L candidate paths is checked last.

The error detector 715 may perform an error detecting algorithm for determining whether any of the bit sequences passes EDC (e.g., a CRC algorithm). As described above, the polar-encoded codeword may be generated by polar encoding a payload 600 that includes an information vector and an EDC. If the bit sequence obtained from a particular candidate path is the same as the bit sequence of the information vector and the EDC, the error detector 715 should be able to parse the bit sequence corresponding to the particular candidate path to recover the information vector and the received EDC. The error detector 715 may then generate a calculated EDC using the parsed information vector by applying the same algorithm to the parsed information vector as applied by the EDC encoder 210. If the calculated EDC is the same as the received EDC, the error detector 715 determines that it was able to successfully able to decode the polar-encoded codeword and outputs the bit sequence of the information vector, with or without the EDC. If not the same, the error detector 715 indicates a decoding failure for that bit sequence. The error detector 715 checks a bit sequence associated with a next highest path metric to see if that bit sequence passes error detection. The error detector 715 thus proceeds from bit sequence to bit sequence until one of the bit sequences passes or all fail. If all paths have been checked, the error detector 715 indicates a decoding failure.

Advantageously, the examples described herein use a defined number dynamic frozen bits to simultaneously support early termination and performance improvement. A size of a single EDC may be selected to beneficially support both detection and decoding with CA-SCL that reduces EDC overhead. In some instances, the benefits described herein may be achieved using a selected number j of dynamic frozen bits (e.g., j=8) to provide a target detection rate. That is, the number j of dynamic frozen bits may provide a target detection rate (which may be an enhancement to a detection rate without the dynamic frozen bits) when path selection is aided using the dynamic frozen bits as described with reference to FIG. 8. The sub-channels of a polar code allocated to the dynamic frozen bits may be the most reliable of the sub-channels allocated for transporting frozen bits. Further, the value of each dynamic frozen bit may be calculated using a Boolean operation (e.g., XOR operation) of a defined number d of information bits, CRC bits, or both (e.g., d=3) that precede a dynamic frozen bit in a decoding order.

Figure 12:
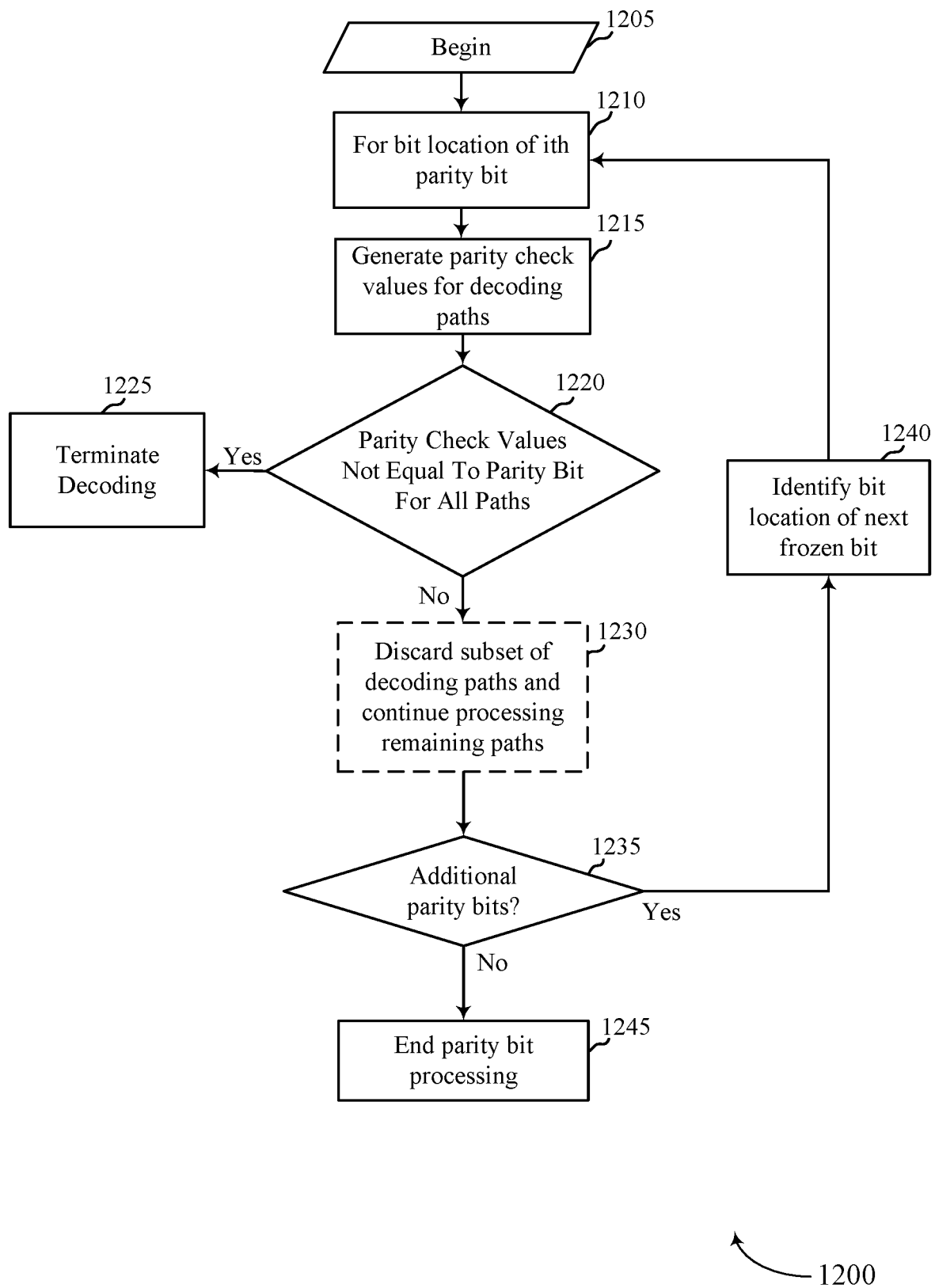
FIG. 12 illustrates an example of a flow diagram that supports dynamic frozen bits of polar codes for early termination and performance improvement in accordance with aspects of the present disclosure.

FIG. 12 illustrates another example of a flow diagram 1200 that supports parity bits of a polar code for early termination in accordance with various aspects of the present disclosure. The flow diagram 1200 describes operations for performing parity checking as part of a decoding process to determine whether to terminate a decoding process early. The flow diagram 1200 may begin at 1205 and proceed to block 1210. At 1210, the list decoder 705 of decoder 245-a may perform a list decoding algorithm on a received codeword encoded using a polar code, identify L candidate paths at a particular level in a code tree, and determine that a bit location at a next level of the code tree corresponds to a parity bit. The list decoder 705 may be, for example, an SCL decoder, a CA-SCL decoder, or the like.

At 1215, the list decoder 705 may generate a parity check value for the parity bit of candidate paths through a code tree by extending L candidate paths to include an additional bit. The list decoder 705 may process de-mapped symbols output by the demodulator 240 and determine the probability (e.g., LLR value) of whether bits corresponding to the de-mapped symbols are '0s' or '1s'. The determination of the probability of whether a particular bit value is a '0' or a '1' may also be a function of prior decoding decisions. To generate an extended set of candidate paths through a code tree, the list decoder 705 may extend L candidate paths from one level to the next to identify 2L possible candidate paths, then select the L candidate paths having the highest path metrics (e.g., including the bit metrics for the parity bit location).

At 1220, the parity checker 710 may determine whether the parity bit for all paths equals the parity check value. In an example, the parity checker 710 may perform a parity check of the decoding paths for making a decision on early termination of decoding of the codeword based on the parity bits used to generate the codeword. The parity checker 710 may calculate the parity check value based on preceding information bits, CRC bits, or both, along a candidate path for comparison with the determined parity bit. For example, the parity checker 710 may perform a Boolean operation (e.g., XOR, XNOR, etc.) on values of a defined number of information bits, CRC bits, or both, as described with reference to FIG. 5, along an extended candidate path to calculate a parity check value and compare the calculated value with the parity bit.

In an example, a candidate path may correspond to a bit sequence of [0, 0, 0], where the first bit is an information bit, the second bit is an CRC bit, and the third bit is a parity bit. In this example, the parity check value may be determined as an XOR of the first and second bits. The parity checker 710 may compare the calculated parity check value to the parity bit value along the candidate path. In this example, the parity checker 710 may calculate the XOR of the first two bits which results in a value of '0.' The parity checker 710 may determine that the calculated value matches the parity bit value, and hence the candidate path passes the parity check. If, however, the calculated parity check value does not match the parity bit value, the parity checker 710 may determine that the candidate path has failed a parity check. If all of the L candidate paths fail the parity check, the parity checker 710 may declare a decoding error and may terminate decoding at block 1225. Early termination of decoding may save power. If the calculated parity check value matches the parity bit value for at least one of the extended candidate paths, the flow diagram 1200 may proceed to block 1230. In some examples, each candidate path passing the parity check at 1220 may be marked, and the marking may be inherited by any child paths of the passing candidate path. In this way, it can be determined at any subsequent information bit location whether there are any remaining paths that passed the parity check, such that early termination can be performed based on a result of the parity check at subsequent information bit locations if there are no remaining candidate paths that passed the parity check.

At 1230, the parity checker 710 may discard a subset of decoding paths and continue processing remaining paths. For example, the parity checker 710 may discard any path where the parity bit value does not equal the parity check value. The parity checker 710 may further process the remaining paths where the parity bit value equals the parity check value. However, the parity checker 710 may skip operation 1230 and continue processing all paths because discarding paths failing the parity check may increase the false alarm rate.

At 1235, the list decoder 705 may determine whether there are any additional parity bits in the polar code. As described with reference to FIG. 5, the list decoder 705 may be aware of which bits are placed in which sub-channels, may currently be at the location of the parity check bit $p_1$ at sub-channel 405-$a$ within the decoding order, and may determine that at least one additional parity check bit at a sub-channel (e.g., $p_2$ at 405-$b$) occurs later in the decoding order. If yes, the flow diagram 1200 may proceed to 1240 and the list decoder 705 may determine when the next parity check bit is reached in the decoding order. When reached, the flow diagram 1200 may return to 1210 and perform the subsequent blocks as described above. In some cases, in subsequent passes through 1215, the list decoder 705 may generate the parity check values for the set of decoding paths that remain (e.g., determined at the prior instance of 1230). If there are no additional parity check bits in the decoding order, the flow diagram 1200 may proceed to 1245 and may end the parity checking process.

In some examples, the decoder may reach block 1245 of the flow diagram which may indicate that the list decoding algorithm was not terminated early, and that up to a list size L of candidate paths are available for performing error detection on corresponding bit sequences. Once the end of the decoding order has been reached, the list decoder 705 may determine a list size L of candidate paths. The list decoder 705 may be aware of the locations of the parity bits and the frozen bits within each of the candidate paths and may not include the values of the parity bits and the frozen bits in the extracted bit sequences. The list decoder 705 may output each bit sequence to an error detector (directly or via parity checker 710). The list decoder 705 may also output an order in which to check the bit sequences based on a path metric of corresponding candidate paths, such that a bit sequence corresponding to the best path metric is checked first, followed by a bit sequence corresponding to the next best path metric, and so forth until a bit sequence corresponding to the worst path metric of the L candidate paths is checked.

Figure 13:
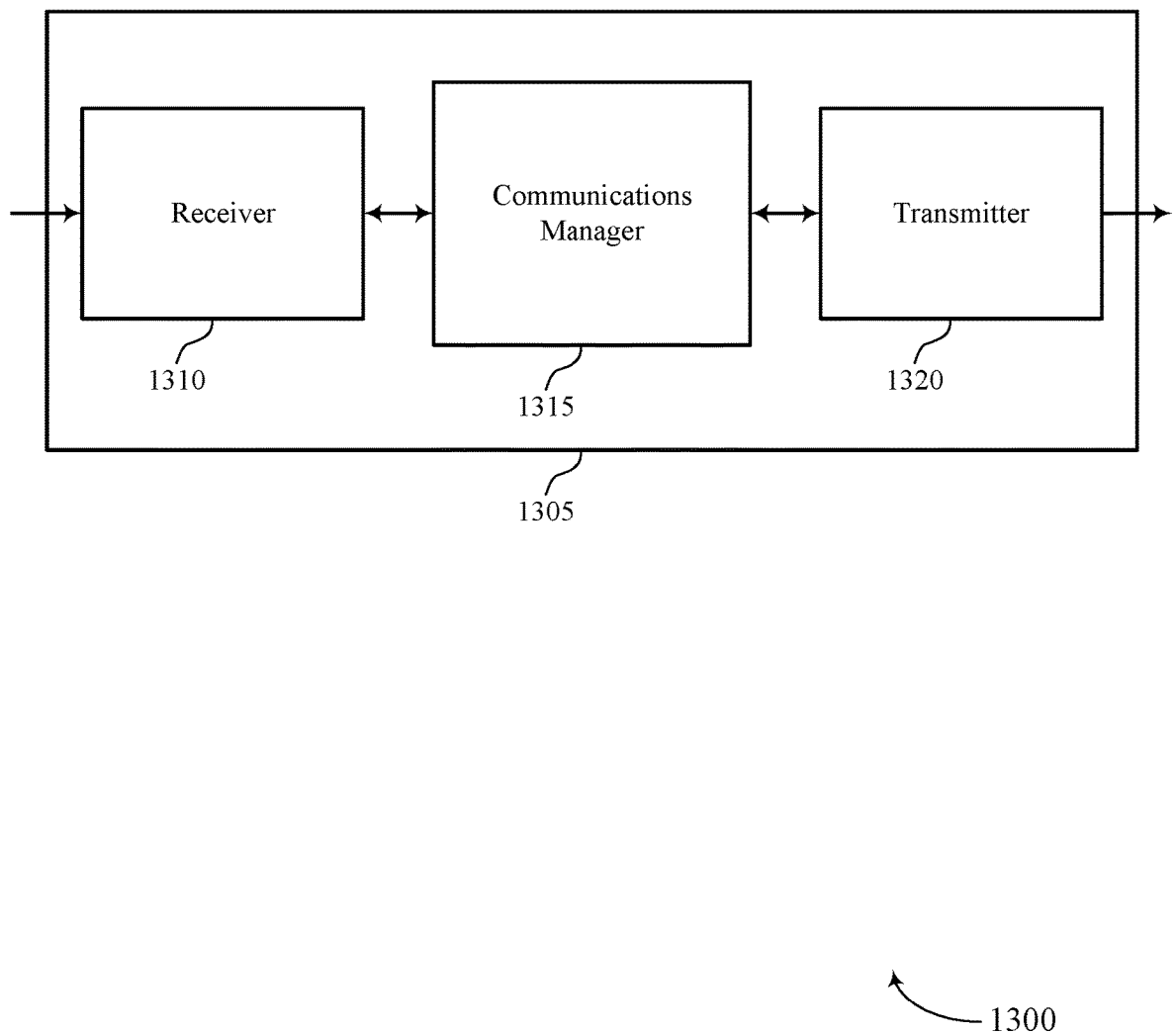
FIGS. 13 through 15 show block diagrams of a device that supports dynamic frozen bits of polar codes for early termination and performance improvement in accordance with aspects of the present disclosure.

FIG. 13 shows a block diagram 1300 of a wireless device 1305 that supports dynamic frozen bits of polar codes for early termination and performance improvement in accordance with aspects of the present disclosure. Wireless device 1305 may be an example of aspects of a UE 115 or base station 105 as described herein. Wireless device 1305 may include receiver 1310, communications manager 1315, and transmitter 1320. Wireless device 1305 may also include a processor. Each of these components may be in communication with one another (e.g., via one or more buses).

Receiver 1310 may receive information such as packets, user data, or control information associated with various information channels (e.g., control channels, data channels, and information related to dynamic frozen bits of polar codes for early termination and performance improvement, etc.). Information may be passed on to other components of the device. The receiver 1310 may be an example of aspects of the transceiver 1635 described with reference to FIG. 16. The receiver 1310 may utilize a single antenna or a set of antennas.

Receiver 1310 may monitor a signal for a codeword candidate corresponding to a codeword encoded using a polar code, the codeword generated based on a set of information bits and a set of parity bits, where the set of information bits and the set of parity bits are allocated to sub-channels of the polar code based on a reliability of each of the sub-channels. In some cases, a number of the set of parity bits is based on enabling early termination during parity-directed SCL decoding. In some cases, a number of the set of parity bits is three (3).

Communications manager 1315 may be an example of aspects of the communications manager 1615 described with reference to FIG. 16. Communications manager 1315 and/or at least some of its various sub-components may be implemented in hardware, software executed by a processor, firmware, or any combination thereof. If implemented in software executed by a processor, the functions of the communications manager 1315 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The communications manager 1315 and/or at least some of its various sub-components may be physically located at various positions, including being distributed such that portions of functions are implemented at different physical locations by one or more physical devices. In some examples, communications manager 1315 and/or at least some of its various sub-components may be a separate and distinct component in accordance with various aspects of the present disclosure. In other examples, communications manager 1315 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 1315 may identify a dynamic frozen bit within a code tree during decoding of a codeword encoded using a polar code, extend a set of candidate paths through the code tree for the identified dynamic frozen bit to obtain a first extended set of candidate paths, select a first subset of the first extended set of candidate paths according to a first path selection criterion, determine that at least one candidate path in the first subset passes a parity check based on the dynamic frozen bit, and determine respective path metrics for each candidate path in a second subset of the first extended set of candidate paths, the second subset of the extended set of candidate paths selected according to a second path selection criterion.

The communications manager 1315 may also receive a signal including a codeword encoded using a polar code, the codeword generated based at least in part on a plurality of dynamic frozen bits, a plurality of information bits, and a plurality of error detection bits for joint detection and decoding of the codeword. The communications manager 1315 may perform decoding of the codeword including at least: a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics. In some cases, performing decoding of the codeword including at least the parity check of the first subset of decoding paths includes calculating a parity check value based at least in part on a plurality of bits of a first decoding path of the first subset of decoding paths occurring prior to a first dynamic frozen bit of the plurality of plurality of dynamic frozen bits along the first decoding path, and comparing the parity check value to a value of the first dynamic frozen bit. In some cases, performing decoding of the codeword including at least generating path metrics for the second subset of the decoding paths includes adding a path metric penalty to a first decoding path in the second subset of the decoding paths based at least in part on determining that a calculated value of a first dynamic frozen bit of the plurality of dynamic frozen bits differs from a determined decision value of the dynamic frozen bit. The communications manager 1315 may process the information bits based at least in part on a result of the decoding.

In some cases, the communications manager 1315 may extend the decoding paths to obtain extended decoding paths and select a subset of the extended decoding paths according to a first path selection criterion. In some cases, the path selection criterion is based on path metrics of the extended decoding paths. In some cases, the communications manager 1315 may determine that all decoding paths in the subset of the extended decoding paths fail the parity check and terminating decoding of the codeword. In some cases, the communications manager 1315 may determine that at least one decoding path in the subset of the extended decoding paths passes the parity check and generate path metrics for the subset of the extended set of decoding paths. In some cases, the communications manager 1315 may calculate a first error detection code based at least in part on the bit sequence, identifying a second error detection code based at least in part on the bit sequence, and compare the first error detection code to the second error detection code. In some cases, the communications manager 1315 may determine that the bit sequence passes error detection based at least in part on the comparison, and output the bit sequence. In some cases, the communications manager 1315 may determine that the bit sequence has failed error detection based at least in part on the comparison, and output an error based at least in part on the failure. In some cases, the communications manager 1315 may determine that the first decoding path passes the parity check based at least in part on the comparison.

The communications manager 1315 may also allocate sub-channels of a polar code to a set of information bits, a set of error detection bits, and a set of dynamic frozen bits based on a reliability of each of the sub-channels, where a number of the set of error detection bits is based on a defined false alarm rate, and where each of the set of dynamic frozen bits includes a parity check value, and where a number of the set of dynamic frozen bits is based on a target detection rate during parity-directed successive cancellation list (SCL) decoding, generate the set of dynamic frozen bits based on a decoding order of the sub-channels, generate a codeword encoded using the polar code based on loading the set of information bits, the set of error detection bits, and the set of dynamic frozen bits into the allocated sub-channels, and transmit the codeword.

The communications manager 1315 may also allocate sub-channels of a polar code to a set of information bits and a set of parity bits based on a reliability of each of the sub-channels, generate each parity bit of the set of parity bits by applying a Boolean operation to one or more subsets of the set of information bits, the one or more subsets of the set of information bits determined according to a decoding order of the sub-channels, and generate a codeword encoded using the polar code based on loading the set of information bits and the set of parity bits into the allocated sub-channels.

The communications manager 1315 may also perform decoding of the codeword candidate including at least: calculating a parity check value for a parity bit of the set of parity bits for each of a set of decoding paths by applying a Boolean operation to one or more subsets of the set of information bits for the each of the set of decoding paths, the one or more subsets of the set of information bits determined according to a decoding order of the sub-channels, and parity checking the set of decoding paths for determining whether to terminate decoding of the codeword candidate based on the parity check values and the set of parity bits. The communications manager 1315 may then process the information bits based on a result of the decoding.

Transmitter 1320 may transmit signals generated by other components of the device. In some examples, the transmitter 1320 may be collocated with a receiver 1310 in a transceiver module. For example, the transmitter 1320 may be an example of aspects of the transceiver 1635 described with reference to FIG. 16. The transmitter 1320 may utilize a single antenna or a set of antennas.

Figure 14:
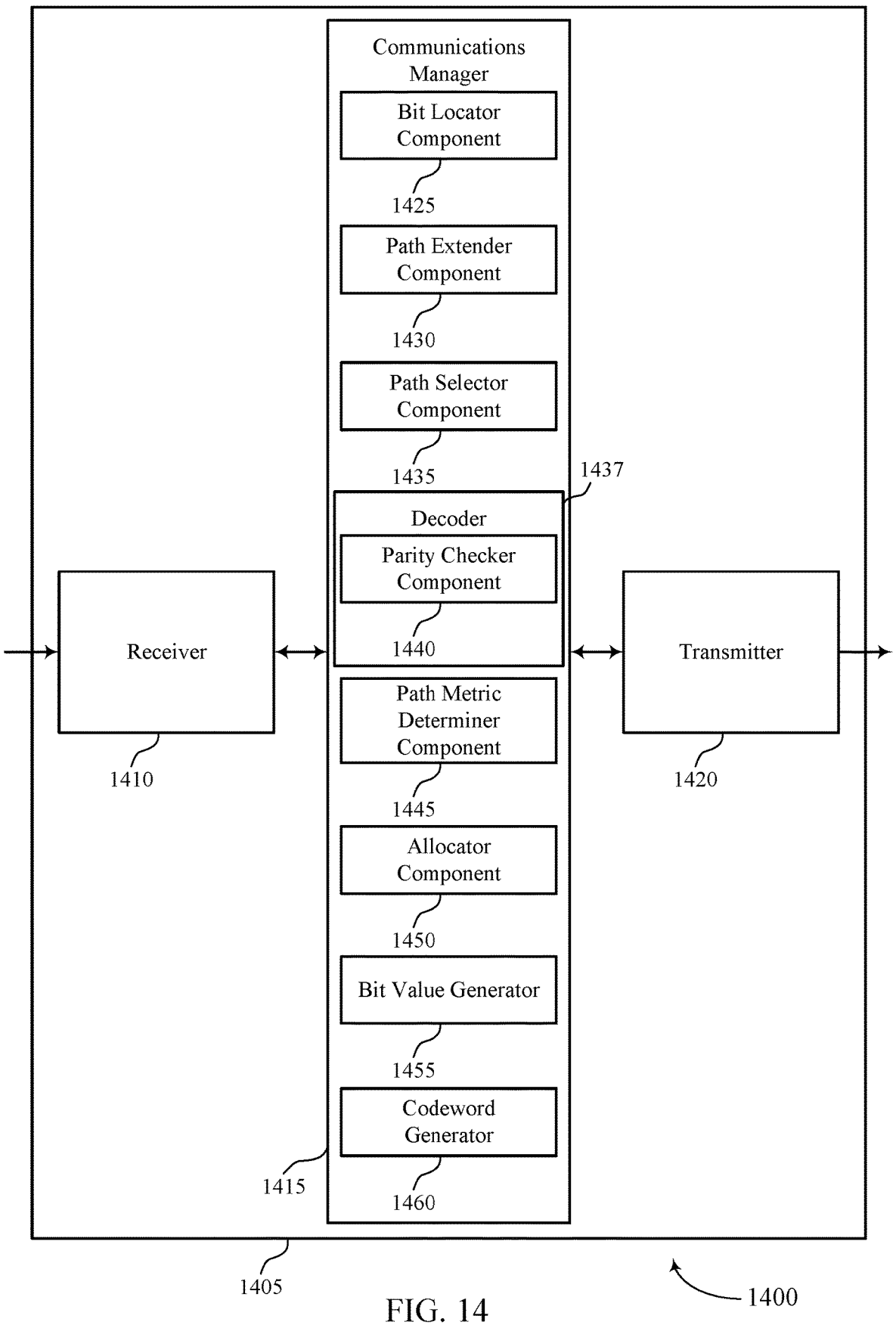

FIG. 14 shows a block diagram 1400 of a wireless device 1405 that supports dynamic frozen bits of polar codes for early termination and performance improvement in accordance with aspects of the present disclosure. Wireless device 1405 may be an example of aspects of a wireless device 1305 or a UE 115 or base station 105 as described with reference to FIG. 13. Wireless device 1405 may include receiver 1410, communications manager 1415, and transmitter 1420. Wireless device 1405 may also include a processor. Each of these components may be in communication with one another (e.g., via one or more buses).

Receiver 1410 may receive signal that includes a polar-encoded codeword. Receiver 1410 may include components such as amplifiers, filters, downconverters, analog-to-digital converters, and the like, for receiving waveforms via one or more antennas. The receiver 1410 may be an example of aspects of the transceiver 1635 described with reference to FIG. 16. The receiver 1410 may utilize a single antenna or a set of antennas.

Communications manager 1415 may be an example of aspects of the communications manager 1615 described with reference to FIG. 16. Communications manager 1415 may also include bit locator component 1425, path extender component 1430, path selector component 1435, parity checker component 1440, path metric determiner component 1445, allocator component 1450, bit value generator 1455, and codeword generator 1460. In some examples, the list decoder 705 may include one or more of the bit locator component 1425, the path extender component 1430, the path selector component 1435, and the path metric determiner component 1445. In some examples, the parity checker 710 may include the parity checker component 1440. In some examples, the polar encoder 220 may include the allocator component 1450 and the codeword generator 1460. In some examples, the dynamic frozen bit generator 215 may include the bit value generator 1455.

Bit locator component 1425 may identify a dynamic frozen bit within a code tree during decoding of a codeword encoded using a polar code and identify a second dynamic frozen bit within the code tree.

Path extender component 1430 may extend a set of candidate paths through the code tree for the identified dynamic frozen bit to obtain a first extended set of candidate paths and extend a second set of candidate paths through the code tree for the identified second dynamic frozen bit to obtain a second extended set of candidate paths.

Path selector component 1435 may select a first subset of the first extended set of candidate paths according to a first path selection criterion and select a first subset of the second extended set of candidate paths according to the first path selection criterion. In some cases, the first path selection criterion is based on path metrics of the candidate paths of the first extended set of candidate paths.

Decoder 1437 may perform a decoding process for the codeword candidate. Decoder 1437 may include a parity checker component 1440, and the decoding process may include functions performed by the parity checker component 1440. In some cases, parity checker component 1440 may calculate a parity check value for a parity bit of the set of parity bits for each of a set of decoding paths by applying a Boolean operation to one or more subsets of the set of information bits for the each of the set of decoding paths, the one or more subsets of the set of information bits determined according to a decoding order of the sub-channels. Parity checker component 1440 may also parity check the set of decoding paths for determining whether to terminate decoding of the codeword candidate based on the parity check values and the set of parity bits. In some cases, parity checker component 1440 may compare the parity check value to a value of the respective parity bit, and compare the parity check value to the parity bit.

In some cases, calculating the parity check value for the parity bit for each of the set of decoding paths includes calculating the parity check value based on applying the Boolean operation to each subset of the set of information bits of the each of the set of decoding paths prior to a sub-channel corresponding to the parity bit according to the decoding order. In some cases, calculating the parity check value for the parity bit for each of the set of decoding paths includes calculating the parity check value based on applying the Boolean operation to a subset of the set of information bits of the each of the set of decoding paths prior to a first sub-channel corresponding to the parity bit and subsequent to a second sub-channel corresponding to a previous parity bit according to the decoding order.

Parity checker component 1440 may determine that at least one candidate path in the first subset passes a parity check based on the dynamic frozen bit, determine that all candidate paths in the first subset of the second extended set of candidate paths fail a parity check, terminate decoding of the codeword, determine that at least one candidate path in the first subset of the second extended set of candidate paths passes a parity check, compare the parity check value to a value of the dynamic frozen bit, and determine that the at least one candidate path passes the parity check based on the comparison. In some cases, determining that the at least one candidate path in the first subset passes a parity check includes: calculating a parity check value based on a set of bits of the at least one candidate path occurring prior to the dynamic frozen bit along the at least one candidate path.

Path metric determiner component 1445 may determine respective path metrics for each candidate path in a second subset of the first extended set of candidate paths, the second subset of the extended set of candidate paths selected according to a second path selection criterion. In some cases, the second path selection criterion is based on candidate paths of the first extended set of candidate paths passing the parity check based on the dynamic frozen bit. Path metric determiner component 1445 may determine a second path metric for each candidate path in a second subset of the second extended set of candidate paths, where the determined second path metrics are a function of the determined path metrics. In some cases, determining respective path metrics for the each candidate path in the second subset includes: adding a path metric penalty to a candidate path in the second subset based on determining that a calculated value of the dynamic frozen bit differs from a determined decision value of the dynamic frozen bit.

Allocator component 1450 may allocate sub-channels of a polar code to a set of information bits, a set of error detection bits, and a set of dynamic frozen bits based on a reliability of each of the sub-channels. In some cases, a number of the set of error detection bits is based on a defined false alarm rate. In some cases, each of the set of dynamic frozen bits includes a parity check value. In some cases, a number of the set of dynamic frozen bits is based on a target detection rate during parity-directed successive cancellation list (SCL) decoding. Allocator component 1450 may allocate a first subset of sub-channels of the sub-channel subset of the polar code to the dynamic frozen bits having a higher reliability than a second subset of sub-channels of the sub-channel subset. In some cases, allocating the sub-channels of the polar code further includes: identifying a subset of the sub-channels for frozen bits.

Allocator component 1450 may allocate sub-channels of a polar code to a set of information bits and a set of parity bits based on a reliability of each of the sub-channels and allocate sub-channels of the polar code to a set of frozen bits, where the set of information bits and the set of parity bits are allocated to sub-channels having higher reliabilities than sub-channels allocated to a subset of the set of frozen bits subsequent to a first information bit in the decoding order. In some cases, a number of the set of parity bits is based on enabling early termination during parity-directed SCL decoding. In some cases, a number of the set of parity bits is three (3). In some cases, allocating the sub-channels of the polar code further includes identifying a first subset of the sub-channels for the set of information bits and a second subset of the sub-channels for the set of parity bits, where the set of information bits are allocated to sub-channels having higher reliabilities than sub-channels allocated to the set of parity bits.

Bit value generator 1455 may generate the set of dynamic frozen bits based on a decoding order of the sub-channels. In some cases, generating the set of dynamic frozen bits includes: applying a Boolean operation to subsets of the set of information bits to respectively generate values for the set of dynamic frozen bits. Bit value generator 1455 may generate each parity bit of the set of parity bits by applying a Boolean operation to one or more subsets of the set of information bits, the one or more subsets of the set of information bits determined according to a decoding order of the sub-channels. In some cases, for the each parity bit, applying the Boolean operation to the one or more subsets of the set of information bits includes applying the Boolean operation to each subset of the set of information bits prior to a sub-channel corresponding to the each parity bit according to the decoding order. In some cases, for the each parity bit, applying the Boolean operation to the one or more subsets of the set of information bits includes applying the Boolean operation to a subset of the set of information bits prior to a first sub-channel corresponding to the each parity bit and subsequent to a second sub-channel corresponding to a previous parity bit according to the decoding order.

Codeword generator 1460 may generate a codeword encoded using the polar code based on loading the set of information bits, the set of error detection bits, the set of parity bits, and the set of dynamic frozen bits into the allocated sub-channels and transmit the codeword.

Transmitter 1420 may transmit signals generated by other components of the device. In some examples, the transmitter 1420 may be collocated with a receiver 1410 in a transceiver module. For example, the transmitter 1420 may be an example of aspects of the transceiver 1635 described with reference to FIG. 16. The transmitter 1420 may utilize a single antenna or a set of antennas.

Figure 15:
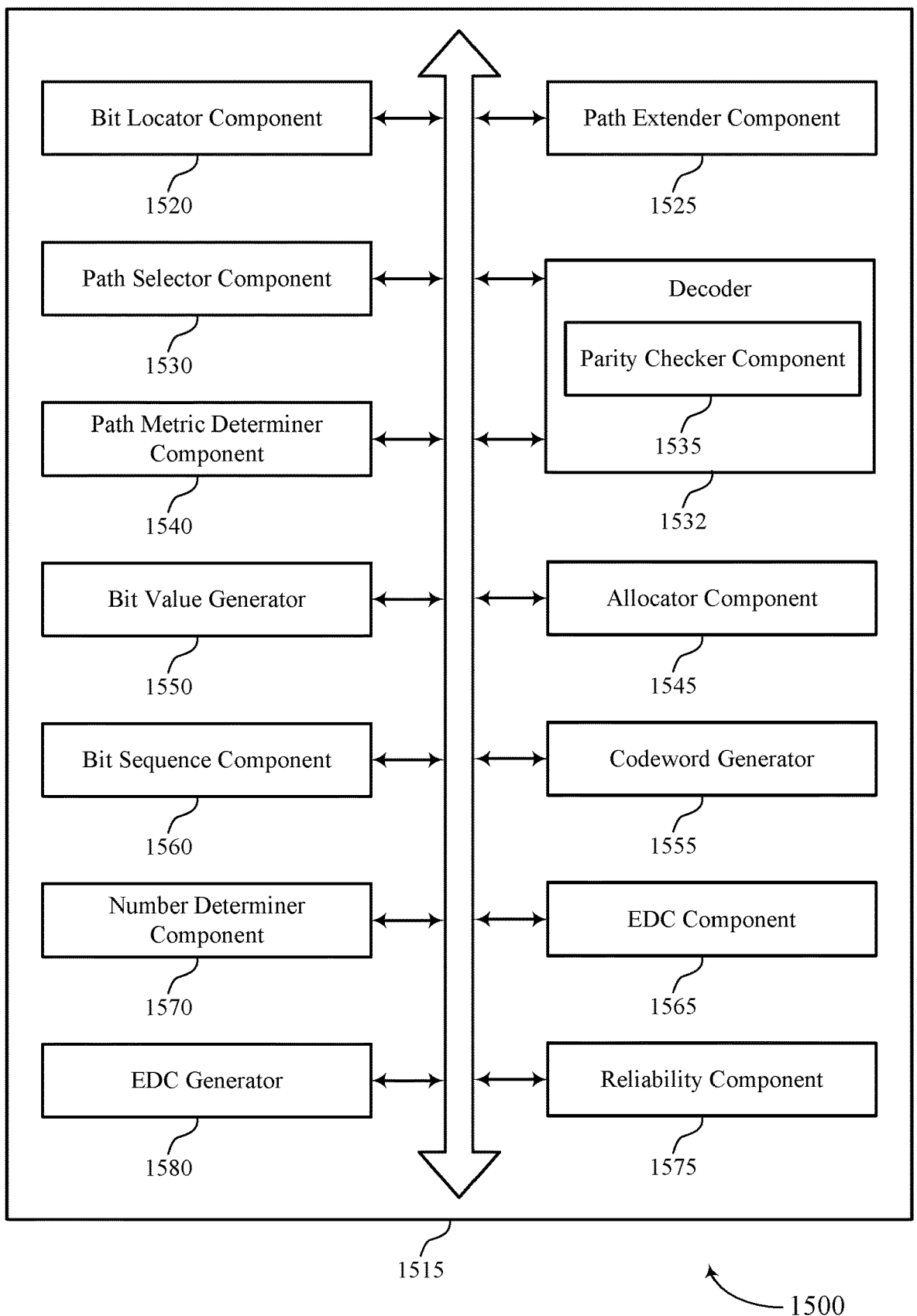

FIG. 15 shows a block diagram 1500 of a communications manager 1515 that supports dynamic frozen bits of polar codes for early termination and performance improvement in accordance with aspects of the present disclosure. The communications manager 1515 may be an example of aspects of a communications manager 1315, a communications manager 1415, or a communications manager 1615 described with reference to FIGS. 13, 14, and 16. The communications manager 1515 may include bit locator component 1520, path extender component 1525, path selector component 1530, parity checker component 1535, path metric determiner component 1540, allocator component 1545, bit value generator 1550, codeword generator 1555, bit sequence component 1560, EDC component 1565, number determiner component 1570, reliability component 1575, and EDC generator 1580. Each of these modules may communicate, directly or indirectly, with one another (e.g., via one or more buses).

In some examples, the list decoder 705 may include one or more of bit locator component 1520, path extender component 1525, path selector component 1530, the path metric determiner component 1540, the bit sequence component 1560, and the number determiner component 1570. In some examples, the parity checker 710 may include the parity checker component 1535. In some examples, the polar encoder 220 may include the allocator component 1545, the codeword generator 1555, and the reliability component 1575. In some examples, the dynamic frozen bit generator 215 may include the bit value generator 1550. In some examples, the EDC encoder 210 may include the EDC component 1565 and the EDC generator 1580.

Bit locator component 1520 may identify a dynamic frozen bit within a code tree during decoding of a codeword encoded using a polar code and identify a second dynamic frozen bit within the code tree.

Path extender component 1525 may extend a set of candidate paths through the code tree for the identified dynamic frozen bit to obtain a first extended set of candidate paths and extend a second set of candidate paths through the code tree for the identified second dynamic frozen bit to obtain a second extended set of candidate paths.

Path extender component 1525 may extend the decoding paths for a sub-channel corresponding to the parity bit to obtain extended decoding paths. Path selector component 1530 may then select a subset of the extended decoding paths according to a path selection criteria. In some cases, path extender component 1525 may determine that all decoding paths in the subset of the extended decoding paths fail the comparing, and may terminate decoding of the codeword candidate. In other cases, path extender component 1525 may determine that at least one decoding path in the subset of the extended decoding paths passes the parity check, and decoder 1532 may continue decoding of the codeword candidate.

Path selector component 1530 may select a first subset of the first extended set of candidate paths according to a first path selection criterion and select a first subset of the second extended set of candidate paths according to the first path selection criterion. In some cases, the first path selection criterion is based on path metrics of the candidate paths of the first extended set of candidate paths.

Decoder 1532 may perform a decoding process for the codeword candidate. Decoder 1532 may include a parity checker component 1535, and the decoding process may include functions performed by the parity checker component 1535. In some cases, parity checker component 1535 may calculate a parity check value for a parity bit of the set of parity bits for each of a set of decoding paths by applying a Boolean operation to one or more subsets of the set of information bits for the each of the set of decoding paths, the one or more subsets of the set of information bits determined according to a decoding order of the sub-channels. Parity checker component 1535 may also parity check the set of decoding paths for determining whether to terminate decoding of the codeword candidate based on the parity check values and the set of parity bits. In some cases, parity checker component 1535 may compare the parity check value to a value of the respective parity bit, and compare the parity check value to the parity bit.

Decoder 1532 may perform a decoding process for the codeword candidate. Decoder 1532 may include a parity checker component 1535, and the decoding process may include functions performed by the parity checker component 1535. In some cases, the parity checker component 1535 may calculate a parity check value for a parity bit of the set of parity bits for each of a set of decoding paths by applying a Boolean operation to one or more subsets of the set of information bits for the each of the set of decoding paths, the one or more subsets of the set of information bits determined according to a decoding order of the sub-channels. Parity checker component 1535 may also parity checking the set of decoding paths for determining whether to terminate decoding of the codeword candidate based on the parity check values and the set of parity bits.

In some cases, parity checker component 1535 may compare the parity check value to a value of the respective parity bit, and compare the parity check value to the parity bit. In some cases, calculating the parity check value for the parity bit for each of the set of decoding paths includes calculating the parity check value based on applying the Boolean operation to each subset of the set of information bits of the each of the set of decoding paths prior to a sub-channel corresponding to the parity bit according to the decoding order. In some cases, calculating the parity check value for the parity bit for each of the set of decoding paths includes calculating the parity check value based on applying the Boolean operation to a subset of the set of information bits of the each of the set of decoding paths prior to a first sub-channel corresponding to the parity bit and subsequent to a second sub-channel corresponding to a previous parity bit according to the decoding order.

Parity checker component 1535 may determine that at least one candidate path in the first subset passes a parity check based on the dynamic frozen bit. In some cases, parity checker component 1535 may determine that all candidate paths in the first subset of the second extended set of candidate paths fail a parity check and terminate decoding of the codeword. In some cases, parity checker component 1535 may determine that at least one candidate path in the first subset of the second extended set of candidate paths passes a parity check, compare the parity check value to a value of the dynamic frozen bit, and determine that the at least one candidate path passes the parity check based on the comparison. In some cases, determining that the at least one candidate path in the first subset passes a parity check includes: calculating a parity check value based on a set of bits of the at least one candidate path occurring prior to the dynamic frozen bit along the at least one candidate path.

Path metric determiner component 1540 may determine respective path metrics for each candidate path in a second subset of the first extended set of candidate paths, the second subset of the extended set of candidate paths selected according to a second path selection criterion. In some cases, the second path selection criterion is based on candidate paths of the first extended set of candidate paths passing the parity check based on the dynamic frozen bit. Path metric determiner component 1540 may determine a second path metric for each candidate path in a second subset of the second extended set of candidate paths, where the determined second path metrics are a function of the determined path metrics. In some cases, determining respective path metrics for the each candidate path in the second subset includes: adding a path metric penalty to a candidate path in the second subset based on determining that a calculated value of the dynamic frozen bit differs from a determined decision value of the dynamic frozen bit.

Allocator component 1545 may allocate sub-channels of a polar code to a set of information bits, a set of error detection bits, and a set of dynamic frozen bits based on a reliability of each of the sub-channels. In some cases, a number of the set of error detection bits is based on a defined false alarm rate. In some cases, each of the set of dynamic frozen bits includes a parity check value. In some cases, a number of the set of dynamic frozen bits is based on a target detection rate during parity-directed successive cancellation list (SCL) decoding. Allocator component 1545 may allocate a first subset of sub-channels of the sub-channel subset of the polar code to the dynamic frozen bits having a higher reliability than a second subset of sub-channels of the sub-channel subset. In some cases, allocating the sub-channels of the polar code further includes: identifying a subset of the sub-channels for frozen bits.

Allocator component 1545 may allocate sub-channels of a polar code to a set of information bits and a set of parity bits based on a reliability of each of the sub-channels and allocate sub-channels of the polar code to a set of frozen bits, where the set of information bits and the set of parity bits are allocated to sub-channels having higher reliabilities than sub-channels allocated to a subset of the set of frozen bits subsequent to a first information bit in the decoding order. In some cases, a number of the set of parity bits is based on enabling early termination during parity-directed SCL decoding. In some cases, a number of the set of parity bits is three (3). In some cases, allocating the sub-channels of the polar code further includes identifying a first subset of the sub-channels for the set of information bits and a second subset of the sub-channels for the set of parity bits, where the set of information bits are allocated to sub-channels having higher reliabilities than sub-channels allocated to the set of parity bits.

Bit value generator 1550 may generate the set of dynamic frozen bits based on a decoding order of the sub-channels. In some cases, generating the set of dynamic frozen bits includes: applying a Boolean operation to subsets of the set of information bits to respectively generate values for the set of dynamic frozen bits. Bit value generator 1550 may generate each parity bit of the set of parity bits by applying a Boolean operation to one or more subsets of the set of information bits, the one or more subsets of the set of information bits determined according to a decoding order of the sub-channels. In some cases, for the each parity bit, applying the Boolean operation to the one or more subsets of the set of information bits includes applying the Boolean operation to each subset of the set of information bits prior to a sub-channel corresponding to the each parity bit according to the decoding order. In some cases, for the each parity bit, applying the Boolean operation to the one or more subsets of the set of information bits includes applying the Boolean operation to a subset of the set of information bits prior to a first sub-channel corresponding to the each parity bit and subsequent to a second sub-channel corresponding to a previous parity bit according to the decoding order.

Codeword generator 1555 may generate a codeword encoded using the polar code based on loading the set of information bits, the set of error detection bits, the set of parity bits, and the set of dynamic frozen bits into the allocated sub-channels and transmit the codeword.

Bit sequence component 1560 may identify a bit sequence corresponding to a candidate path in the second subset of the extended set of candidate paths.

EDC component 1565 may calculate a first error detection code based on the bit sequence, identify a second error detection code based on the bit sequence, compare the first error detection code to the second error detection code, determine that the bit sequence passes error detection based on the comparison, and output the bit sequence. In some cases, EDC component 1565 may determine that the bit sequence has failed error detection based on the comparison, and output an error based on the failure.

Number determiner component 1570 may select a number of the set of dynamic frozen bits for enabling early termination during parity-directed successive cancellation list (SCL) decoding. In some cases, the number of the set of error detection bits is based on a defined detection rate.

Reliability component 1575 may allocate the set of information bits and the set of error detection bits to sub-channels having higher reliability than sub-channels allocated to the dynamic frozen bits.

EDC generator 1580 may apply an error detecting algorithm to the set of information bits to generate the set of error detection bits. In some cases, the error detecting algorithm is a cyclic redundancy check (CRC) algorithm.

Figure 16:
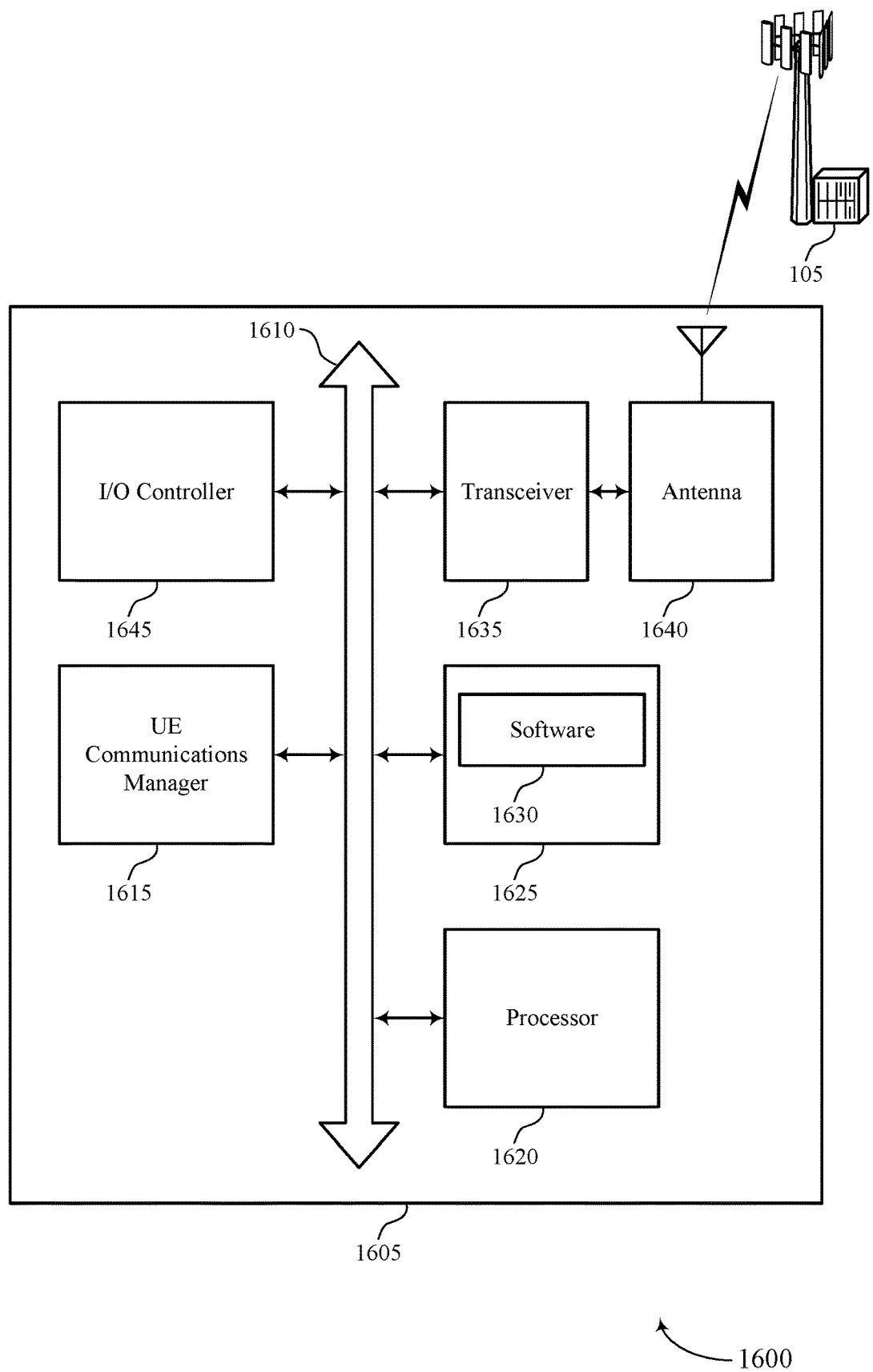
FIG. 16 illustrates a block diagram of a system including a UE that supports dynamic frozen bits of polar codes for early termination and performance improvement in accordance with aspects of the present disclosure.

FIG. 16 shows a diagram of a system 1600 including a device 1605 that supports dynamic frozen bits of polar codes for early termination and performance improvement in accordance with aspects of the present disclosure. Device 1605 may be an example of or include the components of wireless device 1305, wireless device 1405, or a UE 115 as described above, e.g., with reference to FIGS. 13 and 14. Device 1605 may include components for bi-directional voice and data communications including components for transmitting and receiving communications, including UE communications manager 1615, processor 1620, memory 1625, software 1630, transceiver 1635, antenna 1640, and I/O controller 1645. These components may be in electronic communication via one or more buses (e.g., bus 1610). Device 1605 may communicate wirelessly with one or more base stations 105.

Processor 1620 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1620 may be configured to operate a memory array using a memory controller. In other cases, a memory controller may be integrated into processor 1620. Processor 1620 may be configured to execute computer-readable instructions stored in a memory to perform various functions (e.g., functions or tasks supporting dynamic frozen bits of polar codes for early termination and performance improvement).

Memory 1625 may include random access memory (RAM) and read only memory (ROM). The memory 1625 may store computer-readable, computer-executable software 1630 including instructions that, when executed, cause the processor to perform various functions described herein. In some cases, the memory 1625 may contain, among other things, a basic input/output system (BIOS) which may control basic hardware and/or software operation such as the interaction with peripheral components or devices.

Software 1630 may include code to implement aspects of the present disclosure, including code to support dynamic frozen bits of polar codes for early termination and performance improvement. Software 1630 may be stored in a non-transitory computer-readable medium such as system memory or other memory. In some cases, the software 1630 may not be directly executable by the processor but may cause a computer (e.g., when compiled and executed) to perform functions described herein.

Transceiver 1635 may communicate bi-directionally, via one or more antennas, wired, or wireless links as described above. For example, the transceiver 1635 may represent a wireless transceiver and may communicate bi-directionally with another wireless transceiver. The transceiver 1635 may also include a modem to modulate the packets and provide the modulated packets to the antennas for transmission, and to demodulate packets received from the antennas.

In some cases, the wireless device may include a single antenna 1640. However, in some cases the device may have more than one antenna 1640, which may be capable of concurrently transmitting or receiving multiple wireless transmissions.

I/O controller 1645 may manage input and output signals for device 1605. I/O controller 1645 may also manage peripherals not integrated into device 1605. In some cases, I/O controller 1645 may represent a physical connection or port to an external peripheral. In some cases, I/O controller 1645 may utilize an operating system such as iOS®, ANDROID®, MS-DOS®, MS-WINDOWS®, OS/2®, UNIX®, LINUX®, or another known operating system. In other cases, I/O controller 1645 may represent or interact with a modem, a keyboard, a mouse, a touchscreen, or a similar device. In some cases, I/O controller 1645 may be implemented as part of a processor. In some cases, a user may interact with device 1605 via I/O controller 1645 or via hardware components controlled by I/O controller 1645.

Figure 17:
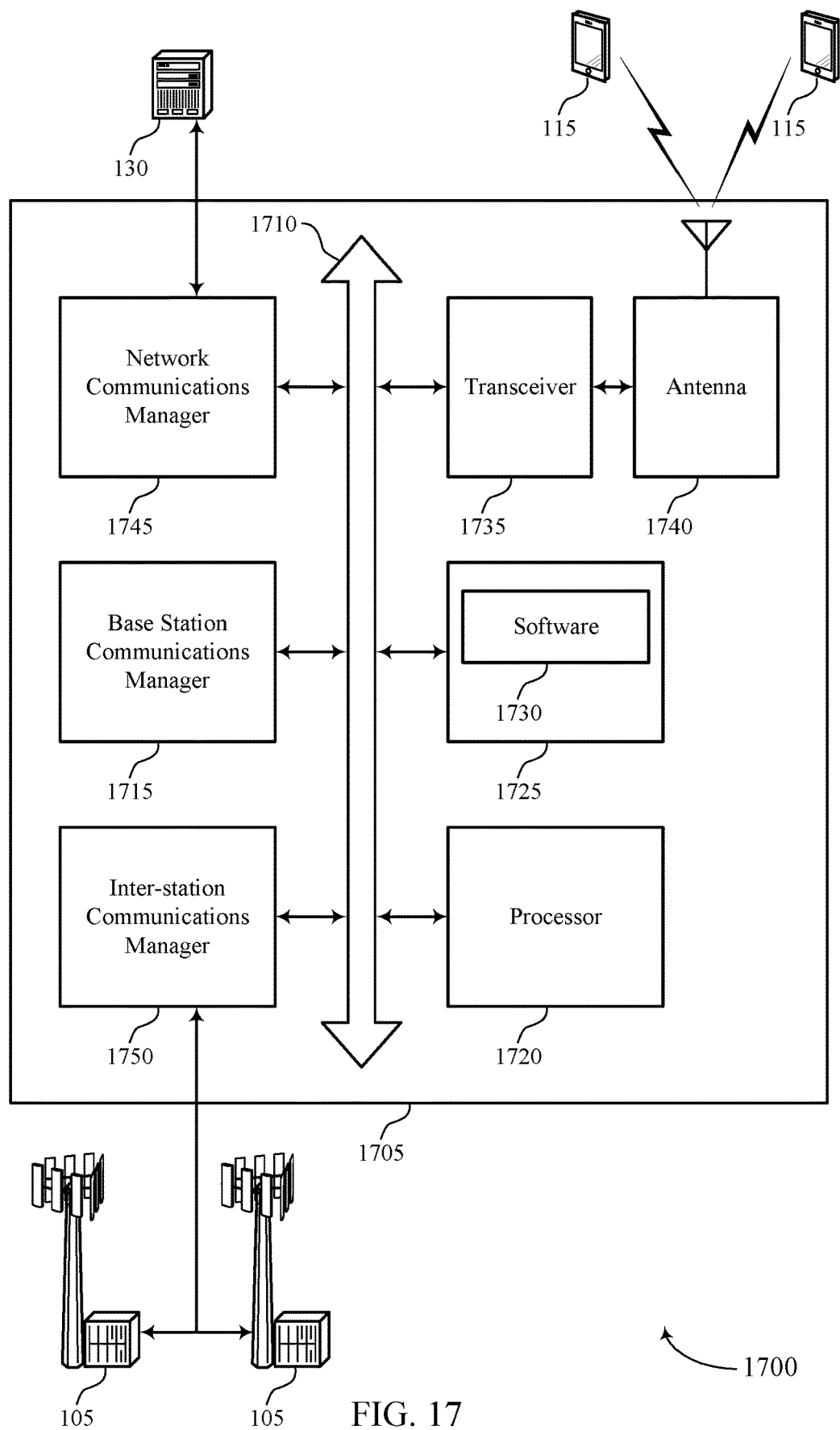
FIG. 17 illustrates a block diagram of a system including a base station that supports dynamic frozen bits of polar codes for early termination and performance improvement in accordance with aspects of the present disclosure.

FIG. 17 shows a diagram of a system 1700 including a device 1705 that supports dynamic frozen bits of polar codes for early termination and performance improvement in accordance with aspects of the present disclosure. Device 1705 may be an example of or include the components of wireless device 1405, wireless device 1505, or a base station 105 as described above, e.g., with reference to FIGS. 14 and 15. Device 1705 may include components for bi-directional voice and data communications including components for transmitting and receiving communications, including base station communications manager 1715, processor 1720, memory 1725, software 1730, transceiver 1735, antenna 1740, network communications manager 1745, and inter-station communications manager 1750. These components may be in electronic communication via one or more buses (e.g., bus 1710). Device 1705 may communicate wirelessly with one or more UEs 115.

Processor 1720 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1720 may be configured to operate a memory array using a memory controller. In other cases, a memory controller may be integrated into processor 1720. Processor 1720 may be configured to execute computer-readable instructions stored in a memory to perform various functions (e.g., functions or tasks supporting dynamic frozen bits of polar codes for early termination and performance improvement).

Memory 1725 may include RAM and ROM. The memory 1725 may store computer-readable, computer-executable software 1730 including instructions that, when executed, cause the processor to perform various functions described herein. In some cases, the memory 1725 may contain, among other things, a BIOS which may control basic hardware and/or software operation such as the interaction with peripheral components or devices.

Software 1730 may include code to implement aspects of the present disclosure, including code to support dynamic frozen bits of polar codes for early termination and performance improvement. Software 1730 may be stored in a non-transitory computer-readable medium such as system memory or other memory. In some cases, the software 1730 may not be directly executable by the processor but may cause a computer (e.g., when compiled and executed) to perform functions described herein.

Transceiver 1735 may communicate bi-directionally, via one or more antennas, wired, or wireless links as described above. For example, the transceiver 1735 may represent a wireless transceiver and may communicate bi-directionally with another wireless transceiver. The transceiver 1735 may also include a modem to modulate the packets and provide the modulated packets to the antennas for transmission, and to demodulate packets received from the antennas.

In some cases, the wireless device may include a single antenna 1740. However, in some cases the device may have more than one antenna 1740, which may be capable of concurrently transmitting or receiving multiple wireless transmissions.

Network communications manager 1745 may manage communications with the core network (e.g., via one or more wired backhaul links). For example, the network communications manager 1745 may manage the transfer of data communications for client devices, such as one or more UEs 115.

Inter-station communications manager 1750 may manage communications with other base station 105, and may include a controller or scheduler for controlling communications with UEs 115 in cooperation with other base stations 105. For example, the inter-station communications manager 1750 may coordinate scheduling for transmissions to UEs 115 for various interference mitigation techniques such as beamforming or joint transmission. In some examples, inter-station communications manager 1750 may provide an X2 interface within an Long Term Evolution (LTE)/LTE-A wireless communication network technology to provide communication between base stations 105.

Figure 18:
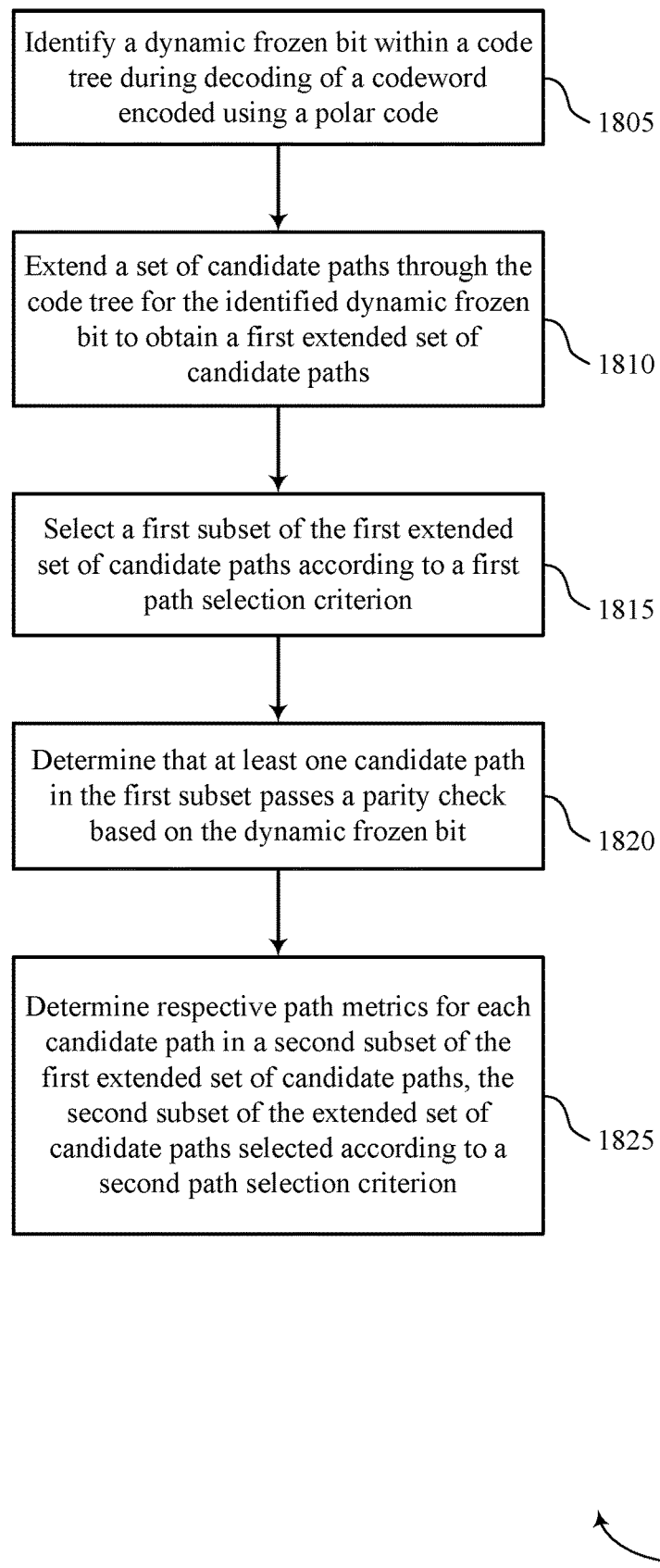
FIGS. 18 through 26 illustrate methods for dynamic frozen bits of polar codes for early termination and performance improvement in accordance with aspects of the present disclosure.

FIG. 18 shows a flowchart illustrating a method 1800 for dynamic frozen bits of polar codes for early termination and performance improvement in accordance with aspects of the present disclosure. The operations of method 1800 may be implemented by a UE 115 or base station 105 or its components as described herein. For example, the operations of method 1800 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1805 the UE 115 or base station 105 may identify a dynamic frozen bit within a code tree during decoding of a codeword encoded using a polar code. The operations of block 1805 may be performed according to the methods described herein. In certain examples, aspects of the operations of block 1805 may be performed by a bit locator component as described with reference to FIGS. 13 through 15.

At block 1810 the UE 115 or base station 105 may extend a set of candidate paths through the code tree for the identified dynamic frozen bit to obtain a first extended set of candidate paths. The operations of block 1810 may be performed according to the methods described herein. In certain examples, aspects of the operations of block 1810 may be performed by a path extender component as described with reference to FIGS. 13 through 15.

At block 1815 the UE 115 or base station 105 may select a first subset of the first extended set of candidate paths according to a first path selection criterion. The operations of block 1815 may be performed according to the methods described herein. In certain examples, aspects of the operations of block 1815 may be performed by a path selector component as described with reference to FIGS. 13 through 15.

At block 1820 the UE 115 or base station 105 may determine that at least one candidate path in the first subset passes a parity check based on the dynamic frozen bit. The operations of block 1820 may be performed according to the methods described herein. In certain examples, aspects of the operations of block 1820 may be performed by a parity checker component as described with reference to FIGS. 13 through 15.

At block 1825 the UE 115 or base station 105 may determine respective path metrics for each candidate path in a second subset of the first extended set of candidate paths, the second subset of the extended set of candidate paths selected according to a second path selection criterion. The operations of block 1825 may be performed according to the methods described herein. In certain examples, aspects of the operations of block 1825 may be performed by a path metric determiner component as described with reference to FIGS. 13 through 15.

Figure 19:
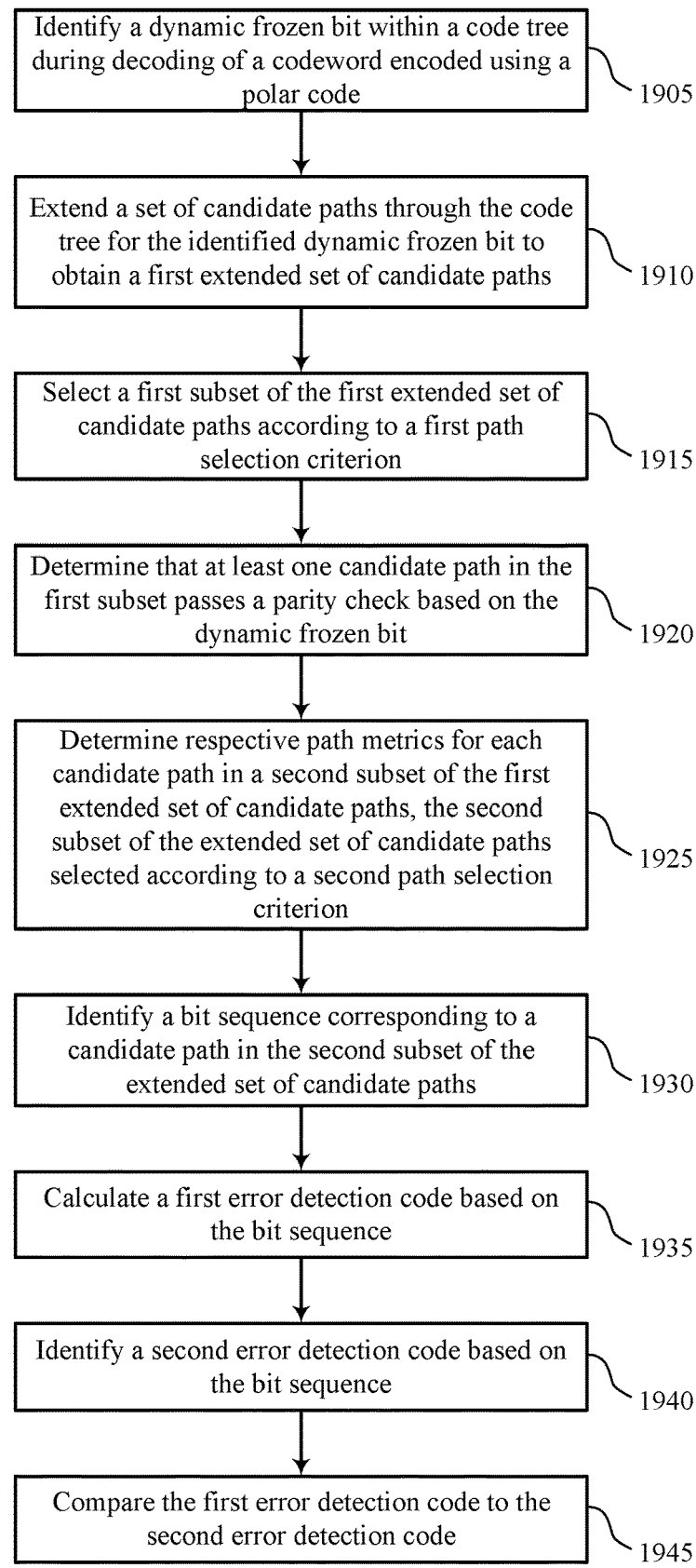

FIG. 19 shows a flowchart illustrating a method 1900 for dynamic frozen bits of polar codes for early termination and performance improvement in accordance with aspects of the present disclosure. The operations of method 1900 may be implemented by a UE 115 or base station 105 or its components as described herein. For example, the operations of method 1900 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1905 the UE 115 or base station 105 may identify a dynamic frozen bit within a code tree during decoding of a codeword encoded using a polar code. The operations of block 1905 may be performed according to the methods described herein. In certain examples, aspects of the operations of block 1905 may be performed by a bit locator component as described with reference to FIGS. 13 through 15.

At block 1910 the UE 115 or base station 105 may extend a set of candidate paths through the code tree for the identified dynamic frozen bit to obtain a first extended set of candidate paths. The operations of block 1910 may be performed according to the methods described herein. In certain examples, aspects of the operations of block 1910 may be performed by a path extender component as described with reference to FIGS. 13 through 15.

At block 1915 the UE 115 or base station 105 may select a first subset of the first extended set of candidate paths according to a first path selection criterion. The operations of block 1915 may be performed according to the methods described herein. In certain examples, aspects of the operations of block 1915 may be performed by a path selector component as described with reference to FIGS. 13 through 15.

At block 1920 the UE 115 or base station 105 may determine that at least one candidate path in the first subset passes a parity check based on the dynamic frozen bit. The operations of block 1920 may be performed according to the methods described herein. In certain examples, aspects of the operations of block 1920 may be performed by a parity checker component as described with reference to FIGS. 13 through 15.

At block 1925 the UE 115 or base station 105 may determine respective path metrics for each candidate path in a second subset of the first extended set of candidate paths, the second subset of the extended set of candidate paths selected according to a second path selection criterion. The operations of block 1925 may be performed according to the methods described herein. In certain examples, aspects of the operations of block 1925 may be performed by a path metric determiner component as described with reference to FIGS. 13 through 15.

At block 1930 the UE 115 or base station 105 may identify a bit sequence corresponding to a candidate path in the second subset of the extended set of candidate paths. The operations of block 1930 may be performed according to the methods described herein. In certain examples, aspects of the operations of block 1930 may be performed by a bit sequence component as described with reference to FIGS. 13 through 15.

At block 1935 the UE 115 or base station 105 may calculate a first error detection code based at least in part on the bit sequence. The operations of block 1935 may be performed according to the methods described herein. In certain examples, aspects of the operations of block 1935 may be performed by a EDC component as described with reference to FIGS. 13 through 15.

At block 1940 the UE 115 or base station 105 may identify a second error detection code based at least in part on the bit sequence. The operations of block 1940 may be performed according to the methods described herein. In certain examples, aspects of the operations of block 1940 may be performed by a EDC component as described with reference to FIGS. 13 through 15.

At block 1945 the UE 115 or base station 105 may compare the first error detection code to the second error detection code. The operations of block 1945 may be performed according to the methods described herein. In certain examples, aspects of the operations of block 1945 may be performed by a EDC component as described with reference to FIGS. 13 through 15.

Figure 20:
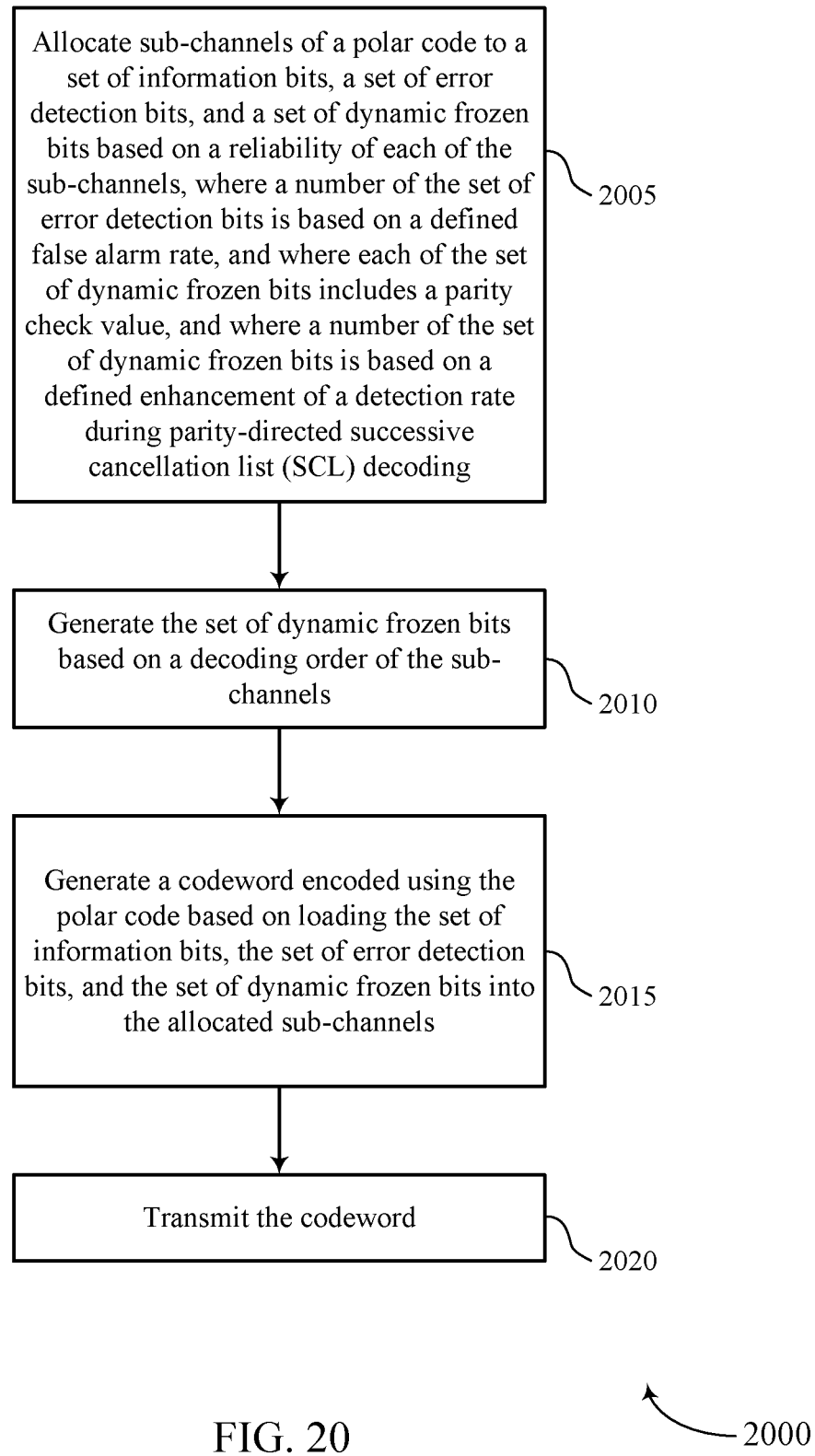

FIG. 20 shows a flowchart illustrating a method 2000 for dynamic frozen bits of polar codes for early termination and performance improvement in accordance with aspects of the present disclosure. The operations of method 2000 may be implemented by a UE 115 or base station 105 or its components as described herein. For example, the operations of method 2000 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2005 the UE 115 or base station 105 may allocate sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and wherein a number of the plurality of dynamic frozen bits is based at least in part on a target detection rate during parity-directed successive cancellation list (SCL) decoding. The operations of block 2005 may be performed according to the methods described herein. In certain examples, aspects of the operations of block 2005 may be performed by a allocator component as described with reference to FIGS. 13 through 15.

At block 2010 the UE 115 or base station 105 may generate the plurality of dynamic frozen bits based at least in part on a decoding order of the sub-channels. The operations of block 2010 may be performed according to the methods described herein. In certain examples, aspects of the operations of block 2010 may be performed by a bit value generator as described with reference to FIGS. 13 through 15.

At block 2015 the UE 115 or base station 105 may generate a codeword encoded using the polar code based at least in part on loading the plurality of information bits, the plurality of error detection bits, and the plurality of dynamic frozen bits into the allocated sub-channels. The operations of block 2015 may be performed according to the methods described herein. In certain examples, aspects of the operations of block 2015 may be performed by a codeword generator as described with reference to FIGS. 13 through 15.

At block 2020 the UE 115 or base station 105 may transmit the codeword. The operations of block 2020 may be performed according to the methods described herein. In certain examples, aspects of the operations of block 2020 may be performed by a codeword generator as described with reference to FIGS. 13 through 15.

Figure 21:
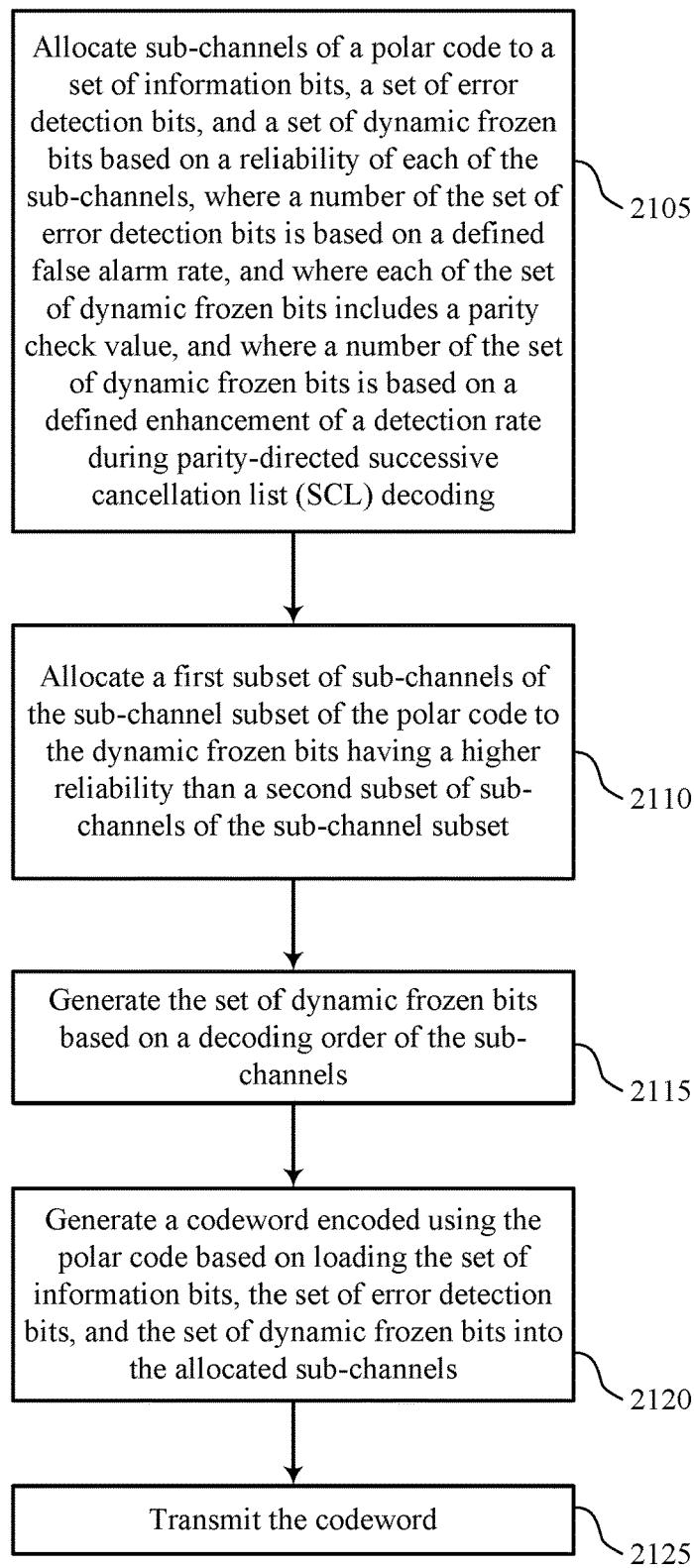

FIG. 21 shows a flowchart illustrating a method 2100 for dynamic frozen bits of polar codes for early termination and performance improvement in accordance with aspects of the present disclosure. The operations of method 2100 may be implemented by a UE 115 or base station 105 or its components as described herein. For example, the operations of method 2100 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2105 the UE 115 or base station 105 may allocate sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and wherein a number of the plurality of dynamic frozen bits is based at least in part on a target detection rate during parity-directed successive cancellation list (SCL) decoding. The operations of block 2105 may be performed according to the methods described herein. In certain examples, aspects of the operations of block 2105 may be performed by a allocator component as described with reference to FIGS. 13 through 15.

At block 2110 the UE 115 or base station 105 may allocate a first subset of sub-channels of the sub-channel subset of the polar code to the dynamic frozen bits having a higher reliability than a second subset of sub-channels of the sub-channel subset. In some cases, allocating the sub-channels of the polar code further comprises identifying a subset of the sub-channels for frozen bits. The operations of block 2110 may be performed according to the methods described herein. In certain examples, aspects of the operations of block 2110 may be performed by a allocator component as described with reference to FIGS. 13 through 15.

At block 2115 the UE 115 or base station 105 may generate the plurality of dynamic frozen bits based at least in part on a decoding order of the sub-channels. The operations of block 2115 may be performed according to the methods described herein. In certain examples, aspects of the operations of block 2115 may be performed by a bit value generator as described with reference to FIGS. 13 through 15.

At block 2120 the UE 115 or base station 105 may generate a codeword encoded using the polar code based at least in part on loading the plurality of information bits, the plurality of error detection bits, and the plurality of dynamic frozen bits into the allocated sub-channels. The operations of block 2120 may be performed according to the methods described herein. In certain examples, aspects of the operations of block 2120 may be performed by a codeword generator as described with reference to FIGS. 13 through 15.

At block 2125 the UE 115 or base station 105 may transmit the codeword. The operations of block 2125 may be performed according to the methods described herein. In certain examples, aspects of the operations of block 2125 may be performed by a codeword generator as described with reference to FIGS. 13 through 15.

Figure 22:
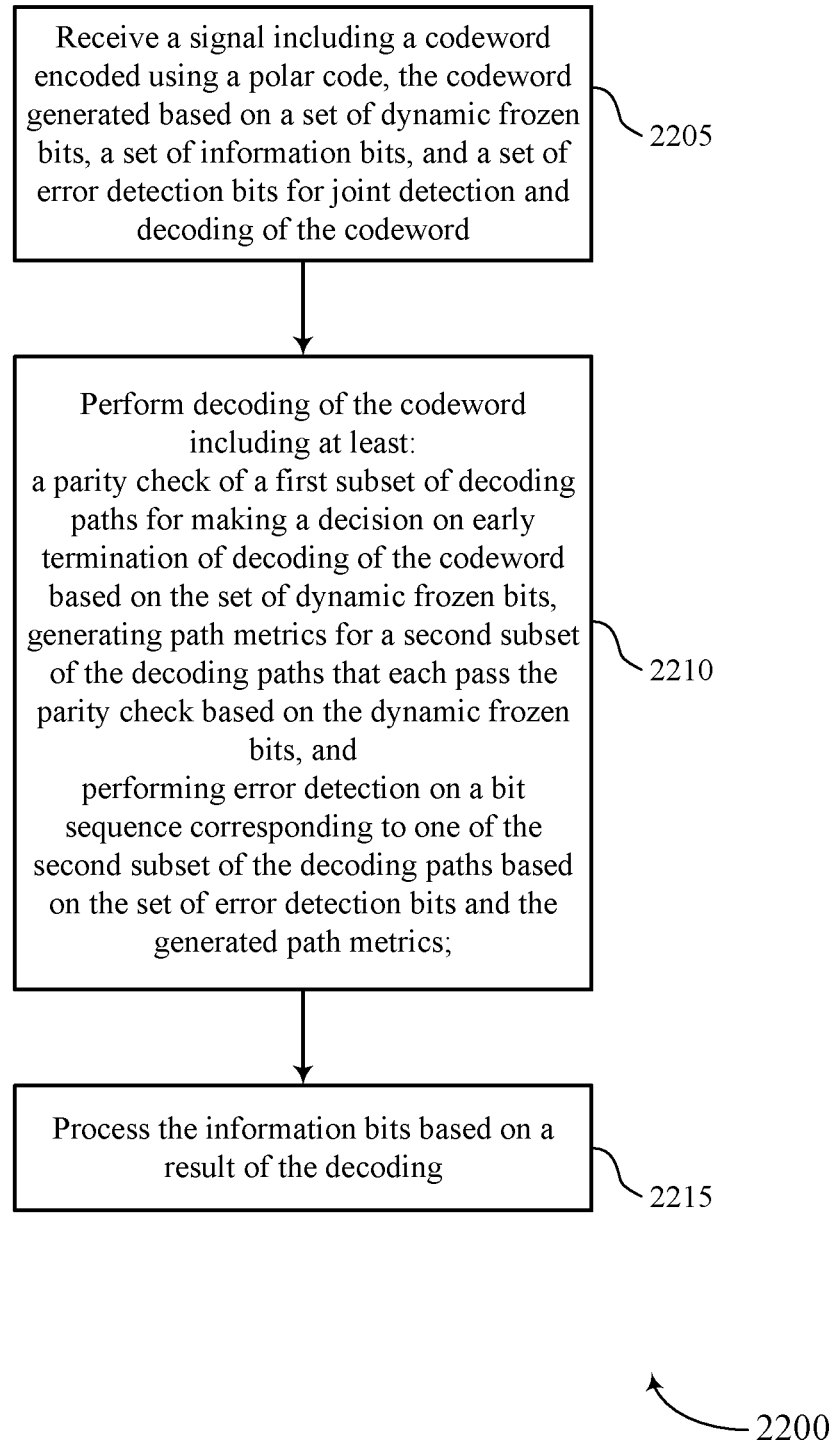

FIG. 22 shows a flowchart illustrating a method 2200 for dynamic frozen bits of polar codes for early termination and performance Improvement in accordance with aspects of the present disclosure. The operations of method 2200 may be implemented by a UE 115 or its components as described herein. For example, the operations of method 2200 may be performed by a UE communications manager as described with reference to FIG. 16. In some examples, a UE 115 may execute a set of codes to control the functional elements of the device to perform the functions described below. Additionally or alternatively, the UE 115 may perform aspects of the functions described below using special-purpose hardware.

At block 2205 the UE 115 or base station 105 may receive a signal comprising a codeword encoded using a polar code, the codeword generated based at least in part on a plurality of dynamic frozen bits, a plurality of information bits, and a plurality of error detection bits for joint detection and decoding of the codeword. The operations of block 2205 may be performed according to the methods described herein. In certain examples, aspects of the operations of block 2205 may be performed by a transceiver 1535 as described with reference to FIG. 16 or a transceiver 1635 as described with reference to FIG. 16.

At block 2210 the UE 115 or base station 105 may perform decoding of the codeword including at least: a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics. The operations of block 2210 may be performed according to the methods described herein. In certain examples, aspects of the operations of block 2210 may be performed by a decoder 245-a as described with reference to FIG. 7.

At block 2215 the UE 115 or base station 105 may process the information bits based at least in part on a result of the decoding. The operations of block 2215 may be performed according to the methods described herein. In certain examples, aspects of the operations of block 2215 may be performed by a data sink 250 as described with reference to FIG. 2.

Figure 23:
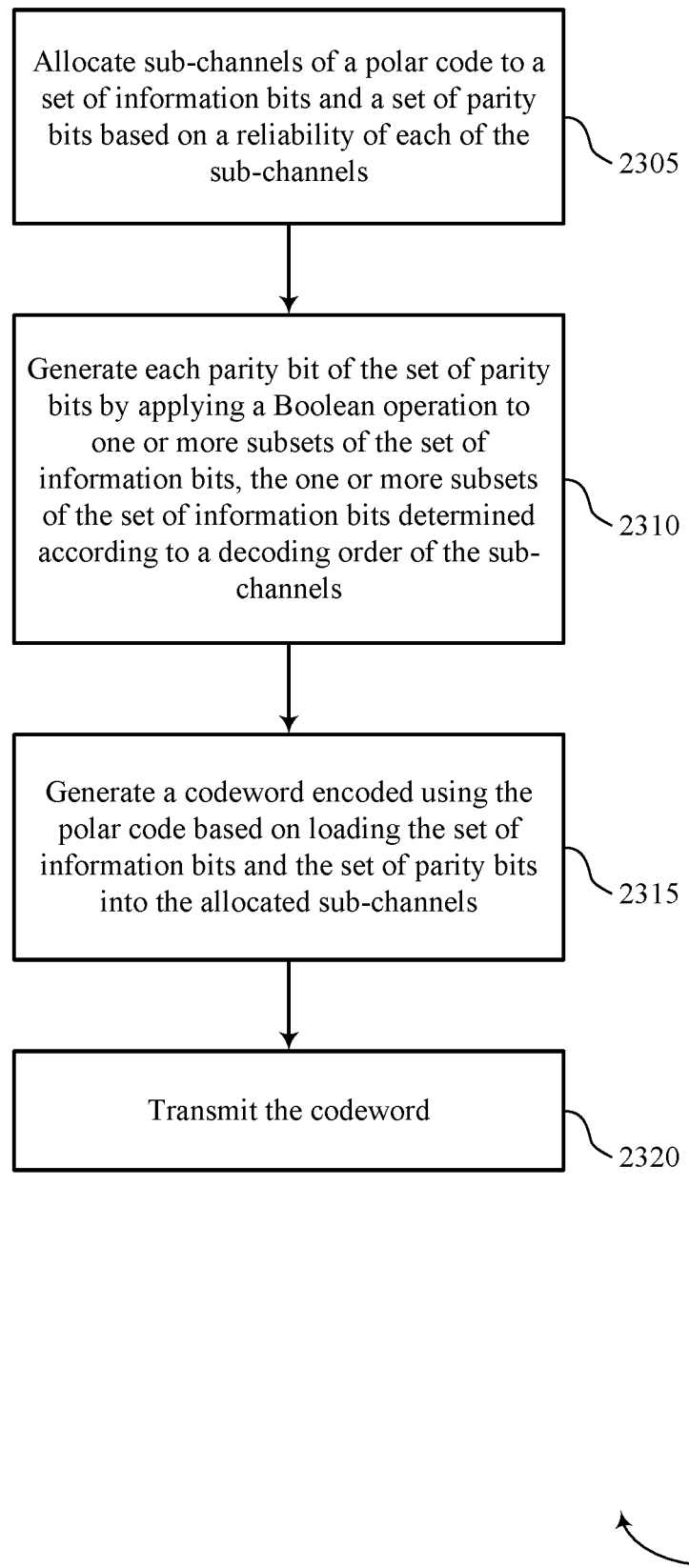

FIG. 23 shows a flowchart illustrating a method 2300 that supports parity bits of a polar code for early termination in accordance with various aspects of the present disclosure. The operations of method 2300 may be implemented by a UE 115 or base station 105 or its components as described herein. For example, the operations of method 2300 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2305 the UE 115 or base station 105 may allocate sub-channels of a polar code to a plurality of information bits and a plurality of parity bits based at least in part on a reliability of each of the sub-channels. The operations of block 2305 may be performed according to the methods described herein. In certain examples, aspects of the operations of block 2305 may be performed by an allocator component as described with reference to FIGS. 13 through 15.

At block 2310 the UE 115 or base station 105 may generate each parity bit of the plurality of parity bits by applying a Boolean operation to one or more subsets of the plurality of information bits, the one or more subsets of the plurality of information bits determined according to a decoding order of the sub-channels. The operations of block 2310 may be performed according to the methods described herein. In certain examples, aspects of the operations of block 2310 may be performed by a bit value generator as described with reference to FIGS. 13 through 15.

At block 2315 the UE 115 or base station 105 may generate a codeword encoded using the polar code based at least in part on loading the plurality of information bits and the plurality of parity bits into the allocated sub-channels. The operations of block 2315 may be performed according to the methods described herein. In certain examples, aspects of the operations of block 2315 may be performed by a codeword generator as described with reference to FIGS. 13 through 15.

At block 2320 the UE 115 or base station 105 may transmit the codeword. The operations of block 2320 may be performed according to the methods described herein. In certain examples, aspects of the operations of block 2320 may be performed by a transmitter as described with reference to FIGS. 13 through 15.

Figure 24:
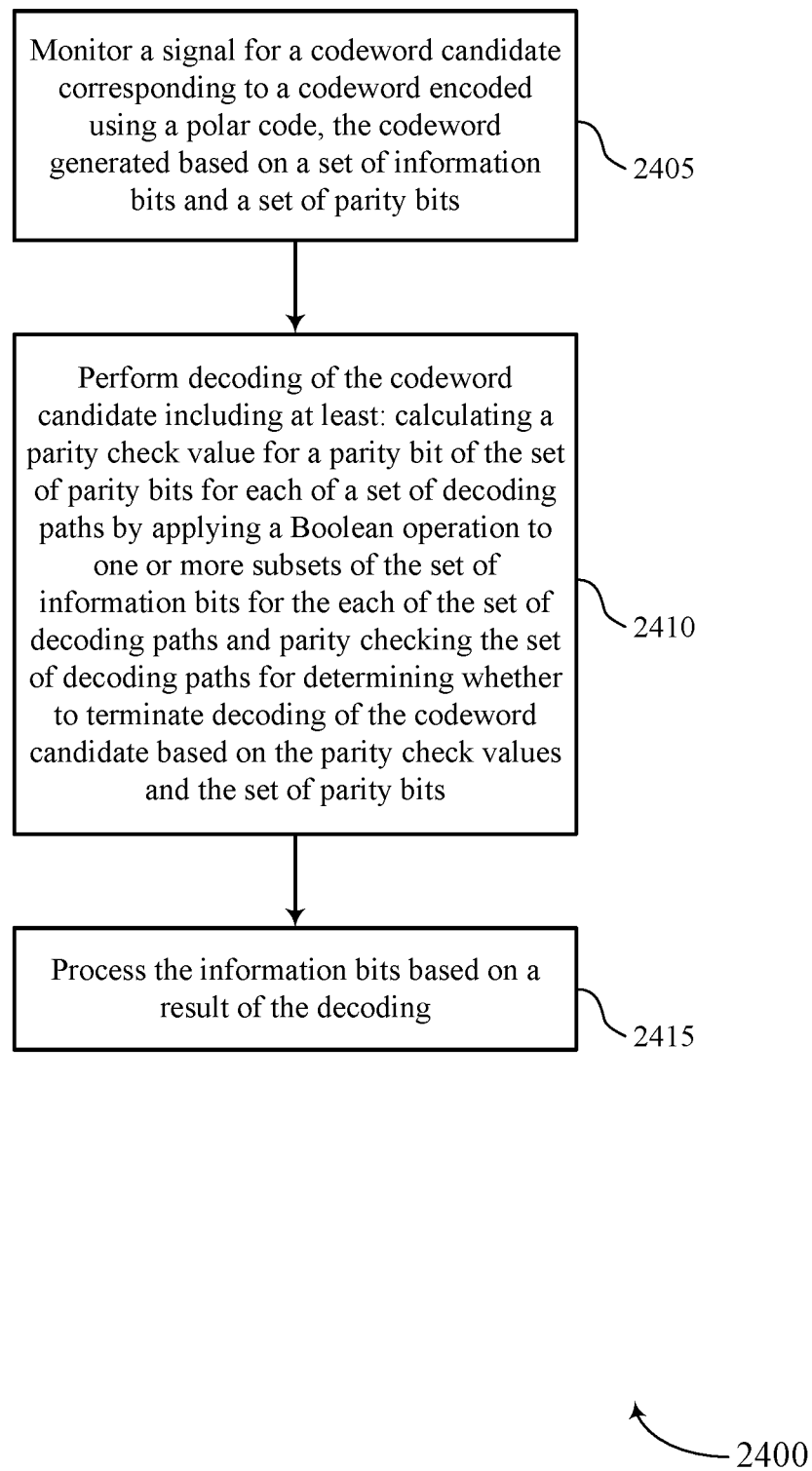

FIG. 24 shows a flowchart illustrating a method 2400 that support parity bits of a polar code for early termination in accordance with various aspects of the present disclosure. The operations of method 2400 may be implemented by a UE 115 or base station 105 or its components as described herein. For example, the operations of method 2400 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2405 the UE 115 or base station 105 may monitor a signal for a codeword candidate corresponding to a codeword encoded using a polar code, the codeword generated based at least in part on a plurality of information bits and a plurality of parity bits, wherein the plurality of information bits and the plurality of parity bits are allocated to sub-channels of the polar code based at least in part on a reliability of each of the sub-channels. The operations of block 2405 may be performed according to the methods described herein. In certain examples, aspects of the operations of block 2405 may be performed by a receiver as described with reference to FIGS. 13 through 15.

At block 2410 the UE 115 or base station 105 may perform decoding of the codeword candidate including at least: calculating a parity check value for a parity bit of the plurality of parity bits for each of a plurality of decoding paths by applying a Boolean operation to one or more subsets of the plurality of information bits for the each of the plurality of decoding paths, the one or more subsets of the plurality of information bits determined according to a decoding order of the sub-channels and parity checking the plurality of decoding paths for determining whether to terminate decoding of the codeword candidate based at least in part on the parity check values and the plurality of parity bits. The operations of block 2410 may be performed according to the methods described herein. In certain examples, aspects of the operations of block 2410 may be performed by a decoder as described with reference to FIGS. 13 through 15.

At block 2415 the UE 115 or base station 105 may process the information bits based at least in part on a result of the decoding. The operations of block 2415 may be performed according to the methods described herein. In certain examples, aspects of the operations of block 2415 may be performed by a communications manager as described with reference to FIGS. 13 through 15.

Figure 25:
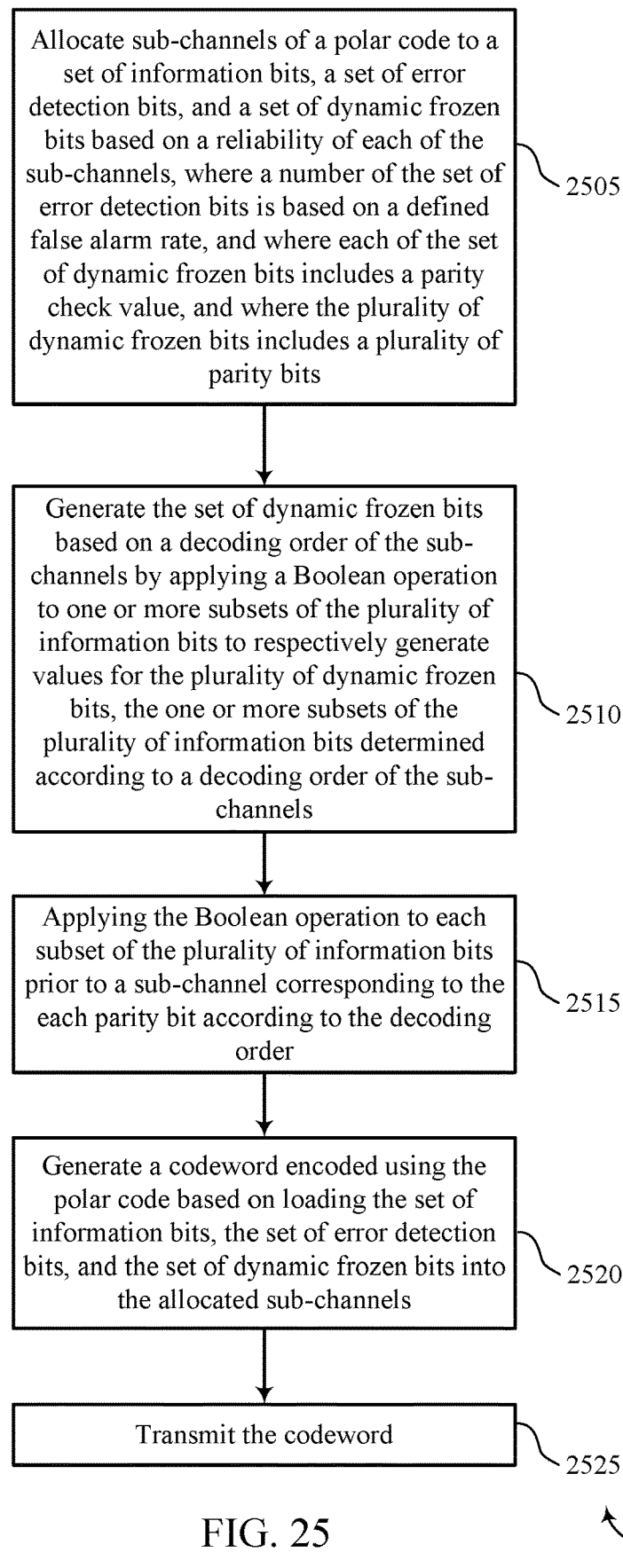

FIG. 25 shows a flowchart illustrating a method 2500 for dynamic frozen bits of polar codes for early termination and performance improvement in accordance with aspects of the present disclosure. The operations of method 2500 may be implemented by a UE 115 or base station 105 or its components as described herein. For example, the operations of method 2500 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2505 the UE 115 or base station 105 may allocate sub-channels of a polar code to a plurality of information bits, a plurality of error detection bits, and a plurality of dynamic frozen bits based at least in part on a reliability of each of the sub-channels, wherein a number of the plurality of error detection bits is based at least in part on a defined false alarm rate, and wherein each of the plurality of dynamic frozen bits includes a parity check value, and where the plurality of dynamic frozen bits includes a plurality of parity bits. The operations of block 2505 may be performed according to the methods described herein. In certain examples, aspects of the operations of block 2505 may be performed by a allocator component as described with reference to FIGS. 13 through 15.

At block 2510 the UE 115 or base station 105 may generate the set of dynamic frozen bits based on a decoding order of the sub-channels by applying a Boolean operation to one or more subsets of the plurality of information bits to respectively generate values for the plurality of dynamic frozen bits, the one or more subsets of the plurality of information bits determined according to a decoding order of the sub-channels based at least in part on a decoding order of the sub-channels. The operations of block 2515 may be performed according to the methods described herein. In certain examples, aspects of the operations of block 2515 may be performed by a bit value generator as described with reference to FIGS. 13 through 15.

At block 2515 the UE 115 or base station 105 may apply the Boolean operation to each subset of the plurality of information bits prior to a sub-channel corresponding to the each parity bit according to the decoding order. The operations of block 2515 may be performed according to the methods described herein. In certain examples, aspects of the operations of block 2515 may be performed by a bit value generator as described with reference to FIGS. 13 through 15.

At block 2520 the UE 115 or base station 105 may generate a codeword encoded using the polar code based at least in part on loading the plurality of information bits, the plurality of error detection bits, and the plurality of dynamic frozen bits into the allocated sub-channels. The operations of block 2520 may be performed according to the methods described herein. In certain examples, aspects of the operations of block 2520 may be performed by a codeword generator as described with reference to FIGS. 13 through 15.

At block 2525 the UE 115 or base station 105 may transmit the codeword. The operations of block 2525 may be performed according to the methods described herein. In certain examples, aspects of the operations of block 2525 may be performed by a codeword generator as described with reference to FIGS. 13 through 15.

Figure 26:
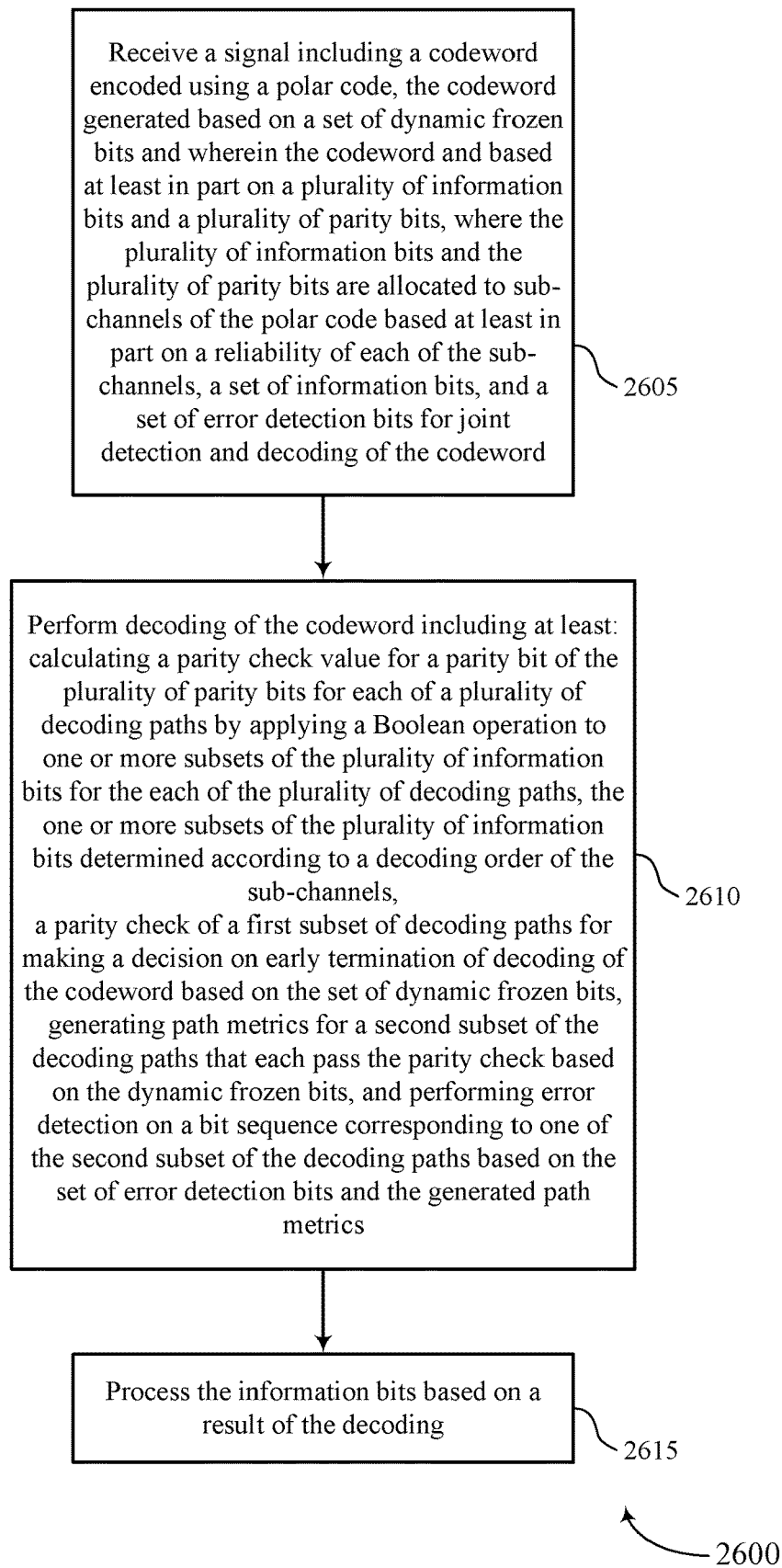

FIG. 26 shows a flowchart illustrating a method 2600 for dynamic frozen bits of polar codes for early termination and performance Improvement in accordance with aspects of the present disclosure. The operations of method 2600 may be implemented by a UE 115 or its components as described herein. For example, the operations of method 2600 may be performed by a UE communications manager as described with reference to FIG. 16. In some examples, a UE 115 may execute a set of codes to control the functional elements of the device to perform the functions described below. Additionally or alternatively, the UE 115 may perform aspects of the functions described below using special-purpose hardware.

At block 2605 the UE 115 or base station 105 may receive a signal including a codeword encoded using a polar code, the codeword generated based on a set of dynamic frozen bits and wherein the codeword and based at least in part on a plurality of information bits and a plurality of parity bits, where the plurality of information bits and the plurality of parity bits are allocated to sub-channels of the polar code based at least in part on a reliability of each of the sub-channels, a set of information bits, and a set of error detection bits for joint detection and decoding of the codeword. The operations of block 2605 may be performed according to the methods described herein. In certain examples, aspects of the operations of block 2605 may be performed by a transceiver 1535 as described with reference to FIG. 16 or a transceiver 1635 as described with reference to FIG. 16.

At block 2610 the UE 115 or base station 105 may perform decoding of the codeword including at least: calculating a parity check value for a parity bit of the plurality of parity bits for each of a plurality of decoding paths by applying a Boolean operation to one or more subsets of the plurality of information bits for the each of the plurality of decoding paths, the one or more subsets of the plurality of information bits determined according to a decoding order of the sub-channels, a parity check of a first subset of decoding paths for making a decision on early termination of decoding of the codeword based at least in part on the plurality of dynamic frozen bits, generating path metrics for a second subset of the decoding paths that each pass the parity check based at least in part on the dynamic frozen bits, and performing error detection on a bit sequence corresponding to one of the second subset of the decoding paths based at least in part on a representation of the plurality of error detection bits and the generated path metrics. The operations of block 2610 may be performed according to the methods described herein. In certain examples, aspects of the operations of block 2610 may be performed by a decoder 245-a as described with reference to FIG. 7.

At block 2615 the UE 115 or base station 105 may process the information bits based at least in part on a result of the decoding. The operations of block 2615 may be performed according to the methods described herein. In certain examples, aspects of the operations of block 2615 may be performed by a data sink 250 as described with reference to FIG. 2.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving a signal comprising a codeword encoded using a polar code, the codeword generated based at least in part on a plurality of dynamic frozen bits, a plurality of information bits, and a plurality of error detection bits for joint detection and decoding of the codeword;
   performing decoding of the codeword including at least:
      parity checking a first subset of decoding paths for making a decision on early termination of decoding of the codeword based at least in part on the plurality of dynamic frozen bits,
      generating path metrics for a second subset of the decoding paths that each pass the parity check based at least in part on the dynamic frozen bits, and
      performing error detection on a bit sequence corresponding to one of the second subset of the decoding paths based at least in part on a representation of the plurality of error detection bits and the generated path metrics; and
   processing the plurality of information bits based at least in part on a result of the decoding.

2. The method of claim 1, wherein the codeword is generated based at least in part on the plurality of information bits and a plurality of parity bits, wherein the plurality of information bits and the plurality of parity bits are allocated to sub-channels of the polar code based at least in part on a reliability of each of the sub-channels.

3. The method of claim 1, further comprising:
calculating a parity check value for a parity bit of a plurality of parity bits for each of a plurality of decoding paths by applying a Boolean operation to one or more subsets of the plurality of information bits for the each of the plurality of decoding paths, the one or more subsets of the plurality of information bits determined according to a decoding order of sub-channels of the polar code.

4. The method of claim 3, wherein parity checking the first subset of decoding paths for making the decision on early termination of decoding of the codeword is further based at least in part on the parity check value and the plurality of parity bits.

5. The method of claim 4, wherein calculating the parity check value for the parity bit for each of the plurality of decoding paths comprises:
calculating the parity check value based at least in part on applying the Boolean operation to each subset of the plurality of information bits of the each of the plurality of decoding paths prior to a sub-channel corresponding to the parity bit according to the decoding order; and
comparing the parity check value to a value of the respective parity bit.

6. The method of claim 4, wherein calculating the parity check value for the parity bit for each of the plurality of decoding paths comprises:
calculating the parity check value based at least in part on applying the Boolean operation to a subset of the plurality of information bits of the each of the plurality of decoding paths prior to a first sub-channel corresponding to the parity bit and subsequent to a second sub-channel corresponding to a previous parity bit according to the decoding order; and
comparing the parity check value to the parity bit.

7. The method of claim 4, wherein a number of the plurality of parity bits is based at least in part on enabling early termination during parity-directed successive cancellation list (SCL) decoding.

8. The method of claim 4, wherein a number of the plurality of parity bits is three (3).

9. The method of claim 1, further comprising:
extending the decoding paths to obtain extended decoding paths; and
selecting a subset of the extended decoding paths according to a path selection criterion.

10. The method of claim 9, further comprising:
determining that all decoding paths in the subset of the extended decoding paths fail the parity check; and
terminating decoding of the codeword.

11. The method of claim 9, further comprising:
determining that at least one decoding path in the subset of the extended decoding paths passes the parity check; and
generating path metrics for the subset of the extended decoding paths.

12. The method of claim 11, further comprising:
continuing decoding of the codeword.

13. The method of claim 9, wherein:
the path selection criterion is based at least in part on the path metrics of the extended decoding paths.

14. The method of claim 1, further comprising:
calculating a first error detection code based at least in part on the bit sequence;
identifying a second error detection code based at least in part on the bit sequence; and
comparing the first error detection code to the second error detection code.

15. The method of claim 14, further comprising:
determining that the bit sequence passes the error detection based at least in part on the comparison; and
outputting the bit sequence.

16. The method of claim 14, further comprising:
determining that the bit sequence has failed error detection based at least in part on the comparison; and
outputting an error based at least in part on the failure.

17. The method of claim 1, wherein performing decoding of the codeword including at least the parity check of the first subset of decoding paths comprises:
calculating a parity check value based at least in part on a plurality of bits of a first decoding path of the first subset of decoding paths occurring prior to a first dynamic frozen bit of the plurality of dynamic frozen bits along the first decoding path; and
comparing the parity check value to a value of the first dynamic frozen bit.

18. The method of claim 17, further comprising:
determining that the first decoding path passes the parity check based at least in part on the comparison.

19. The method of claim 1, wherein performing decoding of the codeword including at least generating path metrics for the second subset of the decoding paths comprises:
adding a path metric penalty to a first decoding path in the second subset of the decoding paths based at least in part on determining that a calculated value of a first dynamic frozen bit of the plurality of dynamic frozen bits differs from a determined decision value of the dynamic frozen bit.

20. An apparatus for wireless communication, comprising:
a processor;
memory in electronic communication with the processor; and
instructions stored in the memory and operable, when executed by the processor, to cause the apparatus to:
receive a signal comprising a codeword encoded using a polar code, the codeword generated based at least in part on a plurality of dynamic frozen bits, a plurality of information bits, and a plurality of error detection bits for joint detection and decoding of the codeword;
perform decoding of the codeword including at least:
parity checking a first subset of decoding paths for making a decision on early termination of decoding of the codeword based at least in part on the plurality of dynamic frozen bits,
generating path metrics for a second subset of the decoding paths that each pass the parity check based at least in part on the dynamic frozen bits, and
performing error detection on a bit sequence corresponding to one of the second subset of the decoding paths based at least in part on a representation of the plurality of error detection bits and the generated path metrics; and
process the plurality of information bits based at least in part on a result of the decoding.

21. The apparatus of claim 20, wherein the instructions are further executable by the processor to:
extend the decoding paths to obtain extended decoding paths; and
select a subset of the extended decoding paths according to a path selection criterion.

22. The apparatus of claim 21, wherein the instructions are further executable by the processor to:
determine that all decoding paths in the subset of the extended decoding paths fail the parity check; and
terminate decoding of the codeword.

23. The apparatus of claim 21, wherein the instructions are further executable by the processor to:
determine that at least one decoding path in the subset of the extended decoding paths passes the parity check; and
generate path metrics for the subset of the extended decoding paths.

24. The apparatus of claim 21, wherein:
the path selection criterion is based at least in part on the path metrics of the extended decoding paths.

25. The apparatus of claim 20, wherein the instructions are further executable by the processor to:
calculate a first error detection code based at least in part on the bit sequence;
identify a second error detection code based at least in part on the bit sequence; and
compare the first error detection code to the second error detection code.

26. The apparatus of claim 25, wherein the instructions are further executable by the processor to:
determine that the bit sequence passes the error detection based at least in part on the comparison; and
output the bit sequence.

27. The apparatus of claim 25, wherein the instructions are further executable by the processor to:
determine that the bit sequence has failed error detection based at least in part on the comparison; and
output an error based at least in part on the failure.

28. The apparatus of claim 20, wherein performing decoding of the codeword including at least the parity check of the first subset of decoding paths comprises instructions further executable by the processor to:
calculate a parity check value based at least in part on a plurality of bits of a first decoding path of the first subset of decoding paths occurring prior to a first dynamic frozen bit of the plurality of dynamic frozen bits along the first decoding path; and
compare the parity check value to a value of the first dynamic frozen bit.

29. The apparatus of claim 28, wherein the instructions are further executable by the processor to:
determine that the first decoding path passes the parity check based at least in part on the comparison.

30. The apparatus of claim 20, wherein performing decoding of the codeword including at least the parity check of the first subset of decoding paths comprises instructions further executable by the processor to:
add a path metric penalty to a first decoding path in the second subset of the decoding paths based at least in part on determining that a calculated value of a first dynamic frozen bit of the plurality of dynamic frozen bits differs from a determined decision value of the dynamic frozen bit.

31. An apparatus for wireless communication, comprising:
means for receiving a signal comprising a codeword encoded using a polar code, the codeword generated based at least in part on a plurality of dynamic frozen bits, a plurality of information bits, and a plurality of error detection bits for joint detection and decoding of the codeword;
means for performing decoding of the codeword including at least:
parity checking a first subset of decoding paths for making a decision on early termination of decoding of the codeword based at least in part on the plurality of dynamic frozen bits,
generating path metrics for a second subset of the decoding paths that each pass the parity check based at least in part on the dynamic frozen bits, and
performing error detection on a bit sequence corresponding to one of the second subset of the decoding paths based at least in part on a representation of the plurality of error detection bits and the generated path metrics; and
means for processing the plurality of information bits based at least in part on a result of the decoding.

32. A non-transitory computer readable medium storing code for wireless communication, the code comprising instructions executable by a processor to:
receive a signal comprising a codeword encoded using a polar code, the codeword generated based at least in part on a plurality of dynamic frozen bits, a plurality of information bits, and a plurality of error detection bits for joint detection and decoding of the codeword;
perform decoding of the codeword including at least:
parity checking a first subset of decoding paths for making a decision on early termination of decoding of the codeword based at least in part on the plurality of dynamic frozen bits,
generating path metrics for a second subset of the decoding paths that each pass the parity check based at least in part on the dynamic frozen bits, and
performing error detection on a bit sequence corresponding to one of the second subset of the decoding paths based at least in part on a representation of the plurality of error detection bits and the generated path metrics; and
process the plurality of information bits based at least in part on a result of the decoding.

* * * * *